(12) United States Patent
Sexton et al.

(10) Patent No.: US 8,278,938 B2
(45) Date of Patent: *Oct. 2, 2012

(54) ELECTRICAL SAFETY DEVICES AND SYSTEMS FOR USE WITH ELECTRICAL WIRING, AND METHODS FOR USING SAME

(75) Inventors: Robert Jay Sexton, Carrollton, GA (US); Fred Lane Martin, Carrollton, GA (US); James Herman Pace, Nashville, TN (US)

(73) Assignee: Newire, Inc., Knoxville, TN (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/033,221

(22) Filed: Feb. 23, 2011

(65) Prior Publication Data

US 2011/0141648 A1   Jun. 16, 2011

Related U.S. Application Data

(63) Continuation of application No. 11/782,450, filed on Jul. 24, 2007, now Pat. No. 7,915,899.

(60) Provisional application No. 60/820,197, filed on Jul. 24, 2006.

(51) Int. Cl.
*G01R 31/02* (2006.01)
*H04B 3/46* (2006.01)

(52) U.S. Cl. ........................... 324/539; 324/543

(58) Field of Classification Search .................. 324/539, 324/543
See application file for complete search history.

(56) References Cited

U.S. PATENT DOCUMENTS

| 4,196,378 | A | | 4/1980 | Shirai |
| 4,519,133 | A | | 5/1985 | Pansanel |
| 4,927,384 | A | | 5/1990 | Bates |
| 5,185,580 | A | * | 2/1993 | Nichols et al. ................. 324/539 |
| 5,570,029 | A | | 10/1996 | Bottman et al. |
| 5,600,524 | A | | 2/1997 | Neiger et al. |
| 6,026,145 | A | | 2/2000 | Bauer et al. |
| 6,232,556 | B1 | | 5/2001 | Daugherty et al. |
| 6,697,238 | B2 | | 2/2004 | Bonilla et al. |
| 6,833,713 | B2 | | 12/2004 | Schoepf et al. |
| 6,856,137 | B2 | | 2/2005 | Roden et al. |
| 6,922,060 | B1 | * | 7/2005 | Wendel et al. ................. 324/545 |
| 7,030,621 | B2 | * | 4/2006 | Sarkozi et al. ................. 324/536 |
| 7,253,636 | B2 | | 8/2007 | Shambaugh, Jr. et al. |
| 7,906,973 | B1 | * | 3/2011 | Orr ............................... 324/533 |
| 2004/0207407 | A1 | | 10/2004 | Shander |

OTHER PUBLICATIONS

Written Opinion of the International Search Report of PCT/US2007/074247.

* cited by examiner

*Primary Examiner* — Jeff Natalini
(74) *Attorney, Agent, or Firm* — Sutherland Asbill & Brennan LLP

(57) ABSTRACT

Disclosed are systems and methods for monitoring an electrical flat wire. An appropriate safety device is utilized to monitor the electrical flat wire. The safety device includes a line side input configured to connect a line side power source and receive an electrical power signal from the line side power source. Additionally, the safety device includes a flat wire connection configured to connect to an electrical flat wire. The safety device further includes at least one relay configured to control the communication of the electrical power signal onto the electrical flat wire. The safety device also includes a control unit configured to test the electrical flat wire for at least one of miswires, wire faults, or abnormal conditions and, based at least in part on the results of the testing, to control the actuation of the at least one relay.

24 Claims, 25 Drawing Sheets

ELECTRICAL SAFETY DEVICES AND SYSTEMS FOR USE WITH ELECTRICAL WIRING, AND METHODS FOR USING SAME

CROSS REFERENCE TO RELATED APPLICATIONS

This application is a continuation of U.S. patent application Ser. No. 11/782,450, entitled ELECTRICAL SAFETY DEVICES AND SYSTEMS FOR USE WITH ELECTRICAL WIRING, AND METHODS FOR USING SAME, which was filed on Jul. 24, 2007, and which claims priority from U.S. Provisional Application No. 60/820,197, entitled ACTIVE SAFETY DEVICES, which was filed on Jul. 24, 2006. Both of these applications are incorporated herein by reference in their entirety.

TECHNICAL FIELD

Embodiments of the invention generally relate to safety devices and systems used in conjunction with electrical wiring and, more particularly, to safety devices and systems used in conjunction with electrical flat wiring.

BACKGROUND

Most homes and commercial buildings utilize electrical wiring systems to distribute power throughout the structure. Typically, electrical wiring systems carry a 120 or 240 volt signal at 15 or 30 amps, respectively, to provide electrical power for lighting systems, climate control systems, appliances, and other loads. Many accidents occur annually due to penetrations of electrical wires or due to deterioration of older wiring systems.

According to reports issued by the Consumer Products Safety Commission (CPSC) in 1997, home wire systems caused over 40,000 fires that resulted in 250 deaths and over $670 million of property damage. Further study by the CPSC based on 40,300 electrical circuit fires showed that 36% were due to installed wiring and 16% were due to cord/plugs.

Today, circuit breakers primarily protect against certain overload and short circuit conditions which occur primarily in fixed wiring. The overload protection is provided by the slow heating of a bimetal strip that breaks the circuit causing the breaker to trip after a specified period of time. The more current that runs through the bimetal, the shorter the time it takes to trip the breaker. Short circuit protection may be provided magnetically, that is, a high level of current may trip a breaker instantaneously. The lower limit of the magnetic trip setting may be determined by the manufacturer such that the device does not nuisance trip on high inrush loads.

Circuit breakers do not protect against all hazards that may occur within electrical wiring systems. Therefore, in addition to circuit breakers, there are many other safety devices that have been designed for use with electrical wiring. These safety devices may provide secondary protection, which is additional to any protection provided by the circuit breaker, or they may provide primary protection independent of that provided by the circuit breaker. These safety devices primarily are designed to be used in conjunction with conventional electrical wire. Conventional electrical wire, as we know it today, typically contains two insulated, round inner conductors (e.g., hot/neutral or electrifiable/return conductors) and a non-insulated ground conductor (e.g., grounding conductor), all within a thermoplastic outer insulator. The neutral or return conductor may also be referred to as a grounded conductor.

One such safety device that is commonly installed in electrical wiring systems is a Ground Fault Circuit Interrupter (GFCI). A GFCI measures the difference between the currents flowing through the hot conductor and the neutral conductor of a conventional electrical wire. If the difference between the current flowing through the hot conductor and the current flowing through the neutral conductor exceeds a few milliamps, the presumption is that current is leaking to ground via some other path. This may be because of a short circuit to, for example, the chassis of an appliance, or to the ground lead, or through a person. Any of these situations may be hazardous, so the GFCI trips, breaking the circuit.

Another safety device that is commonly installed in electrical wiring systems is an Arc Fault Circuit Interrupter (AFCI). An AFCI adds electronic protection to the standard thermal and magnetic protection provided by circuit breakers. The circuitry in an AFCI detects specific arcs that are determined to be likely to cause a fire. The AFCI uses electronics to recognize the current and voltage characteristics of the arcing faults on the electrical wire, and interrupts the circuit when a fault is detected. Each AFCI has circuit logic, and perhaps control logic, that is designed to detect specific types of arc faults. These arc faults are specific to the type of wiring the AFCI is designed to be implemented with. Current AFCI's are designed to be used in conjunction with conventional wire systems to detect arc faults that commonly occur within those conventional wire systems.

A problem with many electrical wire safety devices is that they are designed to be used in conjunction with conventional three-conductor electric wire. Current safety devices are not designed to be used in wiring systems that include flat electrical wire. A flat electrical wire and method of fabricating the electrical wire are described in U.S. patent application Ser. No. 10/790,055 (Now U.S. Pat. No. 7,145,073), which is incorporated by reference herein in its entirety. Flat electrical wire is designed to be a surface-mounted ring system that can be installed on surfaces such as a wall, ceiling or floor. Accordingly, flat electrical wire is designed to be thin and flexible in order to allow it to be easily concealed, for example, by being painted or papered over. Currently existing safety devices are not specifically designed to be used in conjunction with and in many cases are incompatible with flat electrical wire. Accordingly, a need exists for one or more safety devices that are suitable for use with flat electrical wire.

BRIEF DESCRIPTION OF THE INVENTION

Some or all of the above needs and/or problems may be addressed by certain embodiments of the invention. Disclosed are devices, systems, and methods for monitoring a wire, such as an electrical flat wire, for one or more of miswires, wire faults, or abnormal conditions. According to one embodiment of the invention, there is disclosed a source device for use with electrical flat wire. The source device may include a line side input, a flat wire connection, at least one relay, and a control unit. The line side input may be configured to connect to a line side power source and to receive an electrical power signal from the line side power source. The flat wire connection may be configured to connect to an electrical flat wire that includes a plurality of conductors. The at least one relay may be configured to control the communication of the electrical power signal onto the electrical flat wire. The control unit may be configured to (i) direct the communication of at least one test signal onto at least one conductor of the electrical flat wire, (ii) monitor one or more of the other conductors of the electrical flat wire for one or more return signals, (iii) determine, based at least in part on the monitoring, whether a miswire or wire fault is associated with the electrical flat wire, and (iv) control, based at least in part on the determination, the actuation of the at least one relay.

According to another embodiment of the invention, there is disclosed an electrical flat wire system that includes a source device, a destination device, and an electrical flat wire. The source device may be configured to be coupled to a line side power source, and the source device may include an active safety device and a first flat wire termination. The destination device may include a second flat wire termination. The electrical flat wire may have a first end coupled to the first flat wire termination and a second end coupled to the second flat wire termination. The active safety device may be configured to (i) communicate at least one test signal onto at least one conductor of the electrical flat wire, (ii) monitor one or more of the other conductors of the electrical flat wire for one or more return signals, (iii) determine, based at least in part on the monitoring, whether a miswire or wire fault is associated with the electrical flat wire, and (iv) control, based at least in part on the determination, the communication of an electrical power signal from the line side power source to the electrical flat wire.

According to another embodiment of the invention, there is disclosed a method for monitoring an electrical flat wire. An electrical flat wire may be connected to a source device. The source device may be configured to control the provision of an electrical power signal onto the electrical flat wire. A test signal may be communicated by the source device onto a first conductor of the electrical flat wire. One or more other conductors of the electrical flat wire may be monitored by the source device for at least one return signal. Based at least in part on the monitoring, the source device may determine whether a miswire or wire fault is associated with the electrical flat wire. Based at least in part on the determination, the source device may control provision of the electrical power signal onto the electrical flat wire.

Additional systems, methods, apparatus, features, and aspects are realized through the techniques of various embodiments of the invention. Other embodiments and aspects of the invention are described in detail herein and are considered a part of the claimed invention. Other embodiments, features, and aspects can be understood with reference to the description and the drawings.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION

Figure 1:
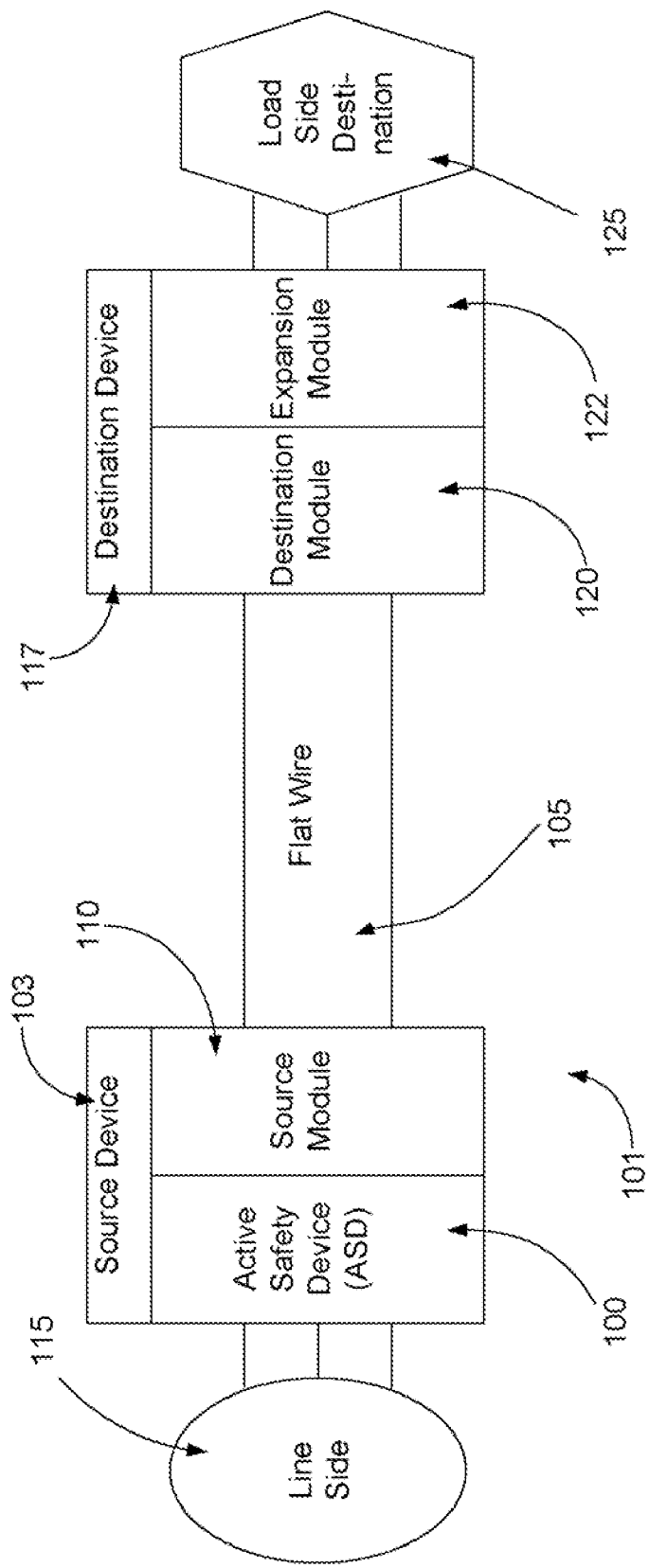
FIG. 1 is a schematic diagram of a flat wire system including an Active Safety Device (ASD), according to an illustrative embodiment of the invention.

Embodiments of the invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

The invention is described below with reference to block diagrams of systems, methods, apparatuses and computer program products according to an embodiment of the invention. It will be understood that each block of the block diagrams, and combinations of blocks in the block diagrams, respectively, can be implemented by computer program instructions. These computer program instructions may be loaded onto a general purpose computer, special purpose computer, or other programmable data processing apparatus to produce a machine, such that the instructions which execute on the computer or other programmable data processing apparatus create means for implementing the functionality of each block of the block diagrams, or combinations of blocks in the block diagrams discussed in detail in the descriptions below.

These computer program instructions may also be stored in a computer-readable memory that can direct a computer or other programmable data processing apparatus to function in a particular manner, such that the instructions stored in the computer-readable memory produce an article of manufacture including instruction means that implement the function specified in the block or blocks. The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the block or blocks.

Accordingly, blocks of the block diagrams support combinations of means for performing the specified functions, combinations of steps for performing the specified functions and program instruction means for performing the specified functions. It will also be understood that each block of the block diagrams, and combinations of blocks in the block diagrams, can be implemented by special purpose hardware-based computer systems that perform the specified functions or steps, or combinations of special purpose hardware and computer instructions.

The inventions may be implemented through an application program running on an operating system of a computer. The inventions also may be practiced with other computer system configurations, including hand-held devices, multiprocessor systems, microprocessor based or programmable consumer electronics, mini-computers, mainframe computers, etc.

Application programs that are components of the invention may include routines, programs, components, data structures, etc. that implement certain abstract data types, perform certain tasks, actions, or tasks. In a distributed computing environment, the application program (in whole or in part) may be located in local memory, or in other storage. In addition, or in the alternative, the application program (in whole or in part) may be located in remote memory or in storage to allow for the practice of the inventions where tasks are performed by remote processing devices linked through a communications network. Example embodiments of the invention will hereinafter be described with reference to the figures, in which like numerals indicate like elements throughout the several drawings.

Disclosed are systems and methods for monitoring an electrical wire or electrical wiring system for miswires and wire faults. An Active Safety Device (ASD) may be utilized to perform tests on an electrical wire prior to the electrification of the electrical wire, during the electrification of the electrical wire, and following the electrification of the electrical wire. If a miswire or wire fault is identified or detected by the ASD prior to the electrification of the electrical wire, then the electrical wire may be prevented from being electrified. If a miswire or wire fault is identified or detected by the ASD during or following the electrification of the electrical wire, then the electrical wire may be de-energized. It will be appreciated that an ASD may be utilized in many different types of applications, for example, in conjunction with commercial and/or residential wiring. As an example, an ASD may be utilized to monitor electrical wiring that is installed in a home or at a commercial or industrial site. The monitored electrical wiring may be wiring that is installed at the location at the time of construction or during a rewiring project.

Referring now to FIG. 1, an Active Safety Device (ASD) 100 implemented in a flat electrical wire system 101 is shown, according to an illustrative embodiment of the invention. The flat electrical wire system 101 may include a source device 103, a flat wire 105, a line side power source 115, a destination device 117, and a load side destination 125. The source device 103 may include an ASD 100 and a source module 110. The destination device 117 may include a destination module 120 and an expansion module 122. For purposes of the present disclosure, an ASD 100 is an electrical safety device, circuit, or module in accordance with the invention containing reactive and/or proactive safety components, circuits, and/or circuitry, as explained in greater detail below. It will be understood that in some embodiments, such as some commercial embodiments, the source device 103 and its associated components, circuitry, and modules may be designated as an ASD. While the illustrative embodiments described herein are in connection with flat electrical wire, an ASD 100 in accordance with embodiments of the invention is equally applicable to conventional electrical wiring, such as electric wire comprising elongated cylindrical conductors based on the teaching disclosed herein.

A variety of flat wires may be used in conjunction with an ASD 100 in accordance with embodiments of the invention. The flat wire 105 may be a flat electrical wire or other flat wire such as a speaker wire, telephone wire, low voltage wire, CATV wire, or under surface wire. The flat wire 105 typically will be made up of multiple flat conductors that may be configured in a stacked, multi-planar, or protective layered arrangement or in a parallel or coplanar arrangement having conductors within the same plane. Additionally, the conductors of the flat wire 105 may contain multiple conductive adjacent or non-insulated sub-layers or flat strands. The flat wire 105 may also contain one or more optical fibers. One example of a flat wire that may be used in accordance with the ASD 100 is described in U.S. patent application Ser. No. 10/790,055 (Publication No. US 2005/0042942), entitled "Electrical Wire and Method of Fabricating the Electrical Wire," which is hereby incorporated by reference in its entirety. Other examples of flat wires that may be used in accordance with the ASD 100 include, but are not limited to, the flat wires disclosed in U.S. Pat. No. 5,804,768, entitled "Flat Surface-Mounted Multi-Purpose Wire," U.S. Pat. No. 6,107,577, entitled "Flat Surface-Mounted Multi-Purpose Wire," U.S. Pat. No. 6,492,595, entitled "Flat Surface-Mounted Multi-Purpose Wire," and U.S. Pat. No. 6,774,741, entitled "Non-uniform Transmission Line and Method of Fabricating the Same." the disclosures of which are incorporated by reference herein in their entirety.

Figure 2:
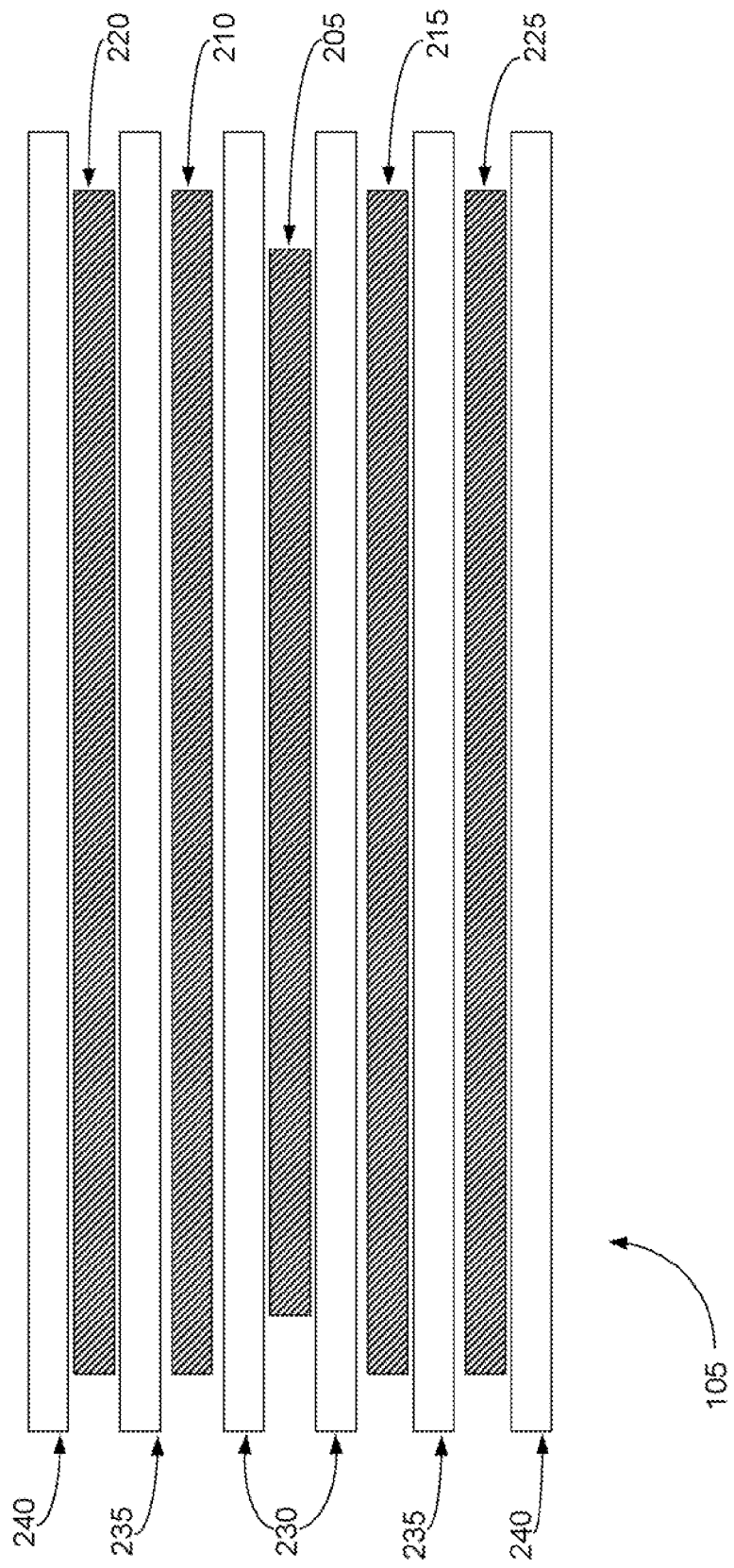
FIG. 2 is a cross-section view of a multi-planar, stacked, or protective layered flat wire that may be used in conjunction with an ASD, according to an illustrative embodiment of the invention.

FIG. 2 is a cross-section view of a multi-planar flat wire 105 that may be used in conjunction with an ASD 100, according to an illustrative embodiment of the invention. The flat wire 105 of FIG. 2 may be an electrical flat wire with stacked conductors. At least one electrifiable conductor 205 (or hot conductor) may be situated between two return conductors 210, 215, (or neutral conductors) and the two return conductors 210, 215 may be formed such that the electrifiable conductor 205 is substantially entrapped by the first and second return conductors 210, 215. The term substantially entrapped may be utilized to refer to a situation in which the electrifiable conductor 205 cannot be contacted by a foreign object (e.g., a nail, screw, staple, etc.) without the foreign object first contacting one of the return conductors 210, 215. The term substantially entrapped does not necessarily mean that the return conductors 210, 215 completely surround the electrifiable conductor 205 (although such a design is possible). Instead, the term may mean that any distance between the return conductors 210, 215 may be small enough that a foreign object cannot reasonably go between the return conductors 210, 215 and the electrifiable conductor 205 without contacting one or more of the return conductors 210, 215.

With continued reference to FIG. 2, two grounding conductors 220, 225 may be included in the flat wire 105. The various conductors of the flat wire 105 may be assembled in a stacked configuration such that the electrifiable conductor 205 is situated between the two return conductors 210, 215 and that three conductor arrangement is then sandwiched between the two grounding conductors 220, 225. This configuration may be referred to as a G-N-H-N-G configuration.

Additionally, insulation material may be disposed between each of the conductors of the flat wire 105. The insulation material may prevent the various conductors of the flat wire 105 from contacting one another and creating a short circuit in the flat wire 105. Electrifiable conductor insulation material 230 may surround the electrifiable conductor 205 and prevent the electrifiable conductor 205 from making electrical contact with the other conductors of the flat wire 105. Additionally, return conductor insulation material 235 may be disposed between the return conductors 210, 215 and the corresponding grounding conductors 220, 225 to prevent the first return conductor 210 from contacting the corresponding first grounding conductor 220 and to prevent the second return conductor 215 from contacting the corresponding second grounding conductor 225. Grounding conductor insulation 240 may be disposed opposite the first grounding conductor 220 and the second grounding conductor 225, and the grounding conductor insulation 240 may prevent the grounding conductors 220, 225 from contacting an object or surface that is external to the flat wire 105.

Alternatively, each conductor of the flat wire 105 may be individually wrapped with an insulation material. In this alternative configuration, electrifiable conductor insulation material 230 would be disposed on both sides of the electrifiable conductor 205 to separate the electrifiable conductor 205 from the return conductors 210, 215. Return conductor insulation material 235 would be disposed on both sides of each of the return conductors 210, 215 to separate the return conductors 210, 215 from the electrifiable conductor 205 and the grounding conductors 220, 225. Grounding conductor insulation material 240 would be disposed on both sides of each of the grounding conductors 220, 225 to separate the grounding conductors 220, 225 from the return conductors 210, 215 and any objects or surfaces that are external to the flat wire 105. In the alternative configuration, two layers of insulation material are disposed between any two conductors of the flat wire 105, thereby decreasing the possibility of short circuits between the conductors of the flat wire 105. In other words, a short circuit between two conductors of the flat wire 105 exists when there is a flaw in the insulation material between the two conductors. For example, if only a single layer of insulation material is disposed between each of the conductors of the flat wire 105, a short circuit might occur if there is a flaw in the insulation material disposed between the electrifiable conductor 205 and one of the return conductors 210. If, however, each of the conductors of the flat wire 105 is individually wrapped with insulation material, the possibility of a short circuit between two conductors is decreased because flaws would likely need to be present in both layers of insulation material disposed between the two conductors, and the flaws would need to line up with one another or be situated in close proximity to one another. For example, for a short circuit to occur between the electrifiable conductor 205 and one of the return conductors 210, flaws must be present in both the electrifiable conductor insulation material 230 and in the return conductor insulation material 235 disposed between the two conductors. Additionally, these flaws would need to line up with one another or be situated in close proximity to one another.

Although a five-conductor stacked flat wire is depicted in FIG. 2, it will be appreciated that the ASD 100 may be utilized to monitor flat wires with many different conductor configurations. For example, flat wires with a wide variety of stacked conductor configurations may be monitored by the ASD 100. As an example, a three conductor flat wire having a stacked configuration may be monitored by the ASD 100. The three conductor flat wire may include an electrifiable conductor that is substantially entrapped by first and second return conductors, and the three conductor configuration may be referred to as a N-H-N configuration. Additionally, various flat wire embodiments containing parallel or coplanar arrangements of conductors may be monitored by the ASD 100. For example, a three conductor flat wire having a coplanar arrangement may be monitored by the ASD 100. The three conductor coplanar flat wire may include an electrifiable conductor, a return conductor, and a grounding conductor disposed in a parallel configuration within the same plane.

With reference back to FIG. 1, in a flat wire system 101, a flat wire 105 may be connected to the ASD 100 through a source module 110. The source module 110 may be physically separate from the ASD 100, or alternatively, the source module 110 may be integrated into the ASD 100. The source module 110 may serve as a mechanical or electromechanical connection between the flat wire 105 and the ASD 100. The various conductors of the flat wire 105, may be terminated at the source module 110. Termination points within the source module 110 may include terminal blocks, crimp-on terminals, plug and socket connectors, insulation displacement connectors (IDC), conductor penetration connectors (CPC), or any other suitable electrical connector as will be understood by those of ordinary skill in the art. It will be appreciated that one or more appropriate detection devices may be utilized to verify that the source module 110 is connected to the ASD 100 and/or that the termination points are connected to the source module 110. For example, a ground pin or plug may be extended through the source module 110 and/or the termination points in order to detect the presence of the source module 110 and/or the termination points. As another example, an optical detection device may be utilized. Furthermore, it will be understood that a combination of detection devices may be utilized.

The ASD 100 may also be connected to a line side power source 115. The line side power source 115 may be any standard electric power source including a power wire coming from a circuit box, a conventional in-wall electrical wire, a flat electrical wire, or any other electrical wire capable of delivering electric power. For flat wire 105 branch circuit applications, the line side power source 115 may be a typical wall-mounted or in-wall power outlet or power receptacle. Typically, the line side power source 115 will carry an electrical voltage of approximately 110-130 VAC or approximately 220-250 VAC.

The line side power source 115 may be physically separate from the source device 103 or, alternatively, the line side power source 115 may be integrated into the source device 103. For example, if a conventional in-wall electrical wire were directly connected to the source device 103, the line side power source 115 would be physically separate from the source device 103. Alternatively, the line side power source 115 may be integrated into the source device 103 in a situation in which the source device 103 includes, for example, a conventional three-prong plug that may be inserted into a standard electrical outlet.

Still referring to FIG. 1, the flat wire 105 may create a connection between the source module 110 and one or more destination devices 117. The one or more destination devices 117 may include a destination module 120 and an expansion module 122. Much like the source module 110, a destination module 120 may serve as a mechanical or electro-mechanical connection between the flat wire 105 and the destination device 117. The various conductors of the flat wire 105 may be terminated at the destination module 120. Termination points within the destination module 120 may include terminal blocks, crimp-on terminals, plug and socket connectors, insulation displacement connectors (IDC), conductor penetration connectors (CPC), or any other electrical connector as will be understood by those of ordinary skill in the art.

An expansion module 122 may be included in a destination device 117, and the expansion module 122 may serve as a mechanical or electro-mechanical connection between the destination device 117 and a load side destination 125. A load side destination 125 may be a power outlet or receptacle, a wired device, a terminal block, a safety component, "flying leads," or any other load side connection as will be understood by those of ordinary skill in the art. Termination points within the expansion module 122 used to connect the load side destination 125 to the expansion module 122 may include terminal blocks, crimp-on terminals, plug and socket connectors, insulation displacement connectors (IDC), conductor penetration connectors (CPC), or any other electrical connector as will be understood by those of ordinary skill in the art. It will also be understood by those of skill in the art that the load side destination may be connected to the destination module 120 as an alternative to being connected to the expansion module 122.

The load side destination 125 may be physically separate from the destination device 117 or, alternatively, the load side destination 125 may be integrated into the destination device 117. For example, if an electrical device such as a lamp were directly connected to the destination device 117, the load side destination 125 would be physically separate from the destination device 117. Alternatively, the load side destination 125 may be integrated into the destination device 117 in a situation in which the destination device 117 includes, for example, one or more electrical sockets. The destination device 117 may include any number of electrical sockets configured to receive electrical plugs. For example, the destination device 117 may include one, two, three, or four sockets that serve as a load side destination 125.

Figure 18:
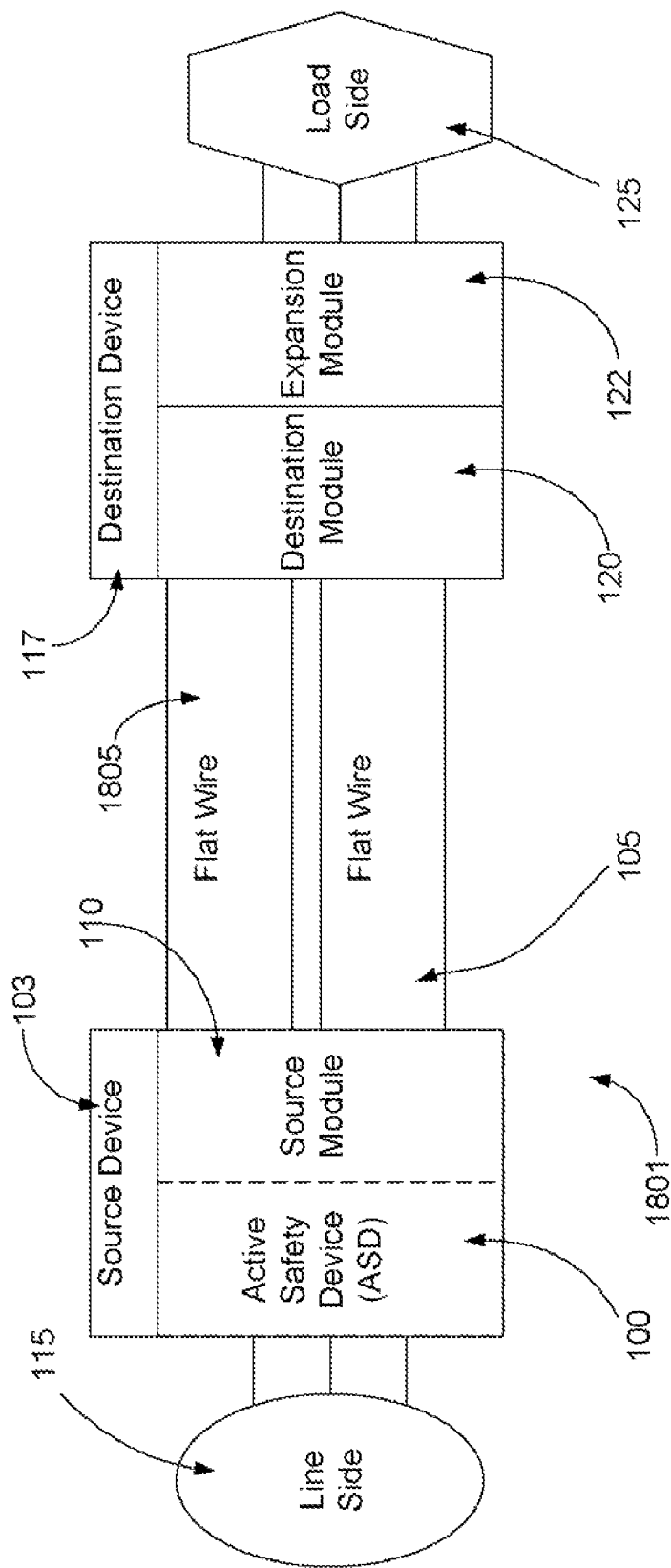
FIG. 18 is a schematic diagram of a flat wire system including an Active Safety Device (ASD) that monitors two flat wires connected to the same destination device, according to an illustrative embodiment of the invention.

Additionally, the expansion module 122 may be used to create a mechanical or electro-mechanical connection between the destination device 117 and a second destination device, as explained in greater detail below with reference to FIG. 18. In such an embodiment, a second flat wire 105 may be, for example, connected to the expansion module 122 and used to create a connection between the expansion module 122 and the second destination device. Termination points within the expansion module 122 may include terminal blocks, crimp-on terminals, plug and socket connectors, insulation displacement connectors (IDC), conductor penetration connectors (CPC), or any other electrical connector as will be understood by those of ordinary skill in the art.

Additionally, as explained in greater detail below, the destination device 117 may be capable of communicating with the ASD 100 through the source module 110 over the flat wire 105. The destination device 117 may also be capable of communicating with a second destination device through the expansion module 122 over a second flat wire 105, as explained in greater detail below with reference to FIG. 15.

Figure 3:
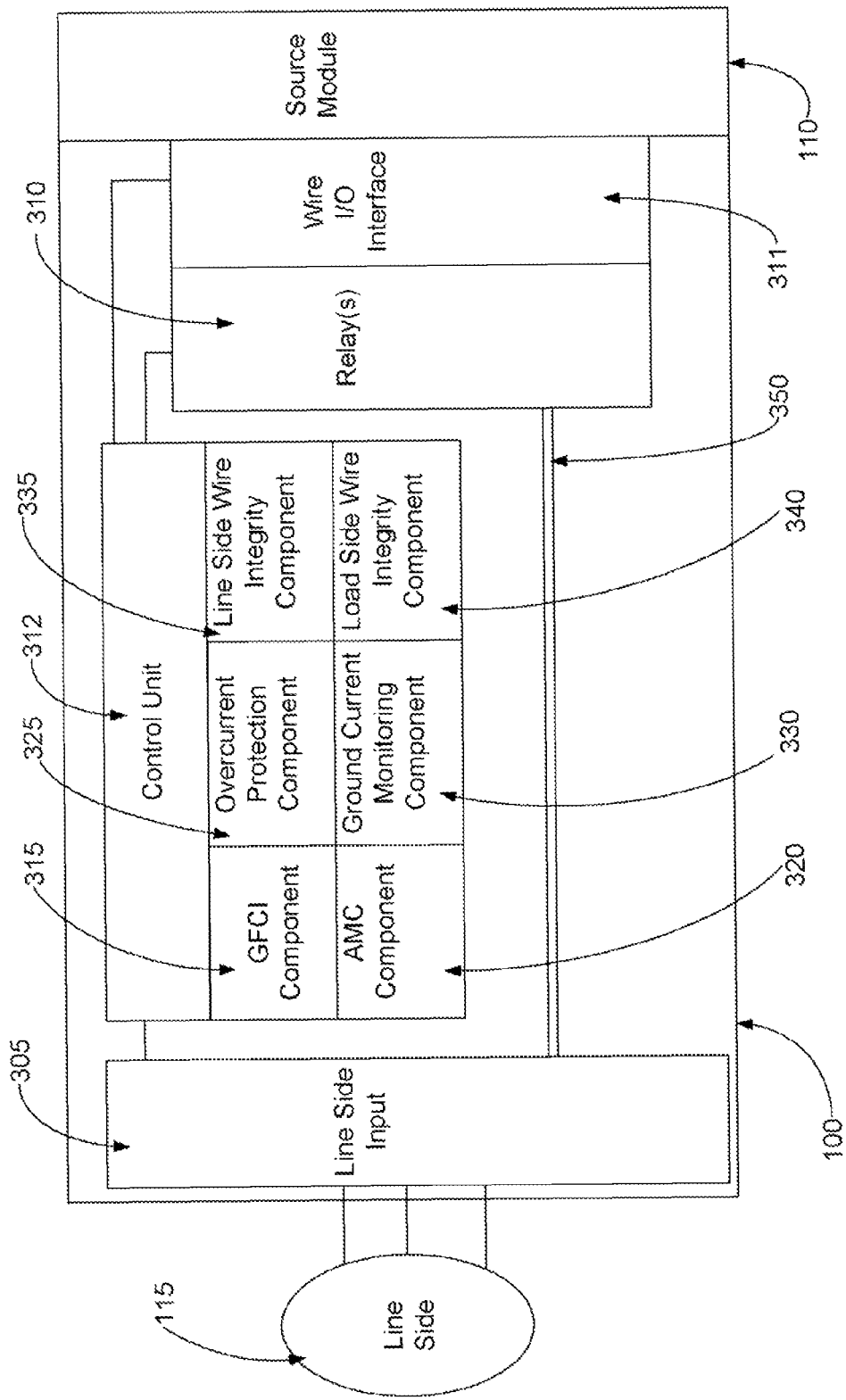
FIG. 3 is a block diagram of the components of an ASD, according to an illustrative embodiment of the invention

FIG. 3 is a block diagram of the components of a source device 103, according to an illustrative embodiment of the invention. The ASD 100 may include a line side input 305, one or more relays 310, a flat wire I/O interface 311, a control unit 312, and various safety components including one or more of a GFCI component 315, an AMC component 320, an over-current protection component 325, a ground current monitoring component 330, a line side wire integrity component 335, and a load side wire integrity component 340.

The ASD 100 may be powered by a power source, which may be connected to the ASD 100 at the line side input 305. For example, the line side power source 115 may be connected to the line side input 305 of the ASD 100 to provide power to the ASD 100. Further, the one or more relays 310 may control the flow of an electrical signal, which may be an electrical power signal, from a power source through the ASD 100 to the source module 110. Each of the one or more relays 310 may be, for example, a double pole single throw (DPST) relay. It will be understood that a multitude of other relays may be used by the ASD 100 including, but not limited to, one or more single pole single throw (SPST) relays, one or more single pole double throw (SPDT) relays, one or more single pole changeover or center off relays (SPCO), one or more double pole double throw relays (DPDT), or one or more double pole changeover or center off relays (DPCO).

The ASD 100 may include a single (common or main) relay 310 or it may include multiple relays in other suitable configurations within the ASD 100. For example, each safety component of the ASD 100 may include subordinate or dedicated relays or, alternatively, various components of the ASD 100 may share a common or main relay 310. As another example, a separate relay may be provided for various conductors of a flat wire 105 that is connected to the source module 110. For example, a first relay may be provided for the electrifiable conductor 205 and a second relay may be provided for the return conductors 210, 215. Each of the relays may be actuated independently of one another or, alternatively, a plurality of the relays may be jointly actuated. It will be appreciated that the ASD 100 may utilize one or more relays to communicate test signals onto the flat wire 105 without providing an electrical power signal to the electrifiable conductor 205 of the flat wire 105. For example, as explained in greater detail below with reference to FIG. 11, the second relay may be utilized to communicate a test signal onto the return conductors 210, 215 of the flat wire 105, and the ASD 100 may then monitor the flat wire 105 for miswires and/or wire faults. If the ASD 100 determines that no miswires and/or wire faults exist on the flat wire 105, then the ASD 100 may utilize the first relay to permit an electrical power signal to be communicated only the electrifiable conductor 105. Unless otherwise stated in this disclosure, for purposes of simplicity, reference will be made to an ASD 100 that includes a single relay 310 that is utilized to control the communication of an electrical power signal onto the electrifiable conductor 105 of the flat wire 105.

In the illustrative embodiment with a single relay 310, also referred to as the common or main relay, the ASD 100 may maintain the relay 310 in either an opened position or a closed position. When the relay 310 is maintained in a closed position, electrical power may be permitted to flow from a line side power source 115 through the ASD 100 to the source module 110. As shown in FIG. 3, an ASD power line 350 may be included in the ASD 100 to carry the electrical power from the line side input 305 through the ASD 100 to the source module 110; however, it will be understood that electrical power could be propagated through the ASD 100 via circuitry other than an ASD power line 350, such as through the various individual safety components of the ASD 100. The ASD power line 350 is included in this disclosure for simplification purposes in order to facilitate the understanding of the invention. From the source module 110, the electrical power may then be transmitted onto the flat wire 105 and be delivered to the destination module 120.

Alternatively, when the relay 310 is maintained in an opened position, an electrical signal is not allowed to flow from a line side power source 115 through the ASD 100 to the source module 110. The ASD 100 may beneficially be configured to default to maintaining the relay 310 in an opened position. By defaulting to an opened position, the ASD 100 may ensure that no faults are present in the flat wire system 101 prior to full electrification or energization of the flat wire system 101. Accordingly, whenever the ASD 100 loses power, if the relay 310 is not in an opened position, the relay 310 may be switched to an opened position in order to permit the ASD 100 to perform tests on the flat wire system 101.

According to an aspect of the invention, the relay 310 may be part of a zero crossing circuit. Alternatively, the zero crossing circuit may be a part of the control unit 312, and the control unit 312 may receive a power signal, such as an alternating current power signal, from the line side input 305 and provide a coil control signal (such as a 120 VAC, 24 VDC or 12 VDC signal) to the relay 310. A zero crossing circuit is an electrical circuit that detects an alternating current load voltage at or close to zero phase occurring once for each alternating current half cycle. The zero crossing circuit may be used in connection with the opening or closing of the relay 310 in order to assist in opening or closing the relay 310 at a point in time that is close to the zero phase of the input signal. Zero crossing circuits may work on voltage zero crossings or on current zero crossings. The zero crossing circuit may take inherent turn-on and turn-off delays associated with the relay 310 into account when making zero crossing contact closures or breaks of the main relay 310. Since typical power systems in many countries run at 60 cycles per second or Hertz (Hz), a zero crossing occurs approximately every 8.3 milliseconds (ms). A typical relay 310 may have, for example, a 5 millisecond actuation time (closing time) and a 3 millisecond break time (opening time). In this example, for zero crossing turn-on, the relay coil must be energized for 3.3 ms (or the 8.3 ms cycle time—the 5 ms actuation time) after the last zero crossing of the input signal to produce a contact closure (actuation) of the relay 310 at the next zero crossing of the input signal. Similarly, in the same example, the relay coil must be de-energized for 5.3 ms (or the 8.3 ms cycle time—the 3 ms break time) after the last zero crossing to produce a contact break (de-actuation or opening) at the next zero crossing of the input signal. Accordingly, the output of power from the ASD 100 onto the flat wire 105 will start as soon as possible once the relay 310 is closed. Additionally, the input waveform from the line side 115 will match the output waveform across the flat wire 105 as closely as possible meaning that less energy is dissipated in the ASD 100 and source module 110 circuitry. The ability of the ASD 100 to perform a zero cross turn on or turn off of the relay 310 may extend the lifetime of the contacts in the relay 310, limit the contact arc-showering effect, limit electromagnetic emissions, and limit conducted electrical noise from the relay 310.

According to another aspect of the invention, it will be appreciated that the relay 310 may be actuated for a short period of time in which tests may be performed on the flat wire 105. For example, the relay 310 may be actuated for a period of time that is less than or approximately equal to the time that it takes for one half of a typical power cycle. As explained in greater detail below with reference to FIGS. 9, 11 and 12, the ASD 100 may test one or more conductors of the flat wire 105 during the time that the relay 310 is actuated.

According to another aspect of the invention, the ASD 100 may be able to detect slow breaking (i.e., sticky) contacts in the relay 310. The control unit 312 of the ASD 100 may monitor the contact break times of the relay 310 with a counter or other timing device. The control unit 312 may directly monitor the break time of the relay 310, or the control unit 312 may monitor the break time of the relay 310 by receiving information from the flat wire I/O interface 311. By monitoring the break time of the relay 310, the control unit 312 may detect a slow break time for the relay 310. For preventative maintenance purposes, the ASD 100 may alert a user of these slow breaking contacts so that the ASD 100 may be repaired or replaced. The user may be alerted in a number of ways by the ASD 100. One possible method for alerting a user is to activate an LED on the exterior of the ASD 100 that will alert the user to the potential main relay contact problems. Another method for alerting the user is to transmit a communication from the ASD 100 to either another ASD 100, a central hub or control panel, or some other device, as will be explained in greater detail below with reference to FIGS. 16-17.

According to another aspect of the invention, the ASD 100 may include a control unit 312. The control unit 312 may control the various safety components of the ASD 100. Alternatively, each individual safety component of the ASD 100 may include its own control unit or various components of the ASD 100 may share control units. The control unit 312 may contain one or more microcontrollers and associated components such as resistors, diodes, capacitors, and crystals or, alternatively, the control unit 312 may be any other suitable device and associated circuitry for controlling an electronic circuit including, but not limited to, microprocessors, one or more programmable logic arrays, a state machine, a minicomputer, or a general purpose computer along with any associated firmware and software. It will be appreciated that many different types of control units may be incorporated into, associated with, or in communication with the ASD 100. It will further be appreciated that a control unit may include any number of processors. A control unit may also be external to and/or located remotely to the ASD 100, and the control unit may communicate with the components of the ASD 100 via a suitable network connection, such as a wired network connection or a wireless network connection.

According to an aspect of the invention, the control unit 312 may be configured to or operable to store various types of data associated with the operation of the ASD 100. The data may include data associated with the operation of the various safety components of the ASD 100. Additionally, the data may include measurements data that has been taken while monitoring the flat wire 105 in accordance with the operation of the various safety components of the ASD 100. The data may also include one or more counters associated with the operation of the ASD 100 and the various safety components of the ASD 100. For example, the data may include a number of counters that the ASD 100 and/or the various safety components of the ASD 100 has recognized a miswire or wire fault on flat wire that is monitored by the ASD 100. The stored data may be utilized during subsequent operations of the ASD 100. For example, data stored in associated with the operation of a safety component of the ASD 100 may later be utilized in association with the operation of the safety component of the ASD 100 and/or in association with the operation of other safety components (or the control unit 312) of the ASD 100. It will be appreciated that a wide variety of data may be stored by the ASD 100 or by one or more memory devices associated with the ASD 100. The data items that may be stored by the ASD 100 include, but are not limited to those listed in Table 1 below:

TABLE 1

Data Items that may be Stored

| Data Item | Type | Initial Value |
|---|---|---|
| Hot Relay Normal Actuations Count | counter | 0 |
| Hot Relay Normal Actuations limit for end of life | limit | 75000 |
| Hot Relay High Current Actuations Count | counter | 0 |
| Hot Relay High Current Actuations Limit for end of life | limit | 5 |
| Fatal non-resetable (internal) Fault Code | code | 0 |
| Non-fatal Limited Resetable Fault Count | counter | 0 |
| Non-fatal Unlimited Resetable Fault Count | counter | 0 |
| Hot Relay Actuation Time | value | 0 |
| Hot Relay Release Time | value | 0 |
| Fault code #1 count | counter | 0 |
| Fault code #2 count | counter | 0 |
| Fault code #3 count | counter | 0 |
| Fault code #4 count | counter | 0 |
| Fault code #5 count | counter | 0 |
| Fault code #6 count | counter | 0 |
| Fault code #7 count | counter | 0 |
| Fault code #8 count | counter | 0 |
| Fault code #9 count | counter | 0 |
| Fault code #10 count | counter | 0 |
| Fault code #11 count | counter | 0 |
| Fault code #12 count | counter | 0 |
| Fault code #13 count | counter | 0 |
| Fault code #14 count | counter | 0 |
| Fault code #15 count | counter | 0 |
| Fault code #16 count | counter | 0 |
| Fault code #17 count | counter | 0 |
| Fault code #18 count | counter | 0 |
| Fault code #19 count | counter | 0 |

It will be appreciated that other data items may be stored by the ASD 100. it will also be appreciated that, in some embodiments of the invention, the initial values of one or more of the data items may be different than those listed in Table 1. With reference to Table 1, the Hot Relay Normal Actuations Count may keep track of the number of times that the relay 310 is actuated during the normal course of the operation of the ASD 100; the Hot Relay Normal Actuations Limit may establish a limit for the normal actuations of the relay 310 during the lifetime of the ASD 100; the Hot Relay High Current Actuations Count may keep track of the number of times that the relay 310 is tripped as a result of a high current event, as explained in greater detail below with reference to FIG. 4A; the Hot Relay High Current Actuations Limit for end of Life parameter may establish a limit for the number of high current actuations of the relay 310 during the lifetime of the ASD 100, as explained in greater detail below with reference to FIG. 4A; the Fatal Non-Resetable Fault Code may establish a code to be stored for any identified Fatal Non-Resetable Faults; the Non-fatal Limited Resetable Fault Count may keep track of the number of Non-fatal Limited Resetable Faults that are identified; the Non-fatal Unlimited Resetable Fault Count may keep track of the number of Non-fatal Unlimited Resetable Faults that are identified; the Hot Relay Actuation Time Parameter may establish a value for the time that it takes to actuate the relay 100; the Hot Relay Release Time Parameter may establish a value for the time that it takes to release the relay 100; and the parameters for Fault Codes 1-19 Counts may keep track of the number of different types of faults that are identified by the ASD 100. It will be appreciated that many different types of faults may be identified and that each fault may be associated with its own counter.

Figure 4A:
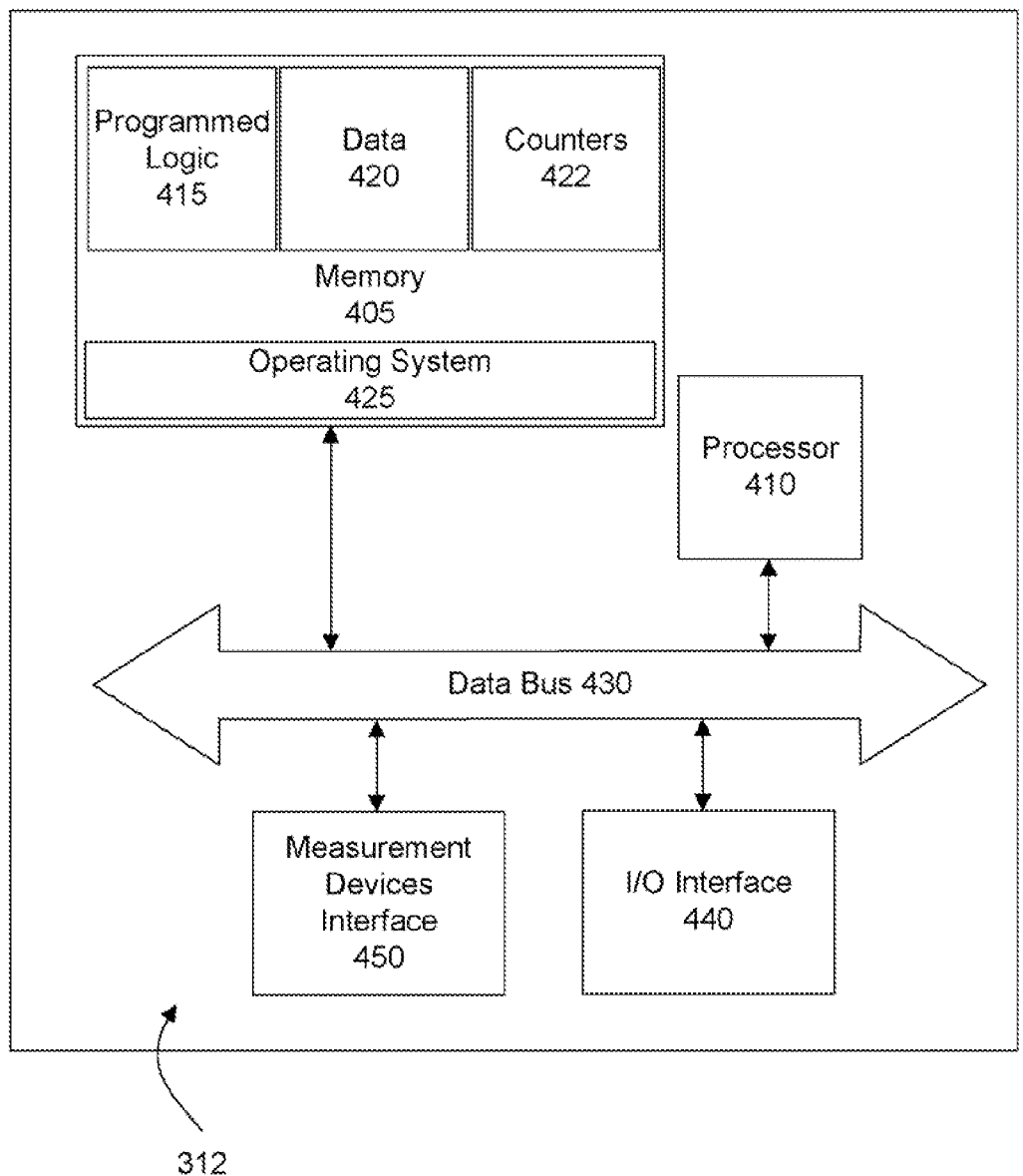
FIG. 4A is a block diagram of a control unit that may be associated with an ASD according to embodiments of the invention.

FIG. 4A is a block diagram of an example control unit 312 that may be associated with an ASD 100 according to certain embodiments of the invention. The control unit 312 may include a memory 405 and a processor 410. The memory may store programmed logic 415 (e.g. software code) in accordance with the invention. The memory 405 may also include measurements data 420 utilized in the operation of the invention, counters or states utilized in the operation of the invention 422, and an operating system 425. The processor 410 may utilize the operating system 425 to execute the programmed logic 415, and in doing so, also utilizes the measurement data 420. The programmed logic 415 may include the logic associated with the operation of the one or more safety components of the ASD 100. A data bus 430 may provide communication between the memory 405 and the processor 410. The control unit 312 may be in communication with the other components of the ASD 100 and perhaps other external devices, for example, lights, speakers, keyboards, mouse devices, and other user interface devices, as well as data lines connected to other ASD's or electrical appliances, via an I/O Interface 440. Additionally, measurement devices configured to take various electrical measurements of the flat wire 105 may be in direct communication with the control unit 312 via a measurement devices interface 450 or, alternatively, may communicate with the control unit 312 via the I/O Interface 440. These measurement devices may be included in the flat wire I/O interface 311, as described in greater detail below. Further, the control unit 312 and the programmed logic 415 implemented thereby may comprise software, hardware, firmware or any combination thereof.

The control unit 312 may control and/or include the various safety components of the ASD 100. Additionally, the control unit 312 may store data relating to the status of the flat wire system 101. For example, the control unit 312 may maintain flags or states for each of the safety components of the ASD 100 in order to determine when to trip the relay 310 of the ASD 100 and to indicate, in the event of a miswire or fault detection, which safety component identified the flat wire 105 miswire or fault. The control unit 312 may also store measurements data 420 associated with the operation of the various safety components of the ASD 100. In addition, before the relay 310 of the ASD 100 is closed, allowing a flat wire 105 to be electrified, the control unit 312 may cause each safety component to test the flat wire 105 for miswire and/or wire faults. The control unit 312 may also be configured to take a control action when a miswire or wire fault in the flat wire 105 is detected. A control action may include, in addition to maintaining or forcing the relay 310 into its open position, an action that informs a user of the ASD 100 about the miswire or fault detection. For example, a visual indicator such as an LCD display or one or more LED's may be included in the ASD 100, and the display or LED's may be actuated in such a manner as to inform a user of the miswire or fault detection and the nature of the miswire or fault detected. As one example, the ASD 100 may include a single LED that is activated by the control unit 312 when a fault is detected to inform a user of the fault. As an alternative example, the ASD 100 may include an LED associated with each safety component of the ASD 100 and, when a miswire or fault is detected, the control unit 312 may activate the LED associated with the safety component that detected the miswire or fault. Another control action that may be taken by the control unit 312 is the transmission of a message indicating the detection of the miswire or fault. The control unit 312 may transmit the message to another ASD 100, to a central hub or control panel, or to another destination, as will be explained in greater detail below. It will be understood that other indicators such as audible alarms may also be utilized by the ASD 100. Indicators that may be used by the ASD 100 beneficially add to the overall safety of the ASD 100 by informing a user of a fault and potentially pinpointing the fault for the user.

The control unit 312 may also include one or more counters and/or timers 422. Counters and/or timers 422 associated with each safety component may be used by the control unit 312 to track the number of times a particular safety component has detected a miswire or wire fault in the flat wire 105. Additionally, a universal timer or counter may be used to track the number of times the ASD 100 has detected a miswire or wire fault in the flat wire system 101. Separate counters may also be utilized to track detected miswires and detected wire faults. These counters and/or timers 422 may be used to monitor the flat wire system 101, and may be used to generate states that indicate the current condition of the flat wire system 101. The counts and/or states may be used to perform preventive maintenance on the flat wire system 101. The storage capability of the counters and/or timers 422 may also be non-volatile, for example, in non-volatile memory, so that information including counts and states are not lost during a power outage or brown-out condition.

According to an aspect of the invention, the control unit 312 may additionally include at least one lifetime counter. It will be appreciated that the relay 310 may have a lifetime associated with it. In other words, the relay 310 may cease to operate properly after it has been actuated normally for a certain number of times or after it has been tripped several times as the result of a detected high current event. For normal actuations of the relay 310, the lifetime of the relay may be a fairly large value, such as the value shown for the Hot Relay Normal Actuations Limit for End of Life parameter of Table 1. For the number of trips due to detected high current events, a predicted lifetime of the relay 310 may be similar to a mean trips to failure for the relay 310, such as the value shown in the Hot Relay High Current Actuations Limit for end of Life parameter of Table 1. Different types of relays 310 that may be utilized by the ASD 100 may be associated with different lifetimes. A lifetime counter associated with a relay 310 may be configured to count down from or up to a predetermined threshold value. The threshold value may be a value that is less than or equal to the predicted lifetime of the relay 310.

For example, if the predicted lifetime of the relay is 8-10 trips, then the threshold value may be established as 5 trips of the relay 310. Once the relay 310 has been tripped a number of times equal to the threshold value, the ASD 100 may deactivate the relay 310 and prevent the relay 310 from being closed by a user event, for example, a reset of the ASD 100. Utilizing the example of the relay 310 with a threshold value established as 5 trips, a user may reset an ASD 100 and the relay 310 following the first four trips of the relay 310; however, once the relay 310 has tripped for the fifth time, a user will not be permitted to reset the ASD 100 and the relay 310. In such a situation, the user may be required to return or send the ASD 100 to a retailer, distributor, manufacturer, or repair center associated with the ASD 100 in order to have the relay 310 and/or the ASD 100 tested, updated, and/or replaced. It will be appreciated that the lifetime counter may prevent a situation in which the ASD 100 and the relay 310 is reset, but the relay 310 is not capable of tripping when a miswire or wire fault is detected by the ASD 100.

According to an aspect of the invention, each of the one or more lifetime counters of the ASD 100 may be associated with specific types of errors detected by the ASD 100. For example, the lifetime counter may be associated with errors that lead to a tripping of the relay 310 due to a high current event, thereby causing an electrified flat wire 105 to be de-energized. It will be appreciated that not all errors detected or detectable by the ASD 100 will lead to a tripping of the relay 310 as a result of a high current event. For example, an error detected prior to the electrification of the flat wire 105 may not lead to a tripping of the relay 310. According to an aspect of the invention, there are three different types of exceptions or alarms that may be recognized by the ASD 100. The first type of alarm is a fatal non-resetable alarm, which may be recognized if a failure of any of the internal circuitry of the ASD 100 is detected. For example, a fatal non-resetable alarm may be recognized if a stuck relay is identified, if a fuse incorporated into the ASD 100 is blown, if a detected signal is outside of a detectable range, if a failure of self-test circuitry associated with the ASD 100 is detected, and/or if a lifetime counter has exceeded or reached a threshold value. The second type of alarm is a non-fatal limited resetable alarm, which may be an alarm that is associated with a high current event on the flat wire 105. For example, a non-fatal limited resetable alarm may be recognized if a wire fault is detected on an electrified flat wire 105. The third type of alarm may be a non-fatal unlimited resetable alarm, which may be associated with a non-fatal alarm that does not involve a high current event. It will be understood that the ASD 100 may allow an unlimited number of the third type of alarm to occur; however, it will also be appreciated that a limit may be associated with this type of alarm. It will further be appreciated that an ASD 100 in accordance with the invention may recognize many different types of alarms and that those alarms described herein are merely example types of alarms.

Figure 4B:
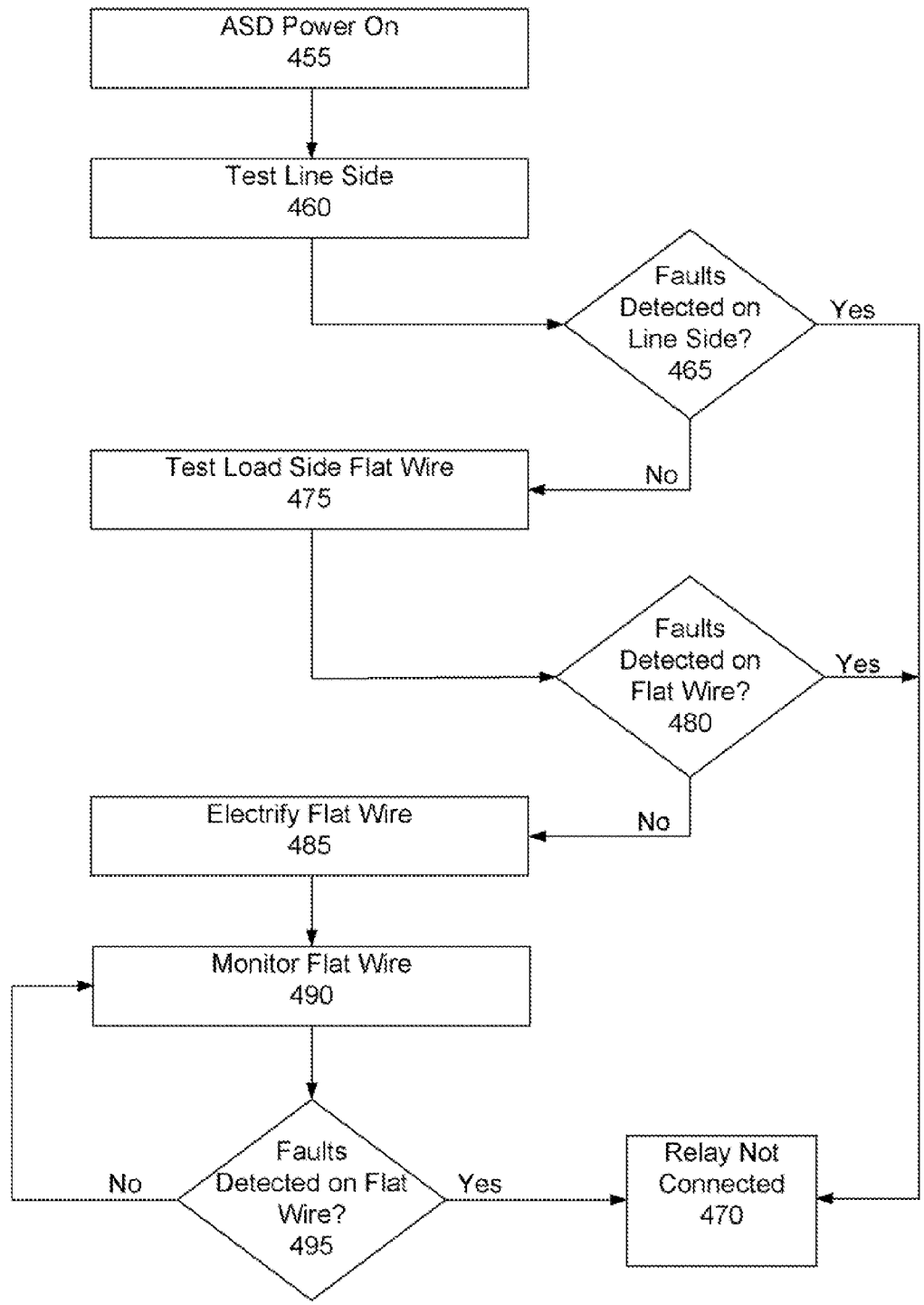
FIG. 4B is an example flowchart of the operation of the control unit of FIG. 4A, according to an illustrative embodiment of the invention.

FIG. 4B is an example flowchart of the general operation of the ASD 100 of FIG. 3 and the control unit 312 of FIG. 4A, according to an illustrative embodiment of the invention. The operation described in FIG. 4B may include the operations that are performed to monitor a flat wire 105 by the ASD 100. At block 455, power may be applied to the ASD 100, and the ASD 100 may commence operation at block 460. At block 460, the ASD 100 may test the line side 115 for miswires. If a line side miswire is detected at block 465, then the ASD 100 may go to block 470 and prevent the relay 310 from being closed, thereby preventing the electrification of the flat wire 105. If, at block 465, no line side miswires are detected by the ASD 100, then the ASD 100 may go to block 475 and test the load side flat wire 105 for miswires and/or wire faults. If, at block 480, a miswire or wire fault is detected on the flat wire 105, then the ASD 100 may go to block 470 and prevent the relay 310 from being closed, thereby preventing the electrification of the flat wire 105. If however, at block 480, no miswires and/or wire faults are detected on the flat wire 105, then the ASD 100 may go to step 485. At lock 485, the relay 310 of the ASD 100 may be closed, and the flat wire 105 may be electrified. During the electrification of the flat wire 105 and after the flat wire 105 has been electrified, the ASD 100 may monitor the flat wire 105 for wire faults at block 490. If a fault is detected on the flat wire 105 at block 495, then the ASD 100 may go to block 470 and open the relay 310, thereby causing the flat wire 105 to be de-electrified or de-energized. If, however, no wire faults are detected on the flat wire 105 at block 495, then the ASD 100 may go to block 490 and continue monitoring the flat wire 105.

It also will be understood by those of skill in the art that the tests performed by the control unit 312 do not necessarily have to be performed in the order set forth in the logic of FIG. 4B, but instead may be performed in any suitable order. It also will be understood that the control unit 312 does not have to conduct each test set forth in FIG. 4B, but instead may conduct less than all of the tests set forth in FIG. 4B. Additionally, if a miswire or wire fault is detected by the control unit 312 or by a safety component in communication with the control unit 312, then an indicator may be stored by the control unit 312 or the associated safety component, and the indicator may include information as to which test(s) resulted in the detection of the miswire or wire fault. This indicator may then be transmitted by the ASD 100 to another device such as a second ASD 100, a central monitoring device, or a computer.

As mentioned earlier, the ASD 100 may include both reactive and/or proactive safety components. A reactive safety component of the ASD 100 may detect a wire fault in the flat wire 105 after the flat wire 105 has been fully electrified. A reactive safety component may also detect a wire fault during the full electrification of the flat wire 105 or during the time period that it takes to fully electrify the flat wire 105 after a full electrification signal is allowed to flow onto the flat wire 105. In other words, a reactive safety component may detect wire faults while a voltage in the range of approximately 90 to 130 VAC (for a standard 120 VAC power system, such as a North American power system) or a voltage in the range of approximately 220 to 250 VAC (for a standard 240 VAC power system, such as a European power system) is present on the electrical flat wire 105. It will be understood that each country or region may have differing voltage or current standards that may be taken into account in the design and implementation of the ASD 100. Additionally, it will be appreciated that one or more reactive tests may be conducted constantly following the electrification of the flat wire 105. Alternatively, one or more reactive tests may be conducted periodically following the electrification of the flat wire 105.

A proactive safety component of the ASD 100 may detect a wire fault prior to full power electrification of the flat wire 105. In other words, a proactive safety component may perform checks or tests on the electrical flat wire 105, such as checks or tests that involve the communication of voltage or current test signals onto the flat wire 105, prior to allowing full electrification of the flat wire 105.

Reactive safety components of the ASD 100 may include one or more of a ground fault circuit interrupter (GFCI) 315, an arc mitigation circuit (AMC) 320, an over-current protection component 325, and a ground current monitoring component 330. Proactive safety components of the ASD 100 may include one or more of a line side wire integrity component 335 and a load side wire integrity component 340. Each of these safety components is discussed in greater detail below.

The reactive and proactive safety components of the ASD 100 may utilize various electrical measurements associated with line side conventional wiring as well as the flat wire 105 that is connected to the ASD 100 and source module 110 respectively in determining whether or not a miswire condition or wire fault exists on either side of the ASD 100. The ASD 100 may utilize the various measurements to detect miswires on the line side of the ASD 100 and to detect miswires and/or wire faults on the flat wire 105 that is connected on the load side of the ASD 100. The ASD 100 may include a flat wire I/O interface 311 that is capable of taking electrical measurements associated with the various conductors of the flat wire 105 connected to the ASD 100. Alternatively, these electrical measurements may be taken by the various components of the ASD 100. For example, either the flat wire I/O interface 311 and/or the components of the ASD 100 may measure the voltage, current, impedance, resistance or any other electrical characteristic associated with the flat wire 105. For example, either the flat wire I/O interface 311 or the components of the ASD 100 may measure the current present on any of the conductors of a flat wire 105 with any suitable current measuring device, such as a current transformer. As another example, the flat wire I/O interface 311 or the components of the ASD 100 may measure the voltages present on any of the conductors of a flat wire 105 with any suitable voltage measuring device, such as a signal conditioning circuit or a volt meter. Each component of the ASD 100 may include measurement devices associated with that component or, alternatively, one component of the ASD 100 may make use of a measurement device used by another component of the ASD 100. It will be understood that the ASD 100 may also include a single set of measurement devices in the flat wire I/O interface 311 that are used by all of the components of the ASD 100, as shown in FIG. 3.

Additionally, the flat wire I/O interface 311 or the components of the ASD 100 may include excitation circuitry or devices that are capable of communicating a signal onto one or more of the conductors of the flat wire 105. Excitation circuits or devices may be capable of communicating a current signal onto one or more of the conductors or layers of the flat wire 105. Suitable excitation circuits or devices for communicating a current signal onto one or more of the conductors of the flat wire 105 include, but are not limited to, current transformers, current sources, isolators, multiplexers, and relays. As an alternative to, or in addition to transmitting a current signal onto the flat wire 105, excitation circuits or devices may be capable of transmitting a voltage signal onto one or more conductors or layers of the flat wire 105. Suitable excitation circuits or devices for transmitting a voltage signal onto one or more conductors of the flat wire 105 include, but are not limited to, voltage transformers, multiplexers, drivers, and voltage sources. Each component of the ASD 100 may include excitation circuit devices associated with that component or, alternatively, one component of the ASD 100 may make use of an excitation device used by another component of the ASD 100. The ASD 100 may also include a single set of excitation circuits or devices in the flat wire I/O interface 311 that are used by all of the components of the ASD 100, as shown in FIG. 3. As explained in greater detail below, the excitation devices may be used in conjunction with the measurement devices to perform tests on the flat wire 105.

The reactive and proactive safety components of the ASD 100 may operate independently of one another, or, alternatively, their operation may be controlled by the control unit 312. In the illustrative embodiment of FIG. 3 with a single set of measurement devices contained within a flat wire I/O interface 311, the individual safety components may receive electrical measurements from the flat wire I/O interface 311 or, alternatively, the individual safety components may receive electrical measurements from the flat wire I/O interface 311 through the control unit 312 or through another safety component. Additionally, it will be appreciated that one or more of the various safety components of the ASD 100 may share one or more circuit components.

According to an aspect of the invention, a ground fault circuit interrupter (GFCI) safety component 315 may be associated with the ASD 100, which will be referred to herein as a GFCI component 315. The GFCI component 315 may detect ground faults in a flat wire 105 system. A ground fault is an unintentional electric path which diverts current to ground. The GFCI safety component may be specially designed to account for the fact that it is being used in conjunction with flat wire 105, as discussed below. As previously mentioned, in connection with FIG. 2, a flat wire 105 will typically have one electrifiable or hot conductor 205 and may have one or more return or neutral conductors 210, 215. The GFCI component 315 may monitor the current differential between the electrifiable conductor 205 and the one or more return conductors 210, 215 of the flat wire 105. If the current flowing through the electrifiable conductor 205 differs from the combined current flowing through any of the one or more return conductors 210, 215, then the GFCI component 315 may cause the ASD 100 to open a relay 310, thereby preventing the further flow of electrical power onto the flat wire 105. For example, the GFCI component 315 may cause the ASD 100 to open the relay 310 if the current differential between the electrifiable conductor 205 and the combined current in any of the one or more return conductors 210, 215 (or H-N) is approximately 5.5 milliamps or greater. It will also be understood by those of skill in the art that the GFCI component 315 may be set to open the relay 310 of the ASD 100 based on any number or measured current differentials.

Additionally, the trip time of the GFCI component 315 or the time it takes the GFCI component 315 to open a relay 310, may vary with the current differential detected by the GFCI component 315. For example, a slower trip time may be associated with a smaller current differential, and a faster trip time may be associated with a higher current differential. The trip time of the GFCI component 315 may be a linear function of the current differential detected by the GFCI component 315. Alternatively, the trip time of the GFCI component 315 may be a non-linear function of the current differential detected by the GFCI component 315, such as that defined by UL943, a standard established by Underwriters Laboratories, Inc. (UL).

According to another aspect of the invention, an arc mitigation circuit (AMC) safety component 320 may be associated with the ASD 100, which will be referred to herein as an AMC component 320. The AMC component 320 may detect an arcing condition that is present on the flat wire 105. An arcing condition may include a high power discharge of electrical energy between two or more conductors. The arcing condition does not necessarily need to exceed the normal maximum load limits of a component of the flat wire system 101. The normal maximum load limit of a standard electrical outlet, for example, is 120 volts at 15 amps, or 1800 watts. The electrical energy discharged by an arcing condition may or may not exceed 1800 watts. For conventional wiring, there is a wide array of arc fault current signatures, but the signatures are typically characterized by spikes of current near the voltage peaks of an electrical signal as opposed to a sinusoidal signature. Arc faults or arcing faults on conventional wire are one of the major causes of fires attributed to home electrical wiring as normal circuit breakers do not reliably detect and trip on arc faults. When unwanted arcing occurs, it may generate high localized or spot temperatures that can ignite nearby combustibles such as wood, paper and carpets.

An arcing condition on a flat wire 105 may be very different than an arcing condition on a conventional wire. Unlike convention wire, an arcing condition on a flat wire 105 may be a short duration flash which may be referred to as an arc flash. A typical flash, if not eliminated, may last from the time that electrification of the flat wire 105 is initiated until the time that a wire fault is identified and the relay 310 is opened. The over-current protection component 325 and the ground current monitoring component 330 may be the primary safety components that are responsible for removing power to the flat wire 105 due to a penetration or other type of wire fault resulting in abnormally high RMS currents. In the case of arcing events that result from ohmic or higher resistance "shorts," there may be an associated arc signature current that has a high peak-to-peak value, but an RMS value that does not exceed the standard current limit of 15 amps RMS. Because standard arc faults are relatively slow phenomena, requiring several alternating current cycles to detect and respond to, they are different than the arc flashes that may occur on a flat wire 105. For flat wire 105, the AMC component 320 and the other safety components of the ASD 100 may be designed to work as a system to mitigate arc flash events.

There are typically two types of arc flash events that may occur on a flat wire 105. The first type is possible during a live (electrified) penetration of the flat wire 105 by a penetrating object whereby, under certain circumstances, a blow-by or escape of hot gases or particulate matter may occur around the perimeter of the penetrating object. The second type of arc flash event is possible after a penetrating object has been removed from the flat wire 105. If the flat wire 105 is electrified again, an arc flash may occur prior to other safety components of the ASD 100 identifying a wire fault. From the time that the flat wire 105 is electrified until the ASD 100 or other safety device reacts to de-energize the flat wire 105 once again, an arc flash is possible whereby hot gases and particulate matter are expelled from the orifice left by the removed object.

The AMC component 320 may be designed to reduce the amount of energy and temperature of the expelled gases and particulate matter in the aforementioned types of arc flash events. The first and most direct approach centers on current signature analysis during the arc flash events. However, the construction and materials used in the flat wire 105 itself may also have mitigating effect on arc flash events. The flat wire 105 may contains individual layers of insulated conductors which can be further bonded to form an essentially inseparable set of strata. This bonding technique tends to mitigate the arc flash events by enforcing lower impedance interlayer shorts. Accordingly, the safety components of the ASD 100 may be capable of more easily detecting these events. Additionally, the load side wire integrity component discussed below with reference to FIG. 12 may allow potential arcing conditions to be more easily recognized.

For arc signature detection of an arc flash, the AMC component 320 may be operable to sense the current waveform on the electrifiable conductor 205 via a suitable current detection device, such as a current transformer. The AMC component 320 may analyze the rate of change of the current, the peak current, and the phasing of the peak current in order to make a decision on the presence of an arcing event.

As with the GFCI component 315, the AMC component 320 may be designed to take the physical characteristics of flat wire 105 into account, as discussed below. The AMC component 320 may detects specific arcing conditions which may occur on the flat wire 105 that may be hazardous. The AMC component 320 may discriminate between unwanted arcing conditions and normal arcing conditions. A normal arcing condition may be the switching on or off of a circuit or unplugging a device from an electrical outlet. An unwanted arcing condition may be present on the flat wire 105 if there is a penetration, puncture, or flaw in the insulation layers 230 between the electrifiable conductor 205 and one of the other conductors of the flat wire 105. If multiple layers of insulation are present between two conductors of the flat wire 105, such as to envelope each conductor separately, an arc flash may occur if each layer of insulation has a flaw (e.g., hole) and the flaws are situated in close proximity to one another. In other words, an arc flash may occur if the insulation layer flaws line up with one another or are in close proximity to one another. An arc flash condition may also occur if the flat wire 105 is penetrated by a foreign object and the penetrating object is removed from the flat wire 105. A situation might exist in which the conductors are no longer shorted together once the foreign object has been removed, and an arc flash might occur if the flat wire 105 is electrified.

The AMC component 320 uses current sensing circuitry to discriminate between normal and unwanted arcing conditions within the flat wire 105. The AMC component 320 may detect specific arc flash current signatures which are unique to flat wire 105. These flat wire 105 arc flash current signatures are often different than the arc fault current signatures of conventional wire. Additionally, the AMC component 320 may be configured to detect arcing conditions originating at a point in a wire that is beyond the flat wire 105 termination at the destination module 120, including arc flashes in another flat wire 105 or arc faults in a conventional wire that is external to the flat electrical wire system 101. Once an unwanted arcing condition is detected in the flat wire 105 or any down-line load, a relay 310 is opened to de-energize the flat wire 105, thus reducing the potential of a fire or other hazardous situation occurring.

A flat wire 105 arc flash signature may differ from the arc fault signature of other forms of electrical wire due to the physical construction of the flat wire 105 that includes stacked conductive layers in close proximity to one another. Once an arc flash condition begins in the flat wire 105, typically at the initial point of penetration or damage to the flat wire 105, high temperature droplets of copper and carbonized debris may be ejected away from the penetration sight. Although most of the copper and debris are ejected out of the damaged site orifice of the flat wire 105, some may proceed transversely into the flat wire 105, thus increasing the radius of the damaged area. If this phenomena proceeds unchecked, it may build or avalanche into larger areas with unique current signatures specific to the flat wire 105.

It will be understood by those of skill in the art that a potentially dangerous situation that may lead to an arc flash on the flat wire 105, for example, a wire fault on the flat wire 105, may be detected by one or more of the other safety components of the ASD 100, as explained in greater detail below. Accordingly, potentially dangerous situations that may lead to an arc flash may be detected prior to the formation of an arc flash on the flat wire 105.

According to another aspect of the invention, an over-current protection safety component 325 may be associated with the ASD 100, which will be referred to herein as an over-current protection component 325. The over-current protection component 325 may provide primary and/or secondary over-current protection. If too much current is allowed to flow through a wire, the wire may overheat and there is a potential that a fire could be started in nearby combustibles such as wood, paper and carpets. The over-current protection component 325 may provide secondary over-current protection in addition to that provided by a standard circuit breaker. Typically, circuit breakers are rated with a maximum current that they can effectively handle in order to trip properly, and a circuit breaker may be ineffective if the current flowing through a circuit (which may be created by a short) is higher than the maximum rated current of the circuit breaker. If such a situation arises, the over-current protection component 325 of the ASD 100 may provide secondary over-current protection. Alternatively, the over-current protection component 325 may provide primary over-current protection if there is no circuit breaker connected to or associated with the line side power supply 115 or if a connected circuit breaker is ineffective. For example, the over-current protection component 325 would provide primary over-current protection if a homeowner closed a circuit in the circuit breaker by placing a penny across the circuit.

The over-current protection component 325 of the ASD 100 may monitor the current flowing through the electrifiable conductor 305 of the flat wire 105. If the current flowing through the electrifiable conductor 305 increases above a maximum threshold value, the relay 310 is opened to de-energize the flat wire 105. It will be understood by those of ordinary skill in the art that the maximum threshold current value may be set at many different values. For instance, the over-current protection component 325 may cause the relay 310 to open if the current in the electrifiable conductor 305 exceeds approximately 15 amps (for 120 VAC applications). An over-current protection component 325 may also examine the current flowing through any of the one or more return conductors 210, 215 of an electrical flat wire 105 in a similar manner to the way in which the electrifiable conductor 205 is monitored.

The over-current protection component 325 may utilize a variable scale algorithm in its monitoring of the electrifiable conductor 205 current. Based on the level or amount of over-current present on the electrifiable conductor 305, the over-current protection component 325 may have a variable trip time, or time it takes to de-actuate or open the relay 310. For example, if the maximum allowable current on the electrifiable conductor is set at 15 amps and the over-current protection component 325 measures a 15.1 amp current on the electrifiable conductor 205, the trip time of the over-current protection component 325 may be approximately one second. The trip time may or may not be adjusted for the next zero crossing condition. Alternatively, if a current of 50 amps or more is detected on the electrifiable conductor 205, the trip time of the over-current protection component 325 may be approximately an immediate trip time (no added delay) or set for the next zero crossing condition. Having a longer trip time at lower over-current levels may serve to mitigate false tripping situations due to load inrush currents on the flat wire 105. It will be understood by those of skill in the art that many different smart algorithms with a wide array of trip times may be used in conjunction with the over-current protection component 325 of the invention. Additionally, the trip time of the over-current protection component 325 may be a linear function of the amount of over-current detected by the over-current protection component 325. Alternatively, the trip time of the over-current protection component 325 may be a non-linear function of the amount of over-current detected by the over-current protection component 325.

According to yet another aspect of the invention, the ASD 100 may include a ground current monitoring safety component 330 to perform ground current monitoring, which will be referred to herein as a ground current monitoring component 330. The ground current monitoring component may be utilized as either a reactive component or in conjunction with the proactive components of the ASD 100. In the flat wire design utilized herein for purposes of disclosing certain embodiments of the invention, there should not be any significant current on a grounding conductor 220, 225 of any flat wire 105 connected to the ASD 100. If a significant current is present on a grounding conductor 220, 225 of the flat wire 105 connected to the ASD 100, a hazardous condition may exist. For example, there may be a short in the flat wire 105. Alternatively, a situation might exist in which electrical power is being supplied to a load and some of that electrical power is backfeeding across the flat wire 105 through, for example, one of the grounding conductors 220, 225, to the source module 110. Such a situation might arise if a faulty or malfunctioning appliance is being supplied power by the flat wire 105 or if an external source of power is miswired into the flat wire system 101 via the load side 125.

The ground current monitoring component 330 monitors the current flowing through one or more of the grounding conductors 220, 225 of a flat wire 105 connected to the ASD 100. If the current increases above a predetermined maximum threshold value, then the relay 310 may be opened to de-energize the flat wire 105. It will be understood by those of ordinary skill in the art that the maximum threshold current value may be set at many different values. For instance, the ground current monitoring component 330 may open the relay 310 if the current in any of the ground conductors exceeds approximately 3.0 milliamps.

According to an aspect of the invention, the ASD 100 may include a line side wire integrity (or miswire) safety component 335, also referred to herein as a Source Wire Integrity (SWI) component 335. The SWI component 335 may be a proactive safety device capable of detecting line side faults or defects in a flat wire system 101 prior to the full power electrification of the flat wire 105. Before the relay 310 of the ASD 100 is closed, thereby allowing the flat wire 105 to be electrified, the SWI component 335 may test the flat wire system 101 on the line side and determine whether the line side power source 115 has been properly terminated on the line side. For purposes of this disclosure, the term line side may refer to a power line that is input into the ASD 100. It will be understood that the line side may be a conventional wire, a flat wire, an electrical outlet, or another input to the ASD 100.

The SWI component 335 may detect line side miswiring of the line side power source 115, which may be conventional wiring or flat wire, via the line side input 305. The line side power source 115 may also be an electrical outlet that the ASD 100 is connected to or plugged into. It will be appreciated that it is a common mistake for an electrical outlet to be miswired, even by an experienced electrician. A line side miswire may include an open conductor of the line side power source 115, which may occur when a conductor of the line side power source 115 is not connected to the line side input 305 of the ASD 100. Alternatively, a line side miswire may occur when one or more conductors of the line side power source 115 are improperly connected to the line side input 305 of the ASD 100, such as when two conductors are reversed in their connection to the line side input 305. For example, if the line side power source 115 is a conventional electric wire, the SWI component 335 may detect a situation in which the line side electrifiable or hot conductor and the line side return or neutral conductor have been switched when connected to the line side input 305. As another example, if the line side power source 115 is an electrical flat wire 105, the SWI component 335 may detect a situation in which the line side electrifiable conductor 205 and one of the line side return conductors 210 have been switched when connected to the line side input 305.

Figure 5:
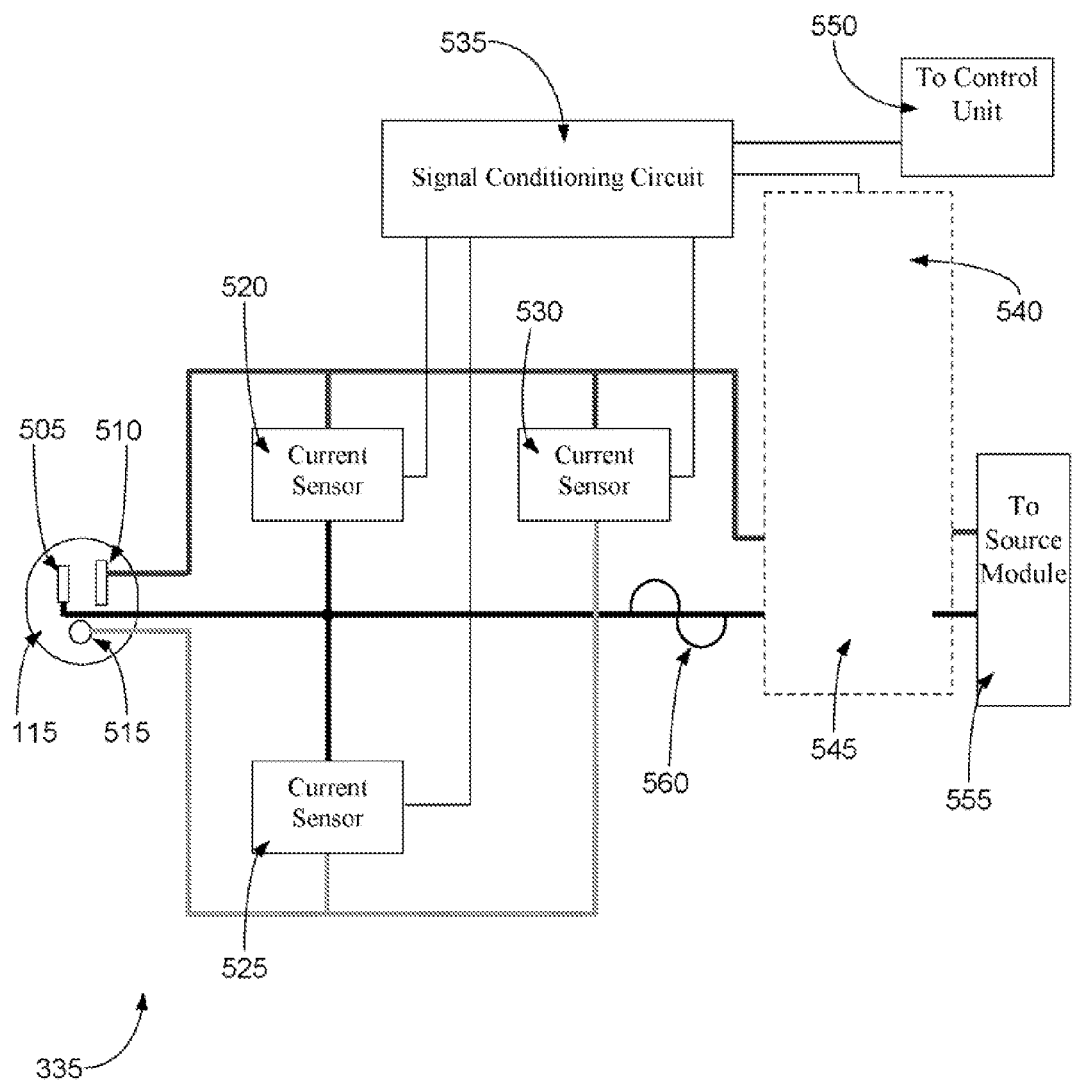
FIG. 5 is a schematic diagram of a line side wire integrity component that may be incorporated into an ASD, according to an embodiment of the invention.

The SWI component 335 may contain line side miswire detection circuitry that uses one or more test signals to locate and detect miswire conditions. FIG. 5 is a schematic diagram of an example line side wire integrity component 335 that may be incorporated into an ASD 100 according to the invention. A line side power source 115 connected to the line side input 305 of the ASD 100 may include an electrifiable (or hot) conductor 505, a return (or neutral) conductor 510, and a grounding conductor 515. It will be understood that the line side input 305 may include more than three conductors. For example, if the line side input 305 is an electrical flat wire, then the line side input 305 may include five conductors.

The SWI component 335 may include three current sensors 520, 525, 530 and a signal conditioning circuit 535. It will be appreciated that any number of current sensors and/or signal conditioning circuits may be associated with the SWI component 335. The SWI component 335 may optionally include an SWI relay driver 540 and an SWI relay 545. The signal conditioning circuit 535 of the SWI component 335 may be in communication with the control unit 312 of the ASD 100 via a control unit communications link 550 or, alternatively, the signal conditioning circuit 535 may be incorporated into the control unit 312. The signal conditioning circuit 535, either on its own or in combination with the control unit 312, may allow a small test current to be transmitted from the line side power source 115 in order to determine whether any line side miswires are present.

The signal conditioning circuit 535 may be any appropriate signal conditioning circuit, and the signal conditioning circuit 535 may include any number of circuit components. The signal conditioning circuit 535 may operate to limit the value of the currents that are detected on the line side prior to communicating those values to the control unit 312 for analysis. Accordingly, the control unit 312 may receive a current measurement from each of the current sensors 520, 525, 530, and the control unit 312 may utilize these measurements to determine whether the line side is wired correctly. The signal conditioning circuit 535 may locate the electrifiable or hot conductor 505 of the line side power source 115, regardless of where it is connected to the line side input 305, and leak a small test current out of the electrifiable conductor 505. The test signal may be a voltage or current test signal, such as a current test signal that is under approximately one milliamp. If there is no electrifiable conductor 505 connected to the line side input 305, then the SWI component 335 will be unable to locate the electrifiable conductor 505 to obtain a test signal. In such a situation, the signal conditioning circuit 535 of the SWI component 335 and/or the control unit 312 may determine that the electrifiable conductor 505 is open on the line side. If, however, an electrifiable conductor 505 is connected to the line side input 305, the signal conditioning circuit 535 may permit the test signal to leak out of the electrifiable conductor 505. The signal conditioning circuit 535 may then monitor the currents detected by the current sensors 520, 525, 530 to determine whether or not any line side miswires are present. A hot-neutral ("H-N") current sensor 520 may be used to detect a current between the electrifiable (or hot) conductor 505 and the return (or neutral) conductor 510. A hot-ground ("H-G") current sensor 525 may be used to detect a current between the electrifiable conductor 505 and the grounding conductor 515. A neutral-ground ("N-G") current sensor 520 may be used to detect a current between the return conductor 510 and the grounding conductor 515. It will be understood by those of skill in the art that a test current applied to a line side conductor may be limited by appropriate electrical standards and codes. For example, a test current applied to a grounding conductor of a line side power source 115 may be limited to an upper bound of approximately 0.5 milliamps by standards established by Underwriters Laboratory, Inc.

If the line side is wired correctly, a current between the electrifiable conductor 505 and the return conductor 510 will be detected by the H-N current sensor 520, a current between the electrifiable conductor 505 and the grounding conductor 515 will be detected by the H-G current sensor 525, and no current between the return conductor 510 and the grounding conductor 515 will be detected by the N-G current sensor 530. If there is a line side miswire, a different set of current measurements than those discussed above for a properly wired line side may be made by the current sensors 520, 525, 530, and the SWI component 335 may detect the miswire. In addition to an open electrifiable conductor 505, The SWI component 335 may detect other open conductors on the line side. For example, if the return conductor 510 is open on the line side, no current will be detected between the electrifiable conductor 505 and the return conductor 510 by the H-N current sensor 525. As another example, if the ground conductor 515 is open on the line side, no current will be detected between the electrifiable conductor 505 and the grounding conductor 515 by the H-G current sensor 525.

The SWI component 335 may also detect conductors that have been miswired or switched when connected to the line side input 305. For example, if the electrifiable conductor 505 and the return conductor 510 have been switched when connected to the line side input 305, the current detected by the H-N current sensor 520 will be reversed because the current will be flowing across the H-N current sensor 520 from the opposite direction. Additionally, no current will be detected by the H-G current sensor 525 and a current will be detected by the N-G current sensor 530. If the electrifiable conductor 505 and the grounding conductor 515 have been switched when connected to the line side input 305, the current detected by the H-G current sensor 525 will be reversed because the current will be flowing across the H-G current sensor 525 from the opposite direction. Additionally, no current will be detected by the H-N current sensor 520 and a current will be detected by the N-G current sensor 530. It will be understood by those of skill in the art that any other miswire on the line side that produces a different set of currents across the current sensors 520, 525, 535 other than the set of currents representative of a properly wired line side will also be detected by the SWI component 335.

If the SWI component 335 detects a miswire on the line side, then the relay 310 of the ASD 100 may be maintained in its open position to prevent electrification of the flat wire 105. If no miswire is detected by the SWI component 335, then the relay 310 may be closed, to allow electrification of the flat wire 105. Alternatively, if the SWI component 335 detects a miswire on the line side, then the SWI relay 545 may be maintained in its open position to prevent the flow of electrical power from the line side input 305 to the source module 110 via a source module communications link 555. The source module communications link 555 may be any appropriate communication link, such as a wired connection. If no miswire is detected by the SWI component 335, then the SWI relay driver 540 may be used to close the SWI relay 545 and allow electrical power to flow from the line side input 305 to the source module 110. The SWI component 335 may perform tests on the line side of the flat wire system 101 during a short time interval after power is applied to the line side power source 115. For example, the SWI component 335 may perform the tests on the line side of the flat wire system 101 in no more than approximately 500 milliseconds from the point in time at which power is applied to the line side power source 115. Additionally, a SWI component flag or state may be set in the ASD 100 to indicate that no miswires were detected by the SWI component 335. The SWI component flag may be, for example, stored in the memory 405 of the control unit 312 and/or in one or more other memories associated with the control unit 312 and/or the SWI component 335. The SWI component flag or state may be used by the ASD 100 in conjunction with the results of other tests performed by the ASD 100 in order to determine whether or not the relay 310 of the ASD 100 may be closed. It will be appreciated that other data associated with the SWI component 335 and/or the measurements taken in accordance with the operation of the SWI component 335 may be stored in one or more appropriate memories, for example, the memory 405 of the control unit 312.

Although the SWI component 335 is described above as leaking a current signal from the electrifiable conductor 505 of the line side power source 115 and then testing the line side for current signals, it will be appreciated that other types of signals, such as a voltage signal may be leaked from the line side power source 115. Additionally, if a voltage signal is leaked from the line side power source 115, then the SWI component 335 may detect voltage signals on the line side in order to identify or locate line side miswires.

With continued reference to FIG. 5, the SWI component 335 may include at least one fuse 560 that is operable to act as a fail safe if too much current flows into the ASD 100 from the line side power source 115. Although the fuse 560 is illustrated in FIG. 5 as being a part of the SWI component 335, it will be appreciated that a fuse may alternatively or additionally be included in other components of the ASD 100. Additionally, it will be understood that many different types of fuses may be utilized by the ASD 100, such as a standard 50 amp fuse. If a 50 amp fuse is utilized, the fuse 560 may be blown if a current of approximately 50 amps or more flows into the ASD 100 from the line side power source 115. Once the fuse 560 has been blown, an electrical power signal may no longer be permitted to flow into the ASD 100 from the line side power source 115.

Figure 6:
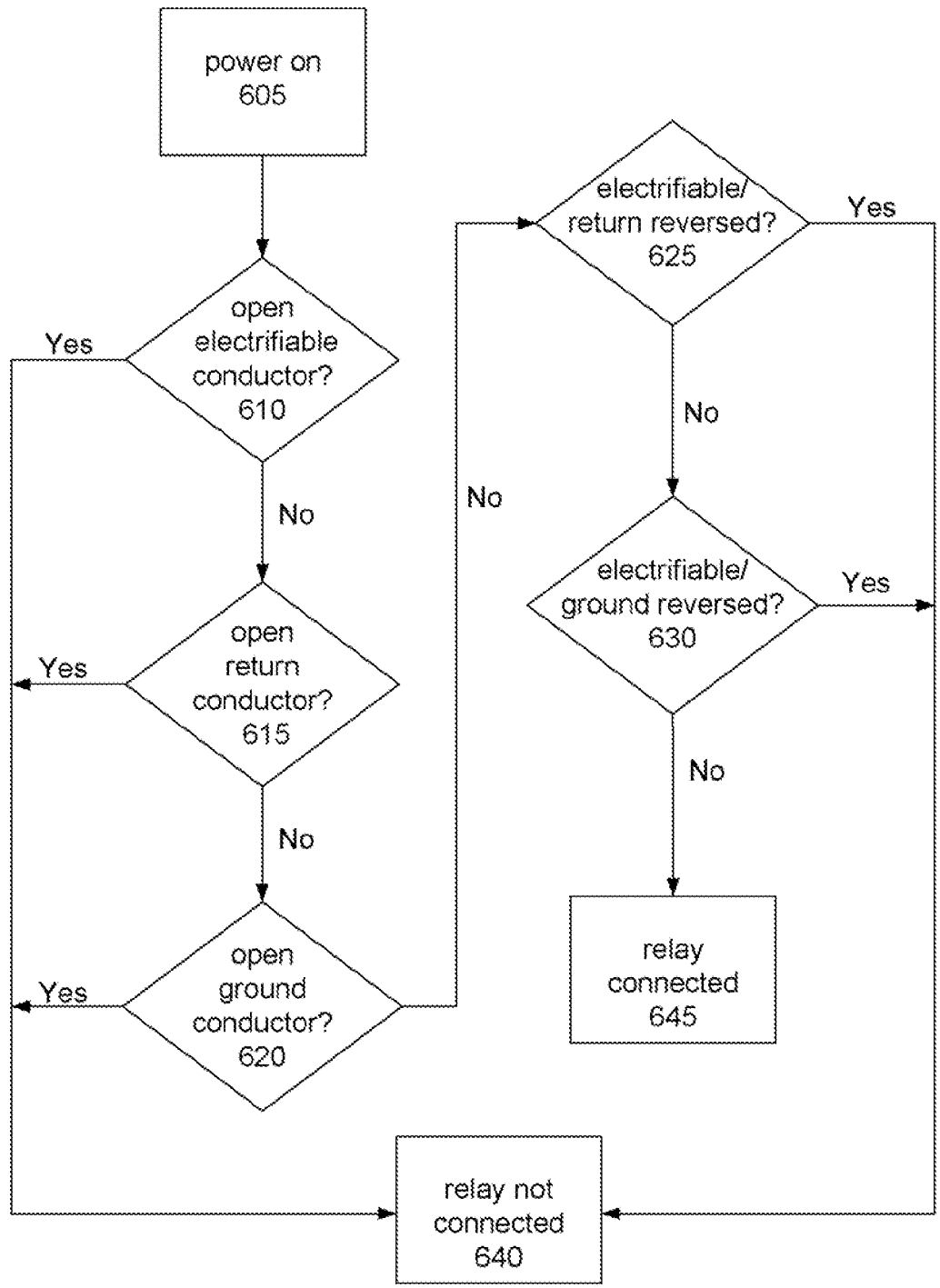
FIG. 6 is an example flowchart of the operation of a line side wire integrity component that may be incorporated into an ASD according to an embodiment of the invention.

FIG. 6 is an example flowchart of the operation of the SWI component 335, according to an illustrative embodiment of one aspect of the invention. If power is applied to the SWI component 335 at block 605, then the SWI component 335 may check a line side power source 115 connected to the line side input 305 for a line side miswire. For example, at block 610, the SWI component 335 may check the line side power source 115 for an open electrifiable (or hot) conductor 505. If an open electrifiable conductor 505 is detected, then the SWI component 335 may go to block 640 and prevent the electrification of the flat wire 105 by preventing the relay 310 of the ASD 100 from being closed. If an open line side power source electrifiable conductor 505 is not detected at block 610, then the SWI component 335 may go to block 615 and check the line side power source 115 for an open return (or neutral) conductor 510. If an open line side power source return conductor 510 is detected at block 615, then the SWI component 335 may go to block 640 and prevent the relay 310 of the ASD 100 from being closed. If no open line side power source return conductor 510 is detected at block 615, then the SWI component 335 may go to block 620 and check the line side power source 115 for an open grounding conductor 515. If an open line side power source grounding conductor 515 is detected at block 620, then the SWI component 335 may go to block 640 and prevent the relay 310 of the ASD 100 from being closed. If no open line side power source grounding conductor 515 is detected at block 620, then the SWI component 335 may go to block 625. At block 625, the SWI component 335 may check the line side power source 115 for a reversed electrifiable conductor 505 and return conductor 510. If the line side power source electrifiable conductor 505 has been reversed with the line side power source return conductor 510 at the line side input 305, then the SWI component 335 may go to block 640 and prevent the relay 310 of the ASD 100 from being closed. If, however, no reversed line side power source electrifiable conductor 505 and return conductor 510 is detected at block 625, then the SWI component 335 may go to block 630. At block 630, the SWI component 335 may check the line side power source 115 for a reversed electrifiable conductor 505 and grounding conductor 515. If the electrifiable conductor 505 has been reversed with the grounding conductor 515 at the line side input 305, then the SWI component 335 may go to block 640 and prevent the relay 310 of the ASD 100 from being closed. If, however, no line side power source reversed electrifiable conductor 505 and grounding conductor 515 is detected at block 630, then the SWI component 335 may go to block 645 and allow the relay 310 of the SWI component 335 to be closed.

It will be understood by those of skill in the art that the tests performed by the SWI component 335 do not necessarily have to be performed in the order set forth in the logic of FIG. 5, but instead may be performed in any suitable order. It also will be understood that the SWI component 335 does not have to conduct each test set forth in FIG. 5, but instead may conduct less than all of the tests set forth in FIG. 5. If any test results in the execution of block 540, then the SWI component 335 may still perform the remaining tests and may record the outcome of each test, or at least the ones that result in a positive miswire indication. Additionally, if a miswire is detected by the SWI component 335, an indicator may be stored by the SWI component 335 or by the control unit 312, and the indicator may include information as to which test(s) resulted in the detection of a miswire. This indicator may also be communicated by the ASD 100 to another device such as a second ASD 100, a central monitoring device, or a computer. The SWI component 335 and/or the control unit 312 may also be associated with one or more memory devices, for example, the memory 405 of the control unit 312, that are operable to store a variety of indicators and/or measurements data associated with the operation of the SWI component 335.

According to another aspect of the invention, the ASD 100 may include a load side or destination integrity (or load side miswire or short/fault detection) component 340, which will be referred to herein as a destination wire integrity (DWI) component 340. The DWI component 340 may be a proactive safety device capable of detecting faults or defects in the flat wire 105 or miswires on the load side prior to the full power electrification of the flat wire 105. For purposes of this disclosure, the term load side may be utilized to refer to a flat wire 105 or other wire connected between the ASD 100 and a downstream destination device 117 and/or a downstream ASD 100. Before the relay 310 of the ASD 100 is closed, thereby allowing the flat wire 105 to be electrified, the DWI component 340 may test the flat wire 105 on the load side and determine whether the flat wire 105 is free of faults, defects, and/or miswires. The DWI component 340 may test the flat wire 105 by applying either a voltage or a current test signal to one or more of the conductors of the flat wire 105 and measuring a response on the other conductors of the flat wire 105, as explained in greater detail below. The DWI component 340 may use one or both of a voltage-based test system and a current-based test system to check the flat wire 105 for miswires and wire faults, as described in greater detail below.

According to one aspect of the invention, the DWI component 340 may detect load side miswiring of the flat wire 105. A load side miswire may include an open conductor of the flat wire 105, which may occur when a conductor of the flat wire 105 is not connected to the destination module 120 or the source module 110. In addition, a load side miswire may include conductors of the flat wire 105 that are improperly connected to the destination module 120, such as two conductors that are reversed in their connection to the destination module 120. For example, the DWI component 340 may detect a situation in which the electrifiable conductor 205 and one of the return conductors 210 have been switched when connected to the destination module 120. If the DWI component 340 detects a miswire on the load side, then the relay 310 is maintained in its open position to prevent electrification of the flat wire 105.

According to another aspect of the invention, the ASD 100 may detect potentially hazardous conditions that may exist in association with a flat wire 105. One hazardous situation of particular importance is the penetration of a flat wire 105 that can lead to an inter-layer short in the flat wire 105. An inter-layer short occurs when a conductor in the flat wire 105 is placed in contact with one or more other conductors in the flat wire 105. Inter-layer shorts typically occur when an object, and particularly a metal object, penetrates the flat wire 105. Various types of penetrations of the flat wire 105 have been considered and analyzed. With respect to a flat wire 105 installed on a surface such as a wall or ceiling, typical penetration may be caused by nails, screws, push-pins, thumbtacks, staples, knife cuts, or saw cuts. Each type of penetration offers a different challenge to overcome fire and shock hazards. Penetrations may occur while the flat wire 105 is electrified or prior to its electrification. Penetrating objects may or may not be present during the initial electrification of a flat wire 105. In addition to inter-layer shorts, penetrations of the flat wire may lead to arc flashes or other arcing conditions which may be detected by the AMC safety component of the ASD 100.

Low impedance inter-layer shorts are typically needed in order to cause a primary safety device such as a circuit breaker to trip. These more desirable low impedance shorts, sometimes referred to as dead or good shorts, typically occur during the penetration of a flat wire 105 or after the penetration of a flat wire 105 when the penetrating object is still embedded in the flat wire 105. Once the penetrating object is removed from the flat wire 105, there may no longer be a penetrating metal object to provide a parallel path through which current can flow, thereby removing the good inter-layer short. Additionally, the penetrating object no longer adds a compressive force that serves to press the conductors of the flat wire 105 together. This lack of compressive force may contribute to the failure to maintain a good quality inter-layer short. After the removal of the penetrating object, therefore, the inter-layer shorts are typically not low impedance inter-layer shorts, which makes a successful trip of a primary safety device such as a circuit breaker less likely.

The DWI component 340 of the ASD 100 may aid in the detection of these inter-layer shorts, as explained in greater detail below. The DWI component 340 may be a proactive safety device capable of detecting faults or defects in a flat wire 105 prior to the full power electrification of the flat wire 105. Alternatively, as explained in greater detail below with reference to FIG. 11, the DWI component 340 may include a combination of proactive and reactive components. If a proactive device is utilized, then prior to the relay 310 being closed, the DWI component 340 checks for inter-layer shorts in the flat wire 105, which may have been caused by a penetration of the flat wire 105. The DWI component 340 may detect both low impedance inter-layer shorts (e.g., dead or good shorts) and high impedance inter-layer shorts in the flat wire 105. If an inter-layer short is detected, then the DWI component 340 or the control unit 312 may open the relay 310 and prevent electrification of the flat wire 105. In a DWI component 340 that includes both proactive and reactive components, the DWI component 340 may detect shorts and/or wire faults (and miswires) by electrifying one or more conductors of the flat wire 105 and monitoring one or more of the conductors of the flat wire 105 for a return signal.

In both a voltage-based and current-based method of testing, the DWI component 340 may apply or communicate a test signal onto one or more conductors or layers of the flat wire 105 and test for a return signal on one or more of the other conductors or layers of the flat wire 105. The two return conductors 210, 215 may form a return conductor loop and the two grounding conductors 220, 225 may form a grounding conductor loop. A loop may occur when a signal travels from the ASD 100 through the flat wire 105 via one conductor, to the destination module 120 and then back via another conductor of the flat wire 105 to the ASD 100. For example, a signal may travel through the flat wire 105 via a first return conductor 210, through the destination module 120, and back through the flat wire 105 via the second return conductor 215. The DWI component 340 may test the return conductor loop and the grounding conductor loop with independent test signals. Alternatively, the DWI component 340 may test the return conductor loop and the grounding conductor loop with a single test signal. If a single test signal is used to test the return and grounding conductor loops, alternating periods of the test signal may be used to test the return and grounding conductor loops independently. Additionally, if both the return and grounding conductor loops are determined to be properly terminated by the DWI component 340, the DWI component 340 may presume that the electrifiable conductor 205 of the flat wire 105 is properly terminated at the destination module 120. Alternatively, the DWI component 340 may perform additional tests on the electrifiable conductor 205 in order to determine whether or not the electrifiable conductor 205 is terminated properly. For example, the DWI component 340 may test the electrifiable conductor 205 to determine whether or not the electrifiable conductor 205 is shorted to one or more of the return conductors 210, 215 or the grounding conductors 220, 225.

Figure 7:
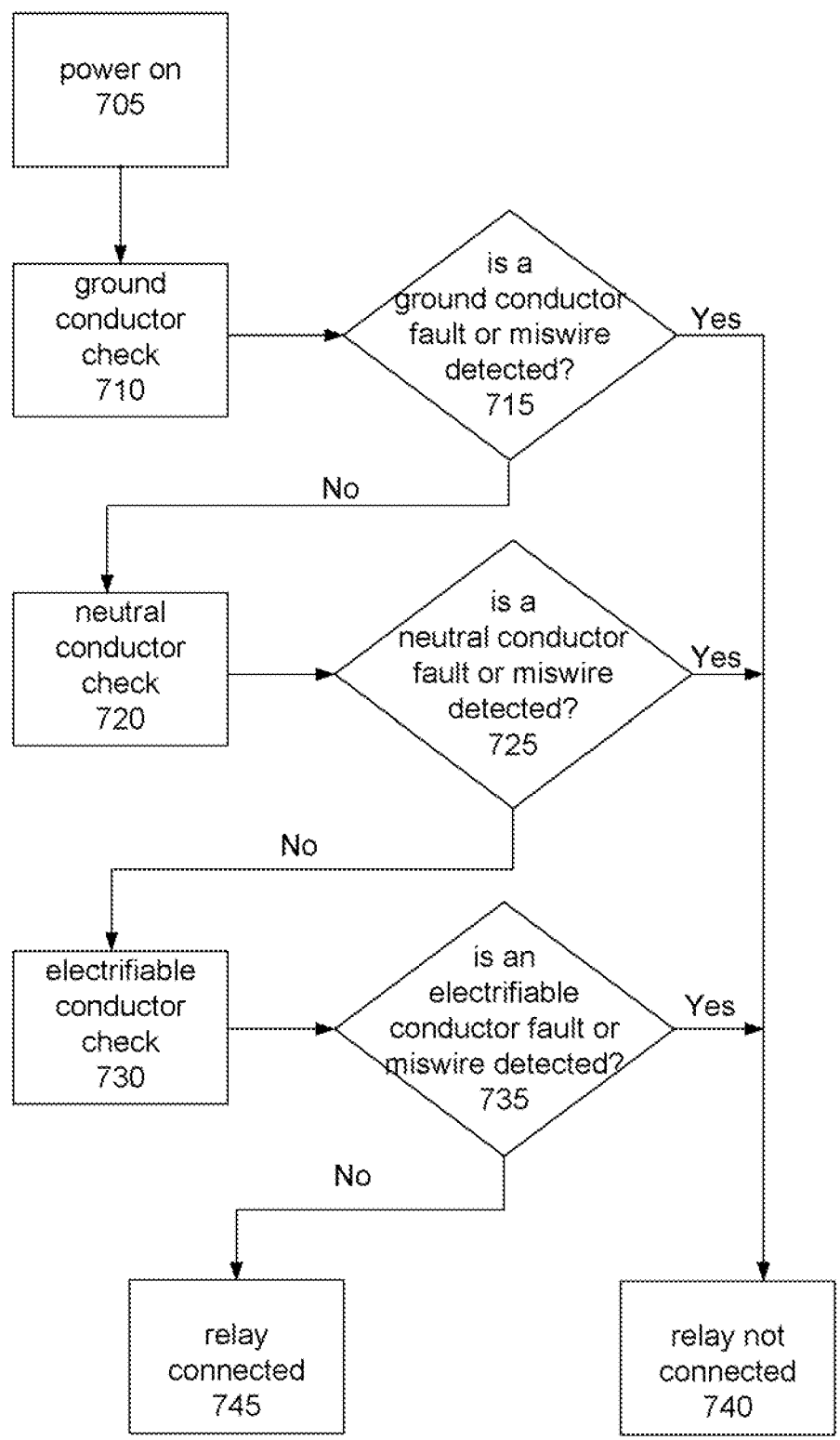
FIG. 7 is an example flowchart of the general operation of a load side wire integrity component, according to an illustrative embodiment of the invention.

FIG. 7 is an example flowchart of the general operation of a DWI component 340, according to an illustrative embodiment of the invention. The methodology of FIG. 7 may be implemented by the DWI component 340 for either a voltage-based test system or a current-based test system. If power is applied to the DWI component 340 at block 705, then the DWI component 340 may go to block 710. At block 710, the DWI component 340 may test the grounding conductor loop of the flat wire 105. The DWI component 340 may determine whether or not the grounding conductor loop has been terminated properly and whether or not there is a fault in the grounding conductors 220, 225 at block 715. If the grounding conductor loop is determined not to be properly terminated or a fault is found in one of the grounding conductors 220, 225, then, the DWI component 340 may go to block 740 and prevent the relay 310 from being closed to prevent electrification of the flat wire 105. If, however, the grounding conductor loop is determined to be properly terminated and no faults are found in the grounding conductors 220, 225 at block 715, then the DWI component 340 may go to block 720. At block 720, the DWI component 340 may test the return conductor loop of the flat wire 105. The DWI component 340 may determine whether or not the return conductor loop has been terminated properly and whether or not there is a fault in the return conductors 210, 215 at block 725. If the return conductor loop is determined not to be properly terminated or a fault is detected in one of the return conductors 210, 215, then the DWI component 340 may go to block 740 and prevent the relay 310 from being closed to prevent electrification of the flat wire 105. If, however, the return conductor loop is determined to be properly terminated and no wire faults are found in the return conductors 210, 215 at block 725, then the DWI component 340 may go to block 730. At block 730, the DWI component 340 may test the electrifiable conductor 205 in order to determine whether or not it is properly terminated and whether or not there are any wire faults in the electrifiable conductor 205. If, at block 735, it is determined that the electrifiable conductor 205 is not properly terminated or a wire fault is detected on the electrifiable conductor 205, then the DWI component 340 may go to block 740 and prevent the relay 310 from being closed. If, however, the electrifiable conductor 205 is determined to be properly terminated and no wire faults are detected on the electrifiable conductor 205 at block 735, then the DWI component 340 may go to block 745 and allow the relay 310 to be closed. Alternatively, a DWI component flag may be set and stored by the control unit 312, and the flag may be used by the ASD 100 in conjunction with other tests to determine whether or not the relay 310 may be closed.

It also will be understood by those of skill in the art that the tests performed by the DWI component 340 do not necessarily have to be performed in the order set forth in the logic of FIG. 7, but instead may be performed in any suitable order. As previously mentioned, some of the tests set forth in FIG. 7 may be performed in parallel with one another. It also will be understood that the DWI component 340 does not have to conduct each test set forth in FIG. 7, but instead may conduct less than all of the tests set forth in FIG. 7. If any test results in the execution of block 740, then the DWI component 340 may still perform the remaining tests and may record the outcome of each test, or at least the ones that result in a positive miswire indication. Additionally, if a miswire is detected by the DWI component 340, an indicator may be stored by the DWI component 340 or by the control unit 312, and the indicator may include information as to which test(s) resulted in the detection of a miswire. This indicator may then be transmitted by the ASD 100 to another device such as a second ASD 100, a central monitoring device, or a computer. The DWI component 340 and/or the control unit 312 may be associated with one or more memory devices, for example, the memory 405 of the control unit 312, operable to store a variety of indicators and/or measurements data associated with the operation of the DWI component 340.

Figure 8:
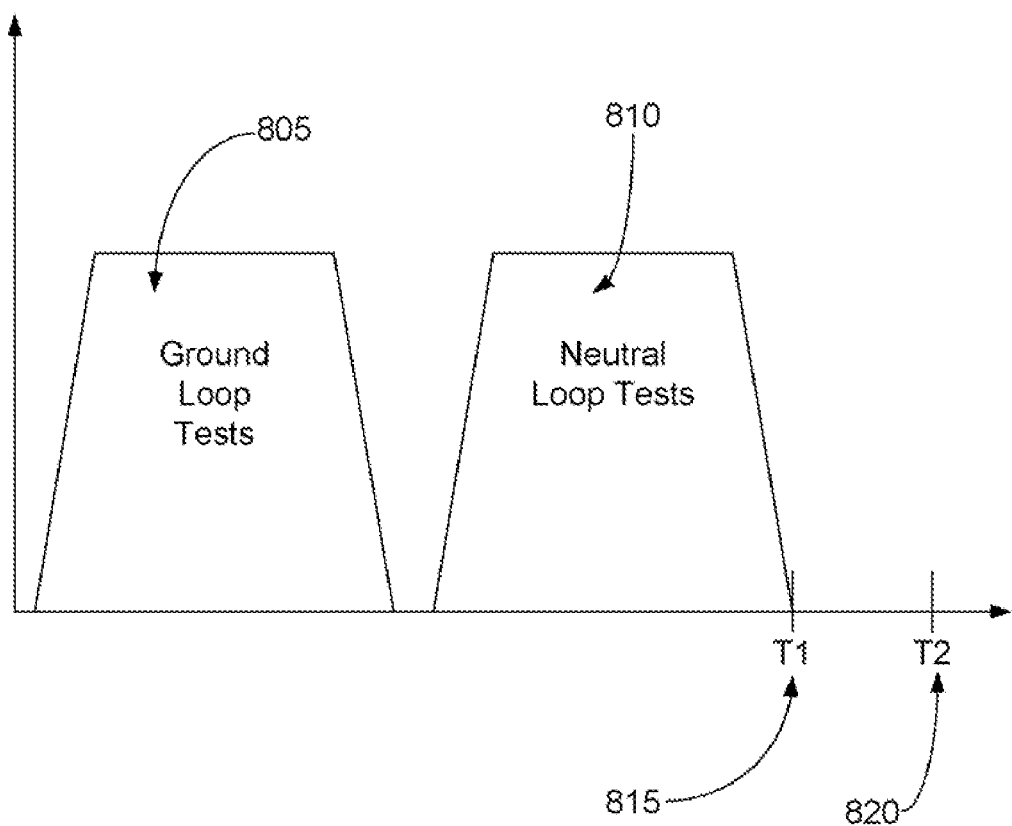
FIG. 8 is an example timing diagram of voltage or current based test signals that may be applied by a load side wire integrity component, according to an illustrative embodiment of the invention.

FIG. 8 is a timing diagram of test signals that may be applied by a DWI component 340, according to an illustrative embodiment of one aspect of the invention. As mentioned earlier, the return conductor loop and grounding conductor loop may be tested at alternating periods 805 and 810 of the test signal in order to isolate the loop that is being tested. According to an aspect of the invention, the signal used to drive the return and grounding conductor loops may be any signal with an alternating period, such as a 2400 Hertz (Hz) square wave signal. The signal may be generated by a microcontroller, clocking circuit, or other signal generation device and communicated onto the two loops of the flat wire 105, as explained in greater detail below. The signal may be passed through a low pass filter before being communicated onto one or more of the conductors of the flat wire 105 to remove any unwanted noise and/or harmonics. Tests on both the return conductor loop and ground conductor loop may be performed with the same test signal and, if it is determined that both loops are properly terminated and no faults are detected on the flat wire 105, then the relay 310 of the ASD 100 may be closed in order to allow the flat wire 105 to be electrified. In addition, a flag or state may be set in the ASD 100 to indicate whether the conductor loops are terminated properly. A conductor loops termination flag may be used in conjunction with the results of other tests performed by the ASD 100 in order to determine whether or not the relay 310 of the ASD 100 may be closed. The tests on both loops may be conducted by the DWI component 340 within a first time of approximately 300 milliseconds or less 815 and then the decision of whether or not to close the relay 310 may be made by a second time 820. The second time 820 may be less than approximately 375 milliseconds. It will be appreciated that the timing set forth in FIG. 8 is merely an example timing and that a variety of timing goals or benchmarks may be utilized in accordance with embodiments of the invention.

According to some embodiments of the invention, the flat wire 105 may be tested by the DWI component 340 by electrifying one or more conductors of the flat wire 105 and testing one or more of the conductors of the flat wire 105 for a return signal. For example, as explained in greater detail below with reference to FIG. 11, one or more of the return conductors 210, 215 may be electrified and one or more of the conductors of the flat wire 105 may be monitored or tested for a return signal. Miswires and/or wire faults may be identified based at least in part on one or more return signals. It will be appreciated that a similar method may be conducted by electrifying one or more of the grounding conductors 220, 225 and testing one or more of the conductors of the flat wire 105 for a return signal. It will be appreciated that the one or more conductors that are electrified for testing may be electrified for any period of time in order to conduct the testing.

As another example, the electrifiable conductor 205 of the flat wire 105 may be electrified for a predetermined period of time, and one or more conductors of the flat wire 105 may be monitored for miswire and/or wire faults. For example, the relay 310 may be closed at one zero crossing and then opened at the next zero crossing, thereby permitting one half cycle of an electrical power signal from the line side power source 115 to be communicated onto the flat wire 105. One or more conductors of the flat wire 105 may then be monitored for return signals that indicate the presence of miswires and/or wire faults. For example, if a return signal is detected on one or more of the grounding conductors 220, 225, a miswire or inter-layer short may be present on the flat wire 105. If a miswire or inter-layer short is identified, then the DWI component 340 and/or the control unit 312 may prevent the further electrification of the flat wire 105 by maintaining the relay 310 in its opened position. It will be appreciated that the testing described above may be conducted at any time by the DWI component 340, such as during the initial electrification of the flat wire 105 following installation or a reset condition of the ASD 100. It will further be appreciated that the predetermined period of time that the flat wire 105 is electrified for testing may be virtually any predetermined period of time and that a half cycle of an electrical power signal is merely discussed as an example period of time.

Additionally, the tests performed by the DWI component 340 may be contained between the source module 110 and the destination module 120 of the flat wire system 101. Accordingly, a current or voltage is not allowed to pass either to the line side source 115 or to the load side destination 125.

The DWI component 340 may use a voltage-based method to test the flat wire 105 for miswires and wire faults on the load side. The voltage-based method directly applies a voltage test signal to selected conductors or layers (stimulated layers) of the flat wire 105 while measuring voltages on the remaining conductors or layers (non-stimulated layers). Flat wire faults, or unwanted conductance between the conductors in the form of low or high impedance shorts, may be identified by detecting unexpected voltage present on the non-stimulated conductors or layers.

Figure 9A:
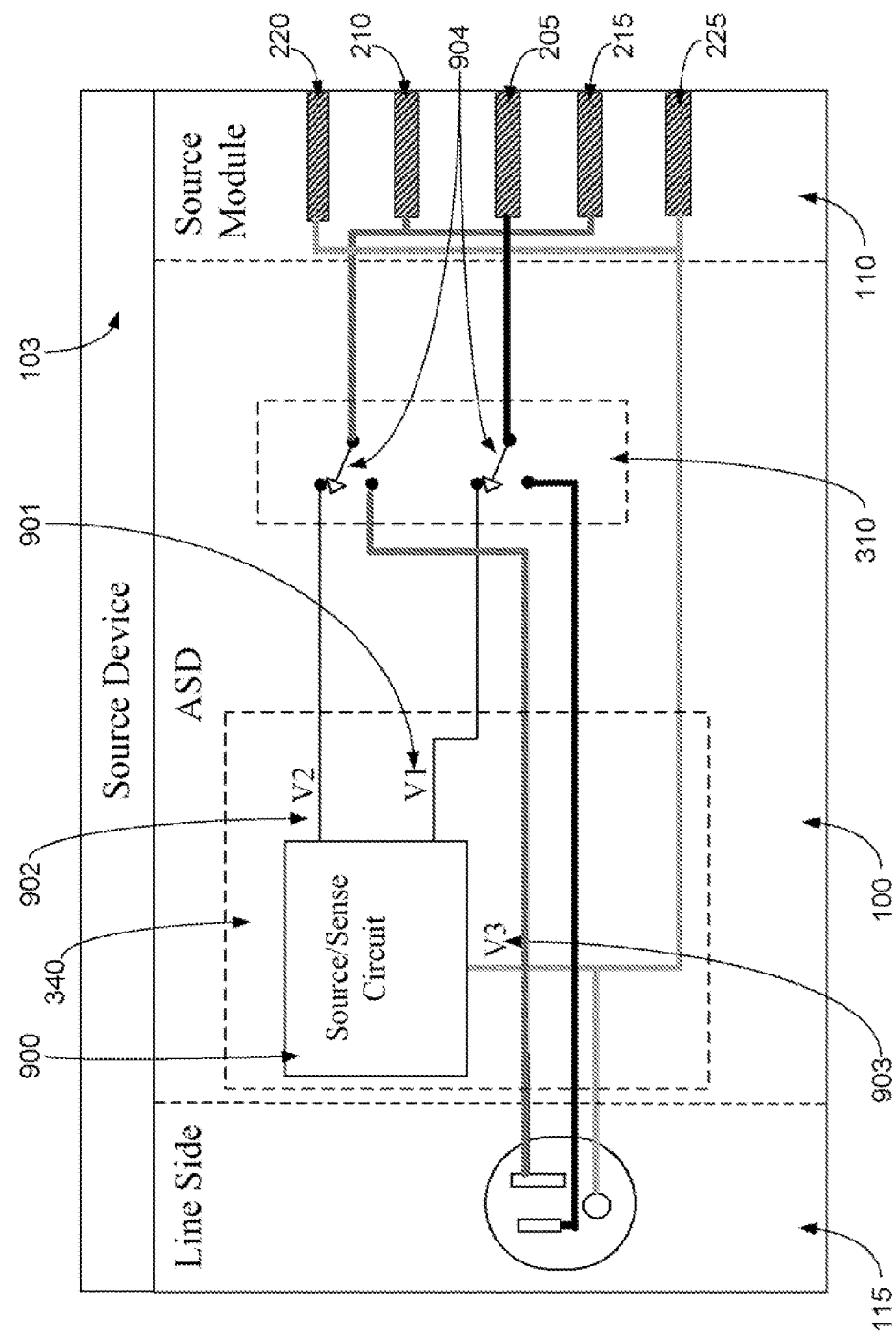
FIG. 9A is a schematic diagram of a voltage-based load side wire integrity component that may be incorporated into an ASD, according to an embodiment of the invention.

FIG. 9A is a schematic diagram of a voltage-based DWI component 340 that may be incorporated into an ASD 100 according to one aspect of the invention. As a preliminary matter, it may be noted that FIG. 9A depicts a different source device 103 than that shown in FIG. 3. In FIG. 9A, the line side power source 115 is incorporated into the source device 103. Such a situation might occur, for example, if the source device 103 includes a standard electrical plug that may be plugged into an electrical outlet.

As shown in FIG. 9A, The voltage-based DWI component 340 may include a source/sense circuit 900, an electrifiable (or hot) conductor connection 901, a return conductor connection 902, a grounding conductor connection 903, and one or more test signal relays 904. The source/sense circuit 900 may be configured to transmit a voltage test signal onto one of the conductors of the flat wire 105 and then monitor the conductors of the flat wire 105 for a return voltage. It will be understood that the source/sense circuit 900 may test more than one conductor of the flat wire 105 simultaneously be using alternating periods of the same test signal, as explained in greater detail above with reference to FIG. 8. The source/sense circuit 900 may transmit a voltage test signal onto the electrifiable conductor 205 and/or monitor the electrifiable conductor 205 via the electrifiable conductor connection 901. Similarly, the source/sense circuit 900 may transmit a voltage test signal onto one or more of the return conductors 210, 215 and/or monitor one or more of the return conductors 210, 215 via the return conductor connection 902. Additionally, the source/sense circuit 900 may transmit a voltage test signal onto one or more of the grounding conductors 220, 225 and/or monitor one or more of the return conductors 220, 225 via the grounding conductor connection 902.

The voltage-based test signal transmitted by the source/sense circuit 900 may be a low voltage signal. The voltage-based test signal may be, for example, at a voltage of approximately 5 volts or at a voltage of approximately 12 volts, although it will be understood that other voltage levels may be used for the test signal. As a safety precaution, the maximum amplitude of the voltage-based test signal may be limited to approximately 30 volts, although it will be understood that a test signal with an amplitude of greater than 30 volts may be used in conjunction with embodiments of the invention. Additionally, the voltage-based test signal may be derived from the signal coming into the ASD 100 from the line side power source 115. The source/sense circuit 900 may receive a voltage signal from the line side power source 115 and step that signal down to a low voltage signal that may be used or modified to perform tests on the flat wire 105. For example, the source/sense circuit 900 may receive a voltage signal of approximately 110-130 V or approximately 220-250 V and step that voltage signal down to a low voltage signal for testing the flat wire 105. The voltage may be stepped down using a step down transformer, capacitor, or any other suitable device for decreasing the amplitude of a voltage signal, as will be understood by those of skill in the art. It will also be understood that the source/sense circuit 900 may constitute an isolated power source when applying a test signal to the flat wire 105.

A voltage test relay 904 may be used by the DWI component 340 to ensure that the flat wire cannot be fully electrified while it is being tested by the DWI component 340. As shown in FIG. 9A, the voltage test relay 904 may be a double-pole single throw relay, although it will be understood that other types of relays or combinations of relays may be used in accordance with embodiments of the invention. If the voltage test relay 904 is in a closed position, then electrical power may be allowed to flow from the line side power source 115 through the ASD 100 and onto the flat wire 105. If, however, the voltage test relay 904 is in a test position (or opened position), then electrical power will not be permitted to flow from the line side power source 115 through the ASD 100 and onto the flat wire 105. Instead, the voltage-based test signal will be allowed to flow from the source/sense circuit 900 onto the flat wire 105. It will be understood by those of skill in the art that the voltage test relay 904 may be the same circuit as that used for the main or common relay 310, as shown in FIG. 9A. Alternatively, the voltage test relay 904 may be one or more separate relays used in conjunction with the DWI component 340.

When the voltage test relay 904 is maintained in a test position, the source/sense circuit 900 may transmit or communicate a voltage-based test signal onto one or more of the conductors of the flat wire 105 while monitoring the conductors of the flat wire 105 for a return voltage. For example, the source/sense circuit 900 may communicate a voltage-based test signal onto the electrifiable conductor 205 of the flat wire 105 via the electrifiable conductor connection 901. The source/sense circuit 900 may then monitor the conductors of the flat wire 105 for a voltage signal to determine whether there are any inter-layer or termination shorts or faults present on the flat wire 105. If a voltage signal is detected by either the return conductor connection 902 or the grounding conductor connection 903, the source/sense circuit 900 (or the control unit 312 in communication with the source/sense circuit 900) may determine that an inter-layer or termination short is present on the flat wire 105 between the electrifiable conductor 205 and one of the other conductors of the flat wire 105. Similarly, the source/sense circuit 900 may communicate a voltage-based test signal onto the return conductors 210, 215 of the flat wire 105 via the return conductor connection 902 and then monitor the conductors of the flat wire 105 for a voltage signal to determine whether there are any inter-layer or termination shorts between one or more of the return conductors 210, 215 and one or more of the other conductors of the flat wire 105. If a voltage signal is detected by either the electrifiable conductor connection 901 or the grounding conductor connection 903, it may be determined that an inter-layer or termination short is present on the flat wire 105. The same method may be used to test the grounding conductors 220, 225 of the flat wire 105. The source/sense circuit 900 may communicate a voltage-based test signal onto the grounding conductors 220, 225 of the flat wire 105 via the grounding conductor connection 903 and then monitor the conductors of the flat wire 105 for a voltage signal to determine whether there are any inter-layer or termination shorts between one or more of the grounding conductors 220, 225 and one or more of the other conductors of the flat wire 105. If a voltage signal is detected by either the electrifiable conductor connection 901 or the return conductor connection 902, it may be determined that an inter-layer or termination short is present on the flat wire 105.

As shown in FIG. 9A, a test signal may be applied to either both return conductors 210, 215 or both grounding conductors 220, 225 at the same time by the source/sense circuit 900. It will, however, be understood by those of skill in the art that a test signal may be individually applied to a single conductor of the flat wire 105. For example, two return conductor connections may be included to individually apply a test signal to and monitor each of the return conductors 210, 225 of the flat wire. When determining whether or not inter-layer shorts are present on the flat wire 105, it is not necessary to individually test and monitor each of the return conductors 210, 215 or each of the grounding conductors 220, 225 of the flat wire because a voltage-based test signal applied to one conductor in a loop will be transmitted through the destination module 120 and back to the DWI component 340 in the source device 103 via the associated other conductor in the loop. On the load side, the return signal may be transmitted through only the destination module 120 or, alternatively, the return signal may be transmitted through both the destination module 120 and any load side destination 125 connected to the flat wire system 101.

Limits may be placed on the detectable inter-layer impedance range between two conductors of the flat wire 105. The detectable inter-layer impedance range between the return conductors 210, 215 and electrifiable conductor 205 may be limited by the possible presence of real loads connected on the load side 125 of the flat wire 105. An example of such a load would be a hair dryer plugged into an electrical outlet. Real loads connected on the load side 125 may create an impedance on the flat wire 105 as low as 8-10 ohms: therefore, an inter-layer impedance check between the electrifiable 205 and return conductors 210, 215 may be limited at lower than 8-10 ohms or at approximately less than 1 ohm. For example, if a high impedance inter-layer short is 190 ohms and the real load is 10 ohms, the resulting or combined impedance is 9.5 ohms [(190×10)/(190+10)], thus the high impedance interlayer short may be virtually undetectable. This is referred to as the real load effect. To avoid the real load effect, a destination relay (not shown) may be placed in the destination module 120. The destination relay may be timed to delay a connection to the real load on a power up sequence while the DWI component 340 performs its tests, thereby eliminating the 8-10 ohm limitation.

Regarding the detectable inter-layer impedance range between return conductors 210, 215 and grounding conductors 220, 225, the DWI component 340 may accurately detect an inter-layer impedance as high as approximately 5000 ohms prior to the full electrification of the flat wire 105.

The DWI component 340 may limit or eliminate the detection of false alarms by performing pre-testing on the flat wire 105 prior to testing the flat wire 105 for inter-layer shorts. The DWI component 340 may also limit or eliminate the detection of false alarms by performing post-testing on the flat wire 105 after testing the flat wire 105 for inter-layer shorts. For pre-testing the flat wire 105, the source/sense circuit 900 may monitor the conductors of the flat wire 105 for a voltage signal prior to transmitting a voltage-based test signal onto the flat wire 105. If a voltage signal is detected on one of the conductors of the flat wire 105 prior to applying a test signal to the flat wire 105, then the source/sense circuit 900 may wait for the flat wire 105 to de-energize before applying a test signal to the flat wire 105. For post-testing of the flat wire 105, after the flat wire 105 has been tested with voltage-based test signals, the source/sense circuit 900 may continue to monitor the conductors of the flat wire 105 for a voltage signal. Further voltage-based testing of the flat wire 105 using test signals may not be permitted as long as there is a voltage signal detected on one of the conductors of the flat wire 105.

It will be understood by those of ordinary skill in the art that the voltage-based method of testing the load side of a flat wire 105 for miswires and wire faults may be implemented by devices other than the DWI component 340 of an ASD 100. For example, the voltage-based method may be particularly useful in a general purpose portable flat wire test system, such as a portable handheld flat wire testing device.

According to another aspect of the invention, the DWI component 340 may utilize one or more current-based methods to identify or locate line side faults or miswires of a flat wire 105 connected to an ASD 100. Before the relay 310 of the ASD 100 is closed, thereby allowing the flat wire 105 to be electrified, the DWI component 340 may use a current-based method to test the flat wire 105 on the load side and determine whether the flat wire 105 has been connected or wired properly. Determining whether the flat wire 105 is connected properly prior to the full electrification of the flat wire 105 may help prevent electrocution, other bodily harm, or property damage caused by a miswire. By using a current-based method of the DWI component 340, the DWI component 340 and/or the control unit 312 may determine whether a flat wire 105 has been installed correctly before the flat wire 105 is ever electrified. The DWI component 340 and/or the control unit 312 may also determine whether any faults exist in the flat wire 105 before the flat wire 105 is electrified.

Figure 9B:
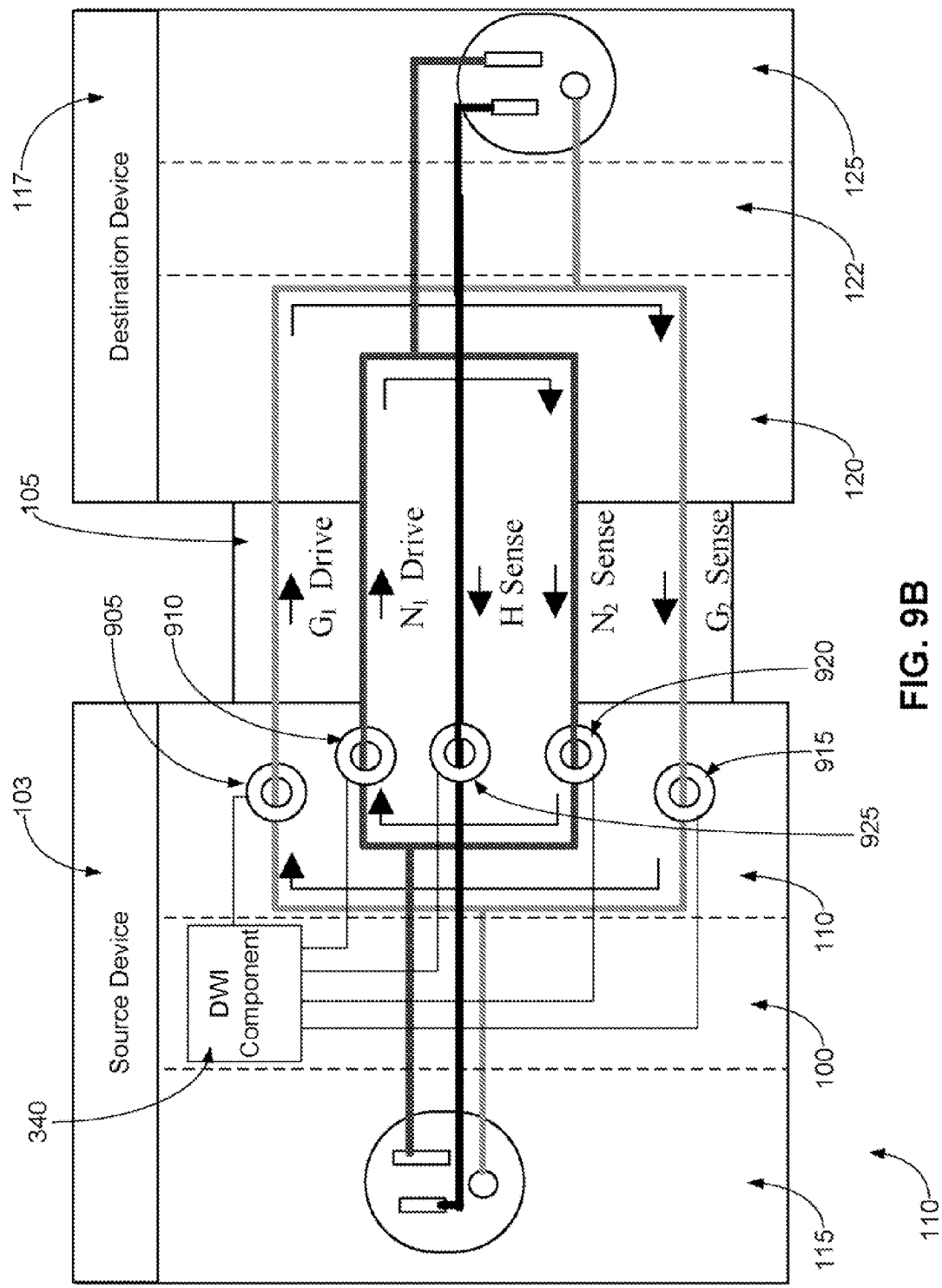
FIG. 9B is a schematic diagram of a current-based load side wire integrity component that may be incorporated into an ASD, according to an embodiment of the invention.

FIG. 9B is a schematic diagram of a current-based DWI component 340 that may be incorporated into an ASD 100 according to an illustrative embodiment of the invention. As a preliminary matter, it may be noted that FIG. 9B depicts a different source device 103 and destination device 117 than that shown in FIG. 3. In FIG. 9B, the line side power source 115 is incorporated into the source device 103 and the load side destination 125 is incorporated into the destination device 117. Such a situation might occur, for example, if the source device 103 included a standard electrical plug that may be plugged into an electrical outlet and if the destination device 117 included one or electrical outlets.

As shown in FIG. 9B, the DWI component 340 may be in communication with one or more excitation or drive circuits 905, 910 and one or more sense circuits 915, 920, 925 that are used to detect miswires and/or wire faults in the flat wire 105. The excitation circuits 905, 910 and the sense circuits 915, 920, 925 may be included in or controlled by the DWI component. Alternatively, the excitation circuits 905, 910 and the sense circuits 915, 920, 925 may be included in the flat wire I/O interface 311, and the DWI component 340 may be in communication with the flat wire I/O interface 311 and the excitation circuits 905, 910 and sense circuits 915, 920, 925. The DWI component 340 may determine whether a flat wire 105 connected to the ASD 100 has been properly terminated prior to the electrification of the flat wire 100. The DWI component 340 depicted in FIG. 9B is designed to be used in conjunction with an electrical flat wire including an electrifiable conductor 205 and two return conductors 210, 215 formed on opposing sides of the electrifiable conductor 205. The electrical flat wire may further include two grounding conductors 220, 225 formed on opposing sides of the combined electrifiable conductor 205 and return conductors 220, 225. It will, however, be understood by those of ordinary skill in the art that a DWI component 340 according to the invention may be used in conjunction with any flat wire (and/or any conventional wire), regardless of the number and type of conductors contained in that flat wire.

Referring to FIG. 9B, the DWI component 340 may test the flat wire 105 for miswires by transmitting a current-based signal over one conductor of the flat wire 105 and testing one or more of the other conductors of the flat wire 105 for a return signal. For example, the associated conductor of the loop may be tested for a current indicating that the flat wire 100 is wired correctly. For instance, the DWI component 340 may transmit a current-based signal over a first grounding conductor 220 and then monitor a second grounding conductor 225 for a current indicating that the grounding conductors 220, 225 are wired correctly. Alternatively, the DWI component 340 may transmit a current-based signal over a first return conductor 210 and then monitor a second return conductor 215 for a current indicating that the return conductors 210, 215 are wired correctly. If the grounding conductors 220, 225 and return conductors 210, 215 are wired correctly, then the DWI component 340 may presume that the electrifiable conductor 205 of the flat wire 105 is wired correctly. Alternatively, the DWI component 340 may perform additional tests to verify that the flat wire 105 is terminated properly, as discussed in greater detail below with reference to FIG. 13. The current that is tested for may be a predetermined threshold current, which may be, for example, 10 milliamps. If the current detected on the associated conductor of a flat wire loop is less than 10 milliamps, the loop may not be wired or terminated correctly at the destination module 120.

A method and circuit for determining whether the grounding conductors 220, 225 of a flat wire 105 have been wired correctly will now be described in greater detail. It will be understood that the same or a similar method may be used to determine whether the return conductors 210, 215 have been wired correctly. In order to test for correct wiring, a ground excitation circuit 905 under control of the DWI component 340 (and/or the control unit 312) may transmit a current signal over a first grounding conductor 220. The ground excitation circuit 905 may be an excitation current transformer or any other suitable device capable of transmitting a signal over a first grounding conductor 220 including, but not limited to, multiplexers, isolators, and relays. In order to transmit a current signal onto the first grounding conductor 220, a test signal may be used to drive a voltage-to-current converter, which in turn forces the current through the primary windings of the current transformer in the ground excitation circuit 905. Additionally, in order to minimize the magnitude of the excitation placed on the flat wire 105, the signal transmitted by the ground excitation circuit 905 may be at a frequency much greater than 50 or 60 Hz, which is the frequency typically carried over electrical wires. According to an aspect of the invention, the frequency of the signal transmitted by the ground excitation circuit 905 may be at a frequency of approximately 1000 Hz or greater. The current-based signal communicated or transmitted onto the first grounding conductor 220 may be part of an alternating signal that is used to simultaneously test both the grounding conductor loop and the return conductor loop, as described above with reference to FIG. 8. Alternatively, the current-based signal used to test the grounding conductor loop may be a separate signal than that used to test the return conductor loop.

After a signal has been transmitted over a first grounding conductor 220, if the grounding conductors 220, 225 are properly terminated, then the signal will pass through the destination module 120 and return to the source module 110 via the second grounding conductor 225. A ground sense circuit 915 connected to the second grounding conductor 225 may be used to detect a current present on the grounding conductors 220, 225. The ground sense circuit 915 may be a sensing current transformer or it may be any other suitable device capable of sensing a current including, but not limited to, resistors, isolators, and Hall Effect devices.

The DWI component 340 may also determine whether the return conductors 210, 215 have been wired correctly on the load side. In order to test for correct wiring, a return excitation circuit 910 under control of the DWI component 340 transmits a current-based signal over a' first return conductor 210, in the same manner as the ground excitation circuit 905 transmits a signal over a first grounding conductor 220. The current-based signal communicated or transmitted onto the first grounding conductor 220 may be part of an alternating signal that is used to simultaneously test both the grounding conductor loop and the return conductor loop, as described above with reference to FIG. 8. Alternatively, the current-based signal used to test the return conductor loop may be a separate signal than that used to test the grounding conductor loop. After a signal has been transmitted over a first return conductor 210, if the return conductors 210, 215 are properly terminated, then the signal will pass through the destination module 120 and return to the source module 110 via the second return conductor 215. A return sense circuit 920 connected to the second return conductor 215 may be used to detect a current present on the return conductors 210, 215. The return sense circuit 920 may be a sensing current transformer or it may be any other suitable device capable of sensing a current including, but not limited to, resistors, isolators, and Hall Effect devices.

According to an aspect of the invention, the DWI component 340 may also determine that the flat wire 105 is not terminated properly if a current is detected on a conductor of the flat wire 105 other than the conductors being tested in any given loop. As explained in greater detail below, such a situation may also indicate a wire fault. It will be appreciated that the DWI component 340 may differentiate between a miswire and a wire fault based upon the magnitude of a current signal detected on one of the other conductors and/or based on the number of other conductors on which a current signal is detected. For example, if a test current is applied to a return conductor 210 and a current that is approximately equal to the test current is detected on the electrifiable conductor 205, then the DWI component 340 may determine that the electrifiable conductor 205 and the other return conductor 215 have been miswired. As another example, if a test current is applied to a return conductor 210 and a current signal is detected on all of the conductors of the flat wire 105 (the detected current signals may have a lower amplitude than the test current), then the DWI component 340 may determine that a wire fault exists and that the conductors of the flat wire 105 have been shorted together.

According to another aspect of the invention, the DWI component 340 may use the current-based method to determine whether there are any wire faults or inter-layer shorts present on the flat wire 105 prior to the electrification of the flat wire 105. The DWI component 340 may detect inter-layer shorts on a non-electrified flat wire 105 by transmitting a low level current through a single flat wire conductor, such as the electrifiable conductor 205, or through one set of flat wire 105 layers, such as the return conductors 210, 215. Then, the DWI component 340 may monitor one or more of the other flat wire 105 layers for a return current. For instance, a current may be transmitted on the one or more return conductors 210, 215 of the flat wire 105. The DWI component 340 may then monitor the electrifiable conductor 205 and the one or more grounding conductors 220, 225 of the flat wire 105 for a return current. As another example, a current may be transmitted on the electrifiable conductor 205 of the flat wire 105, and the DWI component 340 will monitor the one or more return conductors 210, 215 and the one or more grounding conductors 220, 225 of the flat wire 105 for a return current.

The DWI component 340 may combine testing for miswires in the flat wire 105 with testing for wire faults or inter-layer shorts on the flat wire 105. For example, with reference to FIG. 9B, when a current-based test signal is transmitted onto the first grounding conductor 220 by the ground excitation circuit 905, the sense circuits 915, 920, 925 may be used to determine whether the flat wire 105 contains any miswires or inter-layer shorts. As previously mentioned, the ground sense circuit 915 may be used to determine whether or not the grounding conductors 220, 225 have been properly terminated at the toad side. Additionally, the return sense circuit 920 and an electrifiable (or hot) sense circuit 925 may be used to monitor the flat wire 105 for a miswire or inter-layer short. If a current-based signal is detected on the second return conductor 210 by the return sense circuit 920, then the DWI component 340 may determine that there is an inter-layer short between one or more of the grounding conductors 220, 225 and one or more of the return conductors 210, 215. Similarly, if a current-based signal is detected on the electrifiable conductor 205 by the electrifiable sense circuit 925, the DWI component 340 may determine that there is an inter-layer short between one or more of the grounding conductors 220, 225 and the electrifiable conductor 205.

As an example, a test current of approximately 10 milliamps (mA) may be transmitted onto the first grounding conductor 220 of the flat wire 105 by the ground excitation circuit 910. If the ground sense circuit 915 detects a signal of approximately 10 milliamps on the second grounding conductor 220, then the DWI component 340 may determine that the grounding conductors 220, 225 are properly terminated. If, however, the ground sense circuit 915 does not detect a signal of approximately 10 milliamps on the second grounding conductor 220, then the DWI component 340 may determine that the grounding conductors 220, 225 are not properly terminated and the DWI component 340 may prevent the relay 310 from being closed to prevent electrification of the flat wire 105. Additionally, if a current is detected on either the second return conductor 215 by the return sense circuit 920 or on the electrifiable conductor 205 by the electrifiable sense circuit 925, then the DWI component 340 may determine that there is an inter-layer short in the flat wire 105. The DWI component 340 may then prevent the relay 310 from being closed to prevent electrification of the flat wire 105.

The combination of excitation circuits 905, 910 and sense circuits 915, 920, 925 shown in FIG. 9B is simply one combination of these circuits that may be used in accordance with various embodiments of the invention. It will be understood that excitation circuits and/or sense circuits may be used to transmit a signal onto or monitor any of the conductors of the flat wire 105. Using the example above, when a test signal is transmitted onto the first grounding conductor 220, an additional sense circuit may be used to monitor the first return conductor 210 of the flat wire 105 for a return signal that indicates an inter-layer short between one or more of the grounding conductors 220, 225 and the first return conductor 210. It will be understood, however, that because the two return conductors 210, 215 form a loop if they are wired correctly, any inter-layer short between one or more of the grounding conductors 220, 225 and the first return conductor 210 would also be detected by the return sense circuit 920 that is monitoring the second return conductor 215.

The excitation circuits 905, 910 and the sense circuit 915, 920, 925 may be incorporated into the DWI component 340. Alternatively, the excitation circuits 905, 910 and the sense circuits 915, 920, 925 may be included in the flat wire I/O interface 311, and the DWI component 340 may be in communication with the flat wire I/O interface 311 either directly or through the control unit 312.

Figure 9C:
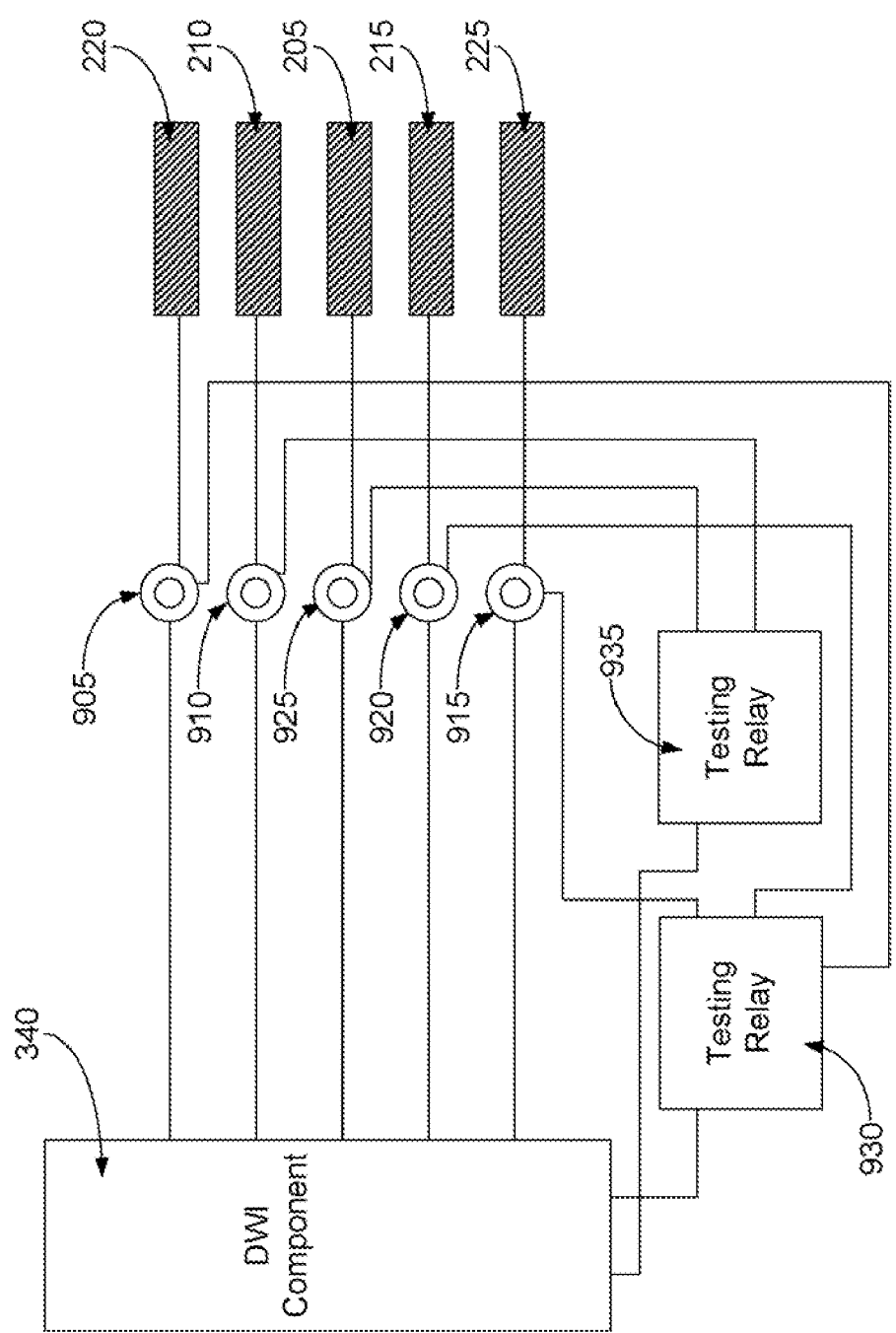
FIG. 9C is a schematic diagram of a current-based load side wire integrity component that utilizes testing relays in monitoring a flat wire for miswires and inter-layer shorts, according to an embodiment of the invention.

Additionally, the current-based method of the DWI component 340 may utilize one or more testing relays in conjunction with monitoring the sense circuits 915, 920, 925 for a return signal. The testing relays may be used to short one or more conductors or layers of the flat wire 105 together when making a measurement. The shorts created by the testing relays may assist in measuring the current across any two conductors of the flat wire 105. Accordingly, the testing relays may assist in locating or identifying conductors that have been miswired and/or in localizing flat wire faults. As an example, two testing relays 930, 935 may be used by the DWI component 340 in conjunction with monitoring the flat wire 105 for miswires and inter-layer shorts. FIG. 9C is a schematic diagram of an example DWI component 340 that utilizes testing relays 930, 935 in monitoring a flat wire 105 for miswires and inter-layer shorts according to certain embodiments of the invention. As shown in FIG. 9C, when neither of the testing relays 930, 935 is actuated or, in other words, neither of the testing relays 930, 935 is in a closed position, a default state may exist in which both the grounding loop and the return loop are allowed to be completed on the flat wire 105. While neither of the testing relays 930, 935 is actuated, the DWI component 340 may test the flat wire 105 for complete grounding and return conductor loops. When the first testing relay 930 is actuated or in a closed position, the return excitation circuit 910 may be connected or shorted to the ground sense circuit 915, thereby creating half of a loop necessary to check for an inter-layer short between one or more of the return conductors 210, 215 and one or more of the grounding conductors 220, 225. If an inter-layer short exists between one or more of the return conductors 210, 215 and one or more of the grounding conductors 220, 225, then the loop will be complete and the DWI component 340 will detect the inter-layer short. Similarly, when the second testing relay 935 is actuated or in a closed position, the return excitation circuit 910 may be connected or shorted to the electrifiable or hot sense circuit 925, thereby creating half of a loop necessary to check for an inter-layer short between one or more of the return conductors 210, 215 and the electrifiable conductor 205. If an inter-layer short exists between one or more of the return conductors 210, 215 and the electrifiable conductor 205, then the loop will be complete and the DWI component 340 will detect the inter-layer short. When the DWI component 340 completes its testing, then both testing relays 930, 935 may be de-energized back to their original or default states.

Figure 10:
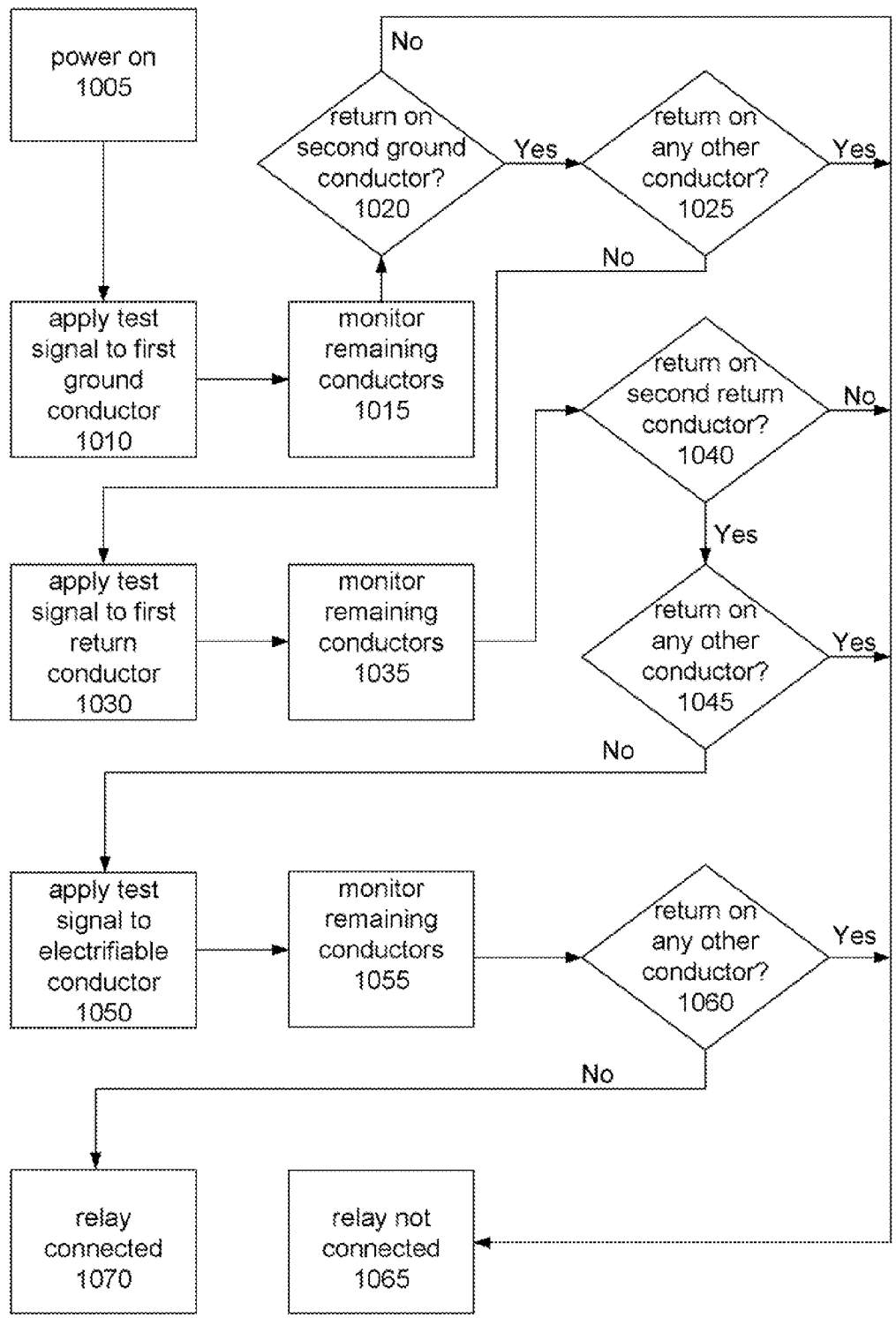
FIG. 10 is an example flowchart of the operation of a load side wire integrity component, according to an illustrative embodiment of the invention.

FIG. 10 is an example flowchart of the operation of a current-based detection method by a DWI component 340, according to an illustrative embodiment of the invention. The flowchart of FIG. 10 may be associated with the current-based detection method and circuitry described above with reference to FIG. 9B. If power is applied to the DWI component 340 at block 1005, then the DWI component 340 may go to block 1010. At block 1010, the DWI component 340 may apply a test signal to the first grounding conductor 220 of the flat wire 105. Then, the DWI component 340 may go to block 1015 and monitor the remaining conductors of the flat wire 105 for a return signal. At block 1020, the DWI component may determine whether the grounding conductor loop has been terminated properly by determining whether or not an appropriate return signal is present on the second grounding conductor 225. If the grounding conductor loop is not determined to be properly terminated, then the DWI component 340 may go to block 1065 and prevent the relay 310 from being closed to prevent electrification of the flat wire 105. If, however, the grounding conductor loop is determined to be properly terminated at block 1020, then the DWI component 340 may go to block 1025. At block 1025, the DWI component 340 may determine whether or not a short circuit exists between the grounding conductors 220, 225 and any of the other conductors of the flat wire 105 by determining whether or not a return signal is present on one or more of the electrifiable conductor 205, the first return conductor 210, and the second return conductor 215. If a return signal is detected on any of the conductors other than the grounding conductors 220, 225, a wire fault may be present on the flat wire 105, and the DWI component 340 may go to block 1065 and prevent the relay 310 from being closed to prevent electrification of the flat wire 105. If, however, no return signal is detected on any of the conductors other than the grounding conductors 220, 225, then the DWI component may go to block 1030.

At block 1030, the DWI component 340 may apply a test signal to the first return conductor 210 of the flat wire 105. Then, the DWI component 340 may go to block 1035 and monitor the remaining conductors of the flat wire 105 for a return signal. At block 1040, the DWI component determines whether the return conductor loop has been terminated properly by determining whether or not an appropriate return signal is present on the second return conductor 215. If the return conductor loop is not determined to be properly terminated, then the DWI component 340 may go to block 1065 and prevent the relay 310 from being closed to prevent electrification of the flat wire 105. If, however, the return conductor loop is determined to be properly terminated at block 1040, then the DWI component 340 may go to block 1045. At block 1045, the DWI component 340 may determine whether or not a short circuit exists between the return conductors 210, 215 and any of the other conductors of the flat wire 105 by determining whether or not a return signal is present on one or more of the electrifiable conductor 205, the first grounding conductor 220, and the second grounding conductor 225. If a return signal is detected on any of the conductors other than the return conductors 210, 215, then a wire fault may be present on the flat wire 105, and the DWI component 340 may go to block 1065 and prevent the relay 310 from being closed to prevent electrification of the flat wire 105. If, however, no return signal is detected on any of the conductors other than the return conductors 210, 215, then the DWI component may go to block 1050.

At block 1050, the DWI component 340 may apply a test signal to the electrifiable conductor 205 of the flat wire 105. Then, the DWI component 340 may go to block 1055 and monitor the remaining conductors of the flat wire 105 for a return signal. At block 1060, the DWI component 340 may determine whether or not there is a return signal in any of the other conductors of the flat wire 105. A return signal in any of the other conductors may indicate a miswire of the electrifiable conductor 205 or a short between the electrifiable conductor 205 and one of the other conductors of the flat wire 105. If at block 1060, a return signal is detected on one of the other conductors of the flat wire 105, then the DWI component 340 may go to block 1065 and prevent the relay 310 from being closed to prevent electrification of the flat wire 105. If, however, no return signal is detected on any of the other conductors of the flat wire 105 at block 1060, then the DWI component 340 may go to block 1070 and allow the relay 310 of the ASD 100 to be closed. Alternatively, a DWI component flag or state may be set, and the flag or state may be used by the ASD 100 in conjunction with the flags or states from other tests to determine whether or not the relay 310 is allowed to close.

It also will be understood by those of skill in the art that the tests performed by the current-based method of the DWI component 340 do not necessarily have to be performed in the order set forth in the logic of FIG. 10, but instead may be performed in any suitable order. It also will be understood that the DWI component 340 does not have to conduct each test set forth in FIG. 10, but instead may conduct less than all of the tests set forth in FIG. 10. If any test results in the execution of block 1065, then the DWI component 340 may still perform the remaining tests and may record the outcome of each test, or at least the ones that result in a positive miswire or fault indication. Additionally, if a miswire or fault is detected by the DWI component 340, an indicator may be stored by the DWI component 340 or by the control unit 312, and the indicator may include information as to which test(s) resulted in the detection of a miswire. This indicator may then be transmitted by the ASD 100 to another device such as a second ASD 100, a central monitoring device, or a computer. The DWI component 340 and/or the control unit 312 may also cause additional data, for example, measurements data taken by the components of the DWI component 340, to be stored in an appropriate memory, such as the memory 405 of the control unit 312.

Figure 11:
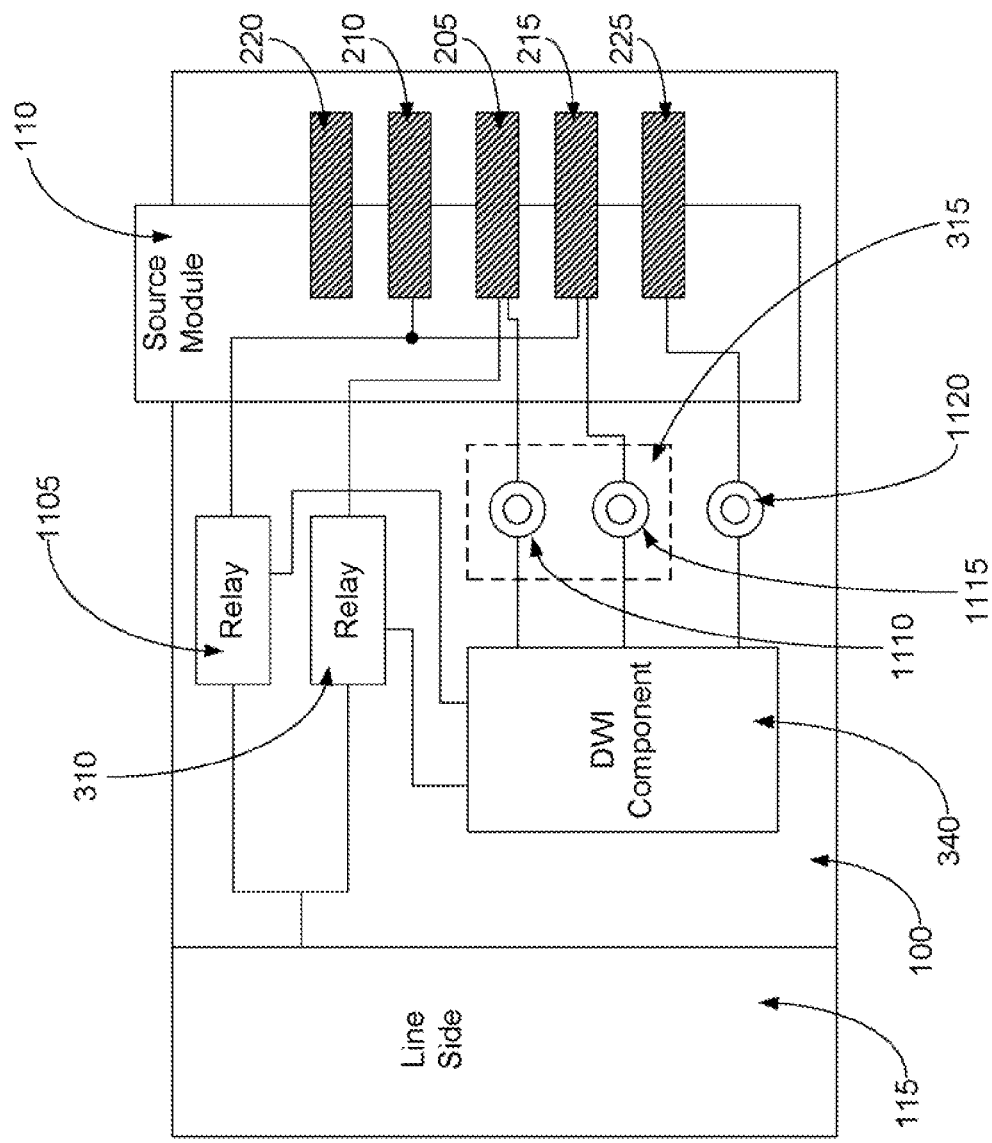
FIG. 11 is a schematic diagram of another example load side wire integrity component that may be incorporated into an ASD, according to an illustrative embodiment of the invention.

FIG. 11 is a schematic diagram of an alternative DWI component 340 that may be incorporated into an ASD 100, according to an embodiment of the invention. As shown, the ASD 100 may include more than one relay 310, 1105 that may be utilized to test the flat wire 105. With reference to FIG. 11, the ASD 100 may control the actuation of a first relay 310 in order to control the communication of an electrical power signal from the line side power source 115 to the electrifiable conductor 315 of the flat wire 105. The ASD 100 may also control the actuation of a second relay 1105 in order to control the communication of an electrical signal from the line side power source 115 to one or more return conductors 210, 215 of the flat wire 105. According to an aspect of the invention, the two relays 310, 1105 may be actuated independently of one another. For example, the second relay 1105 may be utilized in association with the DWI component 340 in order to test the flat wire 105 for miswires and/or wire faults. The second relay 1105 may be closed for a predetermined period of time, such as one half cycle of the electrical power signal of the line side power source 115, thereby allowing an electrical signal to be communicated onto one or more of the return conductors 210, 215. It will be appreciated that the electrical signal communicated onto one or more of the return conductors 210, 215 may be the electrical power signal communicated from the line side power source 115 or, alternatively, the electrical signal may be an altered version of the line side power source signal. For example, the line side power source signal may be stepped down or stepped up by an appropriate transformer and/or current limited by an appropriate resistor device prior to being communicated onto one or more of the return conductors 210, 215.

Once an electrical signal has been communicated onto one or more of the return conductors 210, 215, one or more sensors 1110, 1115, 1120 associated with the DWI component 340 may be utilized to test the flat wire 105 for return signals. The one or more sensors 1110, 1115, 1120 may be appropriate voltage or current sensors, as previously discussed. For example, the one or more sensors 1110, 1115, 1120 may be current transformers. As shown in FIG. 11, one or more sensors 1110, 1115, 1120 may be utilized to test the electrifiable conductor 205, one or more of the return conductors 210, 215, and one or more of the grounding conductors 220, 225 for return signals. Because the return conductors 210, 215 and the grounding conductors 220, 225 form respective loops if they are properly terminated at the destination module 120, it will be appreciated that only one sensor may be utilized for each pair of conductors. Additionally, it will be appreciated that the sensors 1110, 1115 utilized to test for a return signal on the electrifiable conductor 205 and one or more of the return conductors 210, 215 may be the current sensors utilized by the GFCI component 315.

The DWI component 340 of FIG. 11 may test the flat wire 105 for miswires and/or wire faults in a similar manner to that described above for the return conductors with reference to FIG. 10. For example, following the communication of an electrical signal onto one or more of the return conductors 210, 215, miswires and/or wire faults may be identified by the return signals that are detected by the one or more sensors 1110, 1115, 1120. If a return signal is detected on the electrifiable conductor 205 and/or one or more of the grounding conductors 220, 225, then a miswire and/or wire fault may be present on the flat wire 105. Additionally, if an electrical signal is applied to the first return conductor 210 and a return signal is not detected on the second return conductor 215, then a miswire may be identified in the flat wire 105.

It will be understood that the ASD 100 may include any number of relays and that an electrical signal may be communicated onto any conductor(s) of the flat wire 105 for testing. For example, a relay may be utilized to allow an electrical signal to be communicated onto one or more of the grounding conductors 220, 225 of the flat wire 105, and the flat wire 105 may be tested for return signals in a similar manner as that described above with reference to FIG. 11. It will be appreciated that the use of more than one relay may assist in preventing bounce and wear and tear on one or more of relays. For example, if a relay 1105 is utilized to control the communication of an electrical signal onto one or more of the return conductors 210, 215, then the relay 1105 may not be subject to the bounce and/or wear and tear that the relay 310 utilized in association with the electrifiable conductor 205 is subject to.

Figure 12:
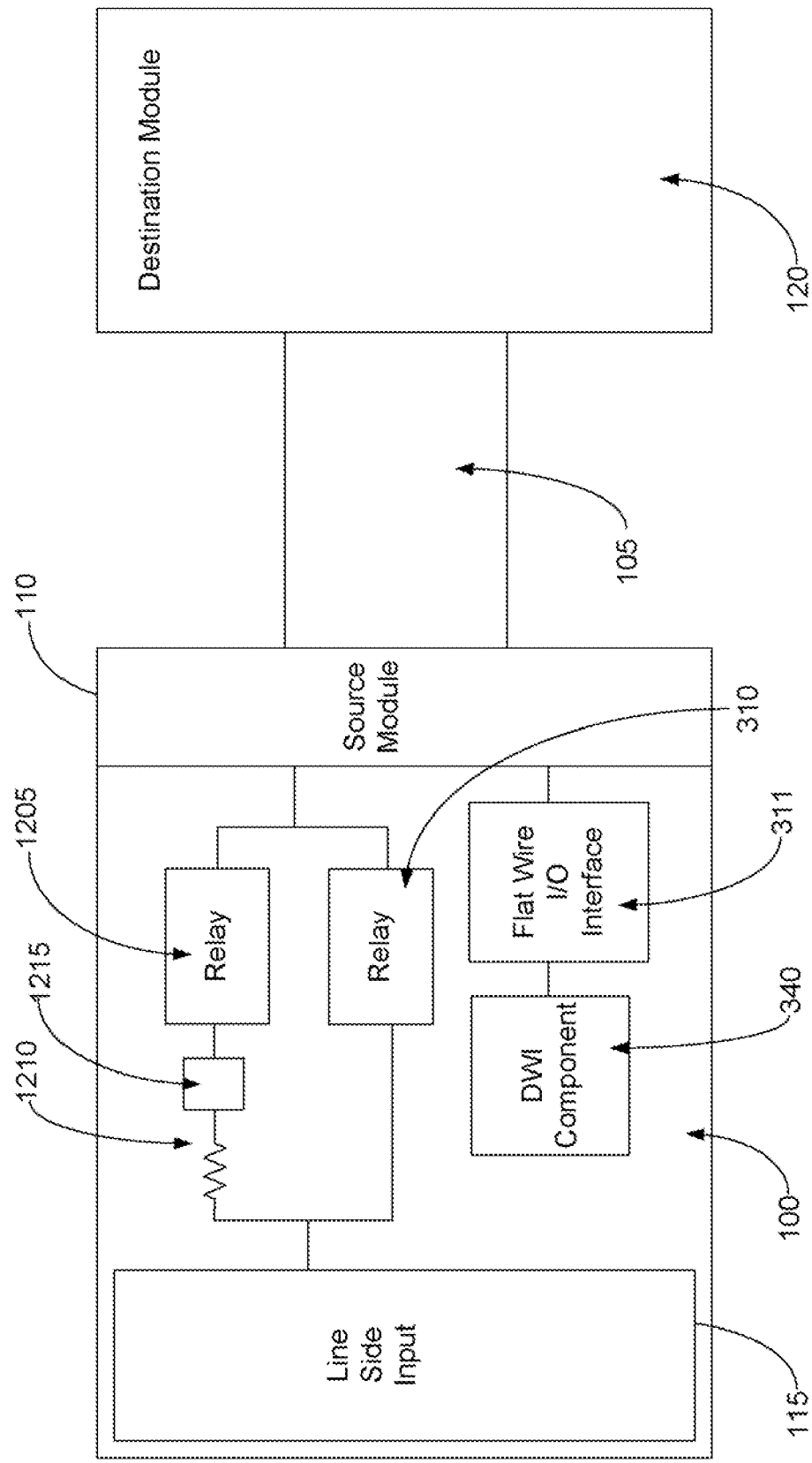
FIG. 12 is a schematic diagram of another example load side wire integrity component that may be incorporated into an ASD, according to an illustrative embodiment of the invention.

FIG. 12 is a schematic diagram of an ASD 100 and a DWI component 340 that may be utilized to detect high impedance shorts or wire faults in a flat wire 105, according to an embodiment of the invention. With reference to FIG. 12, more than one relay 310, 1205 may be incorporated into the ASD 100. A first relay 310 may be utilized to control the communication of an electrical power signal from the line side power source 115 onto the flat wire 105. A second relay 1205 may be utilized to control the communication of a test signal onto the flat wire 105. The test signal may be a current limited version of the electrical power signal. For example, the electrical power signal may be passed through an appropriate resistance device 1210 (e.g., a resistor) in order to limit the current of the termination test signal. It will be appreciated that the current may be limited to any appropriate value, such as a current that is between approximately 6 mA and approximately 100 mA. According to an aspect of the invention, the current may be limited to approximately 20 mA. Additionally, other parameters of the test signal may be altered by appropriate circuitry 1215. For example, the voltage of the test signal may be altered before it is communicated onto the flat wire 105. As an example, the voltage of the test signal may be stepped up to a higher voltage value by a suitable transformer before it is communicated onto the flat wire 100. As another example, the voltage of the test signal may be increased before it is communicated onto the flat wire 100 by an appropriate inversion technique. According to an aspect of the invention, the test signal may have a voltage that is between approximately 120 V and 1000 V, although higher voltage values may be used. Additionally, it will be appreciated that the test signal may be either an alternating current signal or a direct current signal, such as a direct current signal obtained by rectifying the electrical power signal received from the line side power source 115. It will also be understood that the test signal may have virtually any frequency. For example, the test signal may have a frequency between approximately 50 Hz and approximately 1 MHz. According to an aspect of the invention, the test signal may have a frequency of approximately 30 KHz.

It will be appreciated that the use of a high voltage test signal may assist in detecting high impendence shorts or wire faults on the flat wire 105. For example, a high voltage test signal may assist in detecting an arc flash or other arcing condition on the flat wire 105. It will further be appreciated that the use of a current limited single may provide for additional safety if there is a wire fault on the flat wire 105. Additionally, it will be appreciated that the use of the test signal described with reference to FIG. 12 by the ASD 100 to test the flat wire 105 may be used as a proactive safety test independently of or in addition to one or more of the other proactive safety tests described herein or apparent to one or ordinary skill in the art.

The test signal may be communicated onto one or more of the conductors of the flat wire 105 by closing the second relay 1205. It will be appreciated that the second relay 1205 may be closed for a predetermined period of time. Virtually any predetermined period of time may be utilized, as will be understood by those of skill in the art. Additionally, the test signal may be communicated onto any of the conductors of the flat wire 105. For example, the test signal may be communicated onto one or more of the return conductors 210, 215 of the flat wire 105, as discussed above with reference to FIG. 11. As another example, the test signal may be communicated onto one or more of the grounding conductors 220, 225 of the flat wire 105. As yet another example, the test signal may be communicated onto the electrifiable conductor 205 of the flat wire 105. After the test signal has been communicated onto one or more conductors of the flat wire 105, the DWI component 340 may monitor one or more conductors of the flat wire 105 for a return signal in a similar manner as that discussed above with reference to FIG. 11. The detection of a return signal may indicate the presence of a miswire and/or a wire fault on the flat wire 105. For example, if the test signal is communicated onto the first return conductor 210, then the detection of a return signal on the electrifiable conductor 205 and/or one or more of the grounding conductors 220, 225 may indicate a miswire and/or a wire fault. If a miswire or wire fault is detected by the DWI component 340, then the relay 310 may be maintained in an opened position, thereby preventing the full electrification of the flat wire 105. Additionally, the second relay 1205 may be maintained in an opened position. If, however, no miswires or wire faults are detected by the DWI component 340, then the first relay 310 may be permitted to be closed, thereby allowing the full electrification of the flat wire 105.

Figure 13:
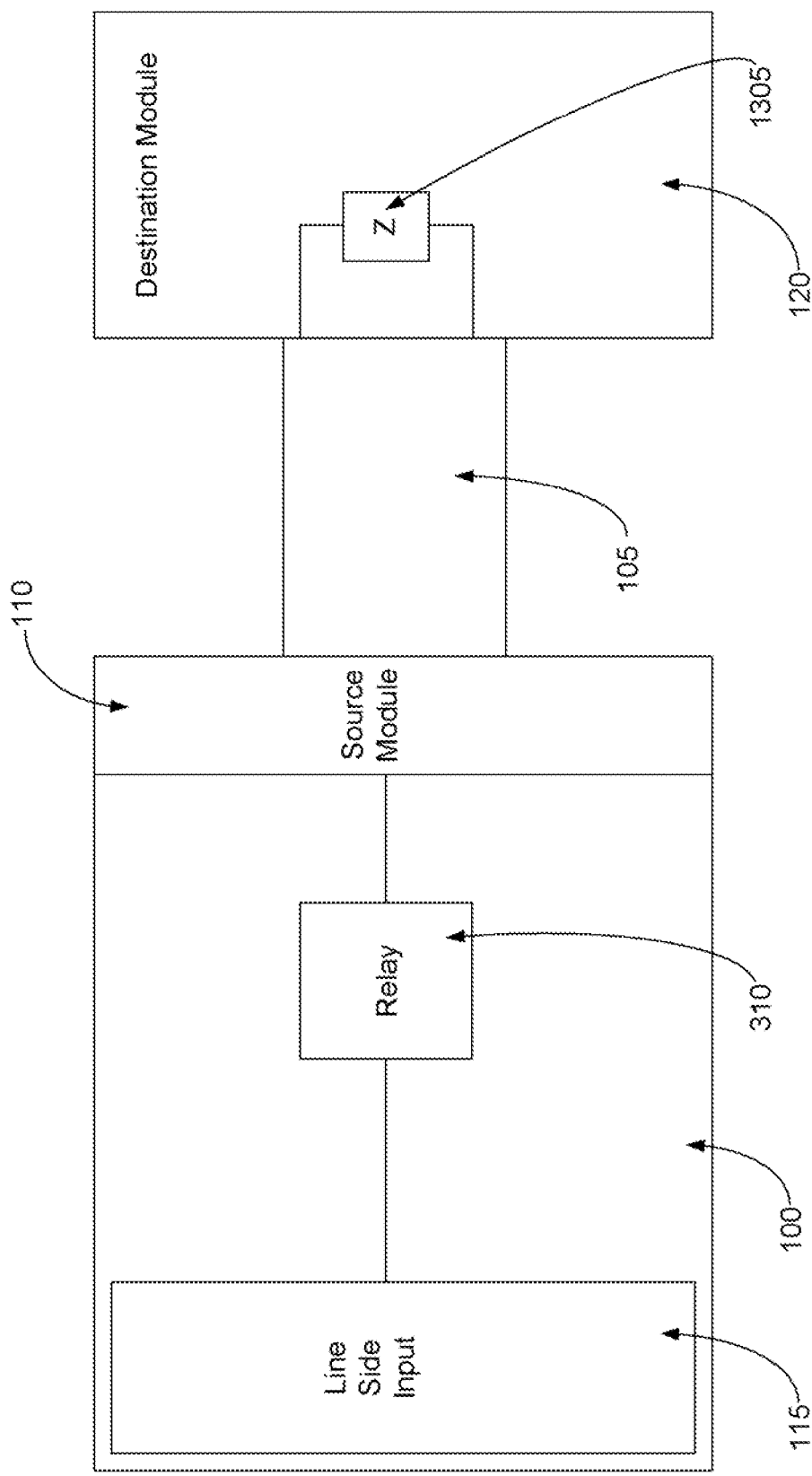
FIG. 13 is a schematic diagram of a circuit that may be utilized to test for a flat wire connection at a destination module, according to an embodiment of the invention.

As previously mentioned, additional tests may be conducted on the electrifiable conductor 205 of the flat wire 105 in order to determine that the electrifiable conductor 205 has been properly terminated. These additional tests are described herein as reactive tests; however it will be appreciated that proactive tests may also be utilized prior to the full electrification of the flat wire 105. These tests may also be associated with the load side wire integrity. Accordingly, the DWI component 340 may include both reactive and proactive elements. FIG. 13 is a schematic diagram of an example circuit that may be utilized to test for a proper flat wire termination at a destination module 120, according to an embodiment of the invention. With reference to FIG. 13, during the electrification of the flat wire 105 and/or after the electrification of the flat wire 105, the ASD 100 may test for a proper termination of the electrifiable conductor 205. In other words, once the relay 310 has been closed, the ASD 100 may test for an appropriate return signal that indicates that the electrifiable conductor 205 is properly terminated at the destination module 120. In order to test for a proper termination or the electrifiable conductor 205 at the destination module 120, an electrical load 1305 may be incorporated into the destination module 120. The electrical load 1305 may be a passive load that is detectable by the ASD 100, such as one or more LED's, one or more resistors, and/or one or more capacitors. The electrical load 1305 may be connected between the electrifiable conductor 205 and one or more of the return conductors 210, 215 of the flat wire 105. The electrical load 1305 may have virtually any total impedance that is discernable by one or more current sensing devices included in the ASD 100.

Once the relay 310 has been closed and an electrical power signal is communicated onto the flat wire 105, the electrical load 1305 may operate to generate a current on the flat wire 105 that may be detectable by appropriate current sensors of the ASD 100, for example, the current sensors utilized in association with the DWI component 340. The generated current may then be detected by one or more appropriate current sensors associated with the ASD 100 and, based at least in part on the amplitude of the detected current, a determination may be made as to whether the electrifiable conductor 205 and/or one or more of the return conductors 210, 215 have been properly terminated. In other words, if the detected current is above a predetermined threshold value, it may be determined that the electrifiable conductor 205 and/or one or more of the return conductors 210, 215 have been properly terminated. If, however, the detected current is below the predetermined threshold value, it may be determined that the electrifiable conductor 205 and/or one or more of the return conductors 210, 215 are not properly terminated, and the relay 310 may be opened, thereby de-energizing the flat wire 105. Many different predetermined threshold values may be utilized in accordance with the invention, such as for example a predetermined threshold value of approximately 20 mA. It will also be appreciated that if an electrical device, such as a lamp or a vacuum cleaner, is connected to the destination module 120, then a greater electrical load 1305 may be present on the flat wire 105. As discussed earlier, the over-current protection component 325 may de-energize the flat wire 105 if the current on the flat wire 105 exceeds a maximum allowed current, such as a current of 15 A.

As an example, once the flat wire 105 has been fully electrified, a 120 VAC signal may be communicated over the electrifiable conductor 205 to the destination module 120. The 120 VAC signal may then be communicated through an electrical load 1305 that is connected between the electrifiable conductor 205 and one or more of the return conductors 210, 215 in the destination module 120, thereby generating a current on the flat wire 105. The current may then be detected at the ASD 100 and compared to a predetermined threshold value in order to verify that the flat wire 105 is terminated properly. If an LED is utilized as part of the electrical load 1305 in the destination module 120, it will be appreciated that the LED may also provide a visual indication of a proper termination for the flat wire 105. Furthermore, it will be understood that a similar test as that discussed above with reference to FIG. 13 for the electrifiable conductor 205 may also be conducted on one or more of the other conductors of the flat wire 105.

Although the tests to detect a properly terminated electrifiable conductor are described above as reactive tests, it will be appreciated that proactive tests may be utilized prior to the full electrification of the flat wire 105. For example a voltage test signal may be communicated onto the electrifiable conductor 205 of the flat wire 105 and the voltage test signal may be communicated through a passive load in the destination module 120 prior to being returned to the ASD 100. The passive load may cause a detectable voltage drop in the flat wire 105. An appropriate voltage sensor in the ASD 100 may then detect the voltage drop across the passive load and determine whether or not the electrifiable conductor 205 has been properly terminated. It will be appreciated that the destination module 120 may include an appropriate relay that may prevent the voltage test signal from being communicated to an electrical device, such as a lamp or vacuum cleaner. In other words, the passive load may be the only load connected to the flat wire 105 at the destination module 120 during the proactive testing of the flat wire 105. If the voltage of the termination test signal has been stepped up prior to being communicated onto the flat wire 105, it may be easier to detect the electrical load 100. Based at least in part on the voltage detected at the ASD 100, the DWI component 340 and/or the control unit 312 may determine whether or not the electrifiable conductor 205 has been properly terminated. It will be appreciated that other conductors of the flat wire 105 may be tested for proper termination utilizing appropriate voltage signals.

It will be appreciated that other safety components may be included or incorporated into or associated with the ASD 100. The safety components described herein are provided by way of example only. Other safety components will be readily apparent to those of ordinary skill in the art.

If will also be appreciated that a variety of safety components or other features may be included in a destination device 117. As discussed above, a destination device 117 may include a passive load that assists in the testing of the proper termination of the flat wire 105. The destination device 117 may also include one or more safety components that may be utilized to test flat wire that has been connected downstream from the destination device 117, as discussed below with reference to FIG. 19. The one or more safety components that may be included may be similar to one or more of the safety components discussed above for the ASD 100. A destination device 117 may also include a light emitting diode (LED) or another suitable device that may indicate to a user when power is being supplied to the destination device 117. A destination device 117 may also include suitable surge protection devices and associated fuses that may prevent a dangerous high current signal from being passed through the destination device 117. For example, the destination device 117 may include a suitable surge protection device between the electrifiable conductor 205 and the return conductors 210, 215. As another example, the destination device 117 may include a suitable surge protection device between the electrifiable conductor 205 and the grounding conductors 220, 225.

A destination device 117 and/or the ASD 100 may also include a battery backup that permits at least the conducting of proactive tests on the flat wire 105 in the event of a power outage. The battery backup may be any type of battery, such as a rechargeable battery that may be charged while power is provided to the ASD 100 and/or the destination device 117 from the line side power source 115. Additionally, as previously mentioned, a destination device 117 and/or the ASD 100 may include any number of electrical sockets. Other features that may be incorporated into a destination device 117 will be apparent to those of ordinary skill in the art.

Safety is an important consideration in the design of wiring systems that can carry dangerous voltage levels, especially when there is a possibility of a penetration of an electrifiable conductor 205. Penetration or compromise of a flat wire 105 by objects such as nails, screws, drill bits, knife blades, saw blades, scissors, staples, darts, bullets, toys, etc. should be considered.

As one of ordinary skill in the art will appreciate, the flat wire 105 described herein, for purposes of disclosing the invention, may itself be designed to be safe if it is penetrated. Fire protection and electric shock safety are based on limiting the voltage, and therefore the current in the flat wire 105 while expediting the trip time of a primary safety device such as a circuit breaker or a fuse in a branch circuit main box. Secondary protection may also be provided by the ASD 100.

The flat wire 105 may be designed to produce a short between a first grounding conductor 220, a first return conductor 210, an electrifiable conductor 205, a second return conductor 215, and a second grounding conductor 225 (G-N-H-N-G) in that sequence upon penetration. With as much as four times the conductance ultimately tied to earth ground, a voltage divider is formed favoring the ground voltage over the line or hot voltage. Repeated tests show that voltages present at the site of penetrations of the flat wire 105 do not exceed approximately 50 VAC for longer than a primary safety device's trip time, which is typically under 25 milliseconds. Furthermore, the voltage present at the site of penetrations does not exceed approximately 50 VAC for longer than the trip time of a secondary safety device such as the ASD 100, which may be approximately 8 milliseconds.

Penetration may occur through the broadside or the flat surface of a flat wire 100 by sharp objects. Alternatively, penetration may occur through an edge of the flat wire 100 by an object such as a knife blade or drywall saw. In either situation, the resulting short may cause a high current to be produced at a low voltage for a short time (less than the trip time). Startle effect, or sound burst, and localized heating may be minimized due to the nature of the protective layered flat wire 105.

FIGS. 14A-F are a series of diagrams which depict an example of the dynamics of a nail or tack penetration of a live multi-planar flat wire 105. Again, protective layered flat wire 105 has a distinct advantage over conventional wire by assuring that a penetrating object 1400, such as a nail, first passes through a grounding conductor (G1) 220, then a return or neutral conductor (N1) 210 prior to any contact with the hot electrifiable conductor 205.

Figure 14A:
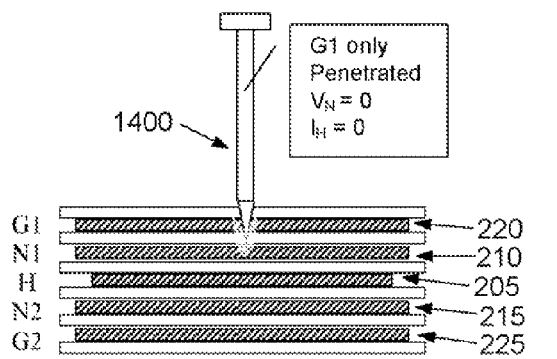
FIGS. 14A-14F are cross-sectional views depicting an example of the dynamics of a nail or tack penetration of a live multi-planar flat wire.
Figure 14B:
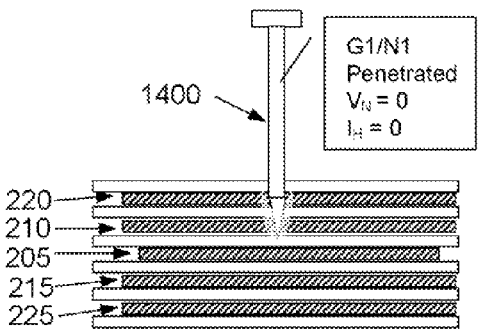

FIG. 14A depicts a situation in which a penetrating object 1400 has only penetrated one grounding conductor 220 of the flat wire 105. Similarly, FIG. 14B depicts a situation in which a penetrating object 1400 has penetrated only one grounding conductor 220 and one return conductor 210. In both FIGS. 14A and 14B, the electrifiable conductor 205 has not yet been penetrated. Accordingly, in both FIGS. 14A and 14B, there may be no voltage or current present on the penetrating object 1400. Additionally, the current present on the electrifiable conductor 205 of the flat wire 105 may be some normal load current. The normal load current present on the electrifiable conductor 205 may be a current which is less than approximately 15 amps in a standard United States branch application or which is less than approximately 6 amps in a standard European branch application.

Figure 14C:
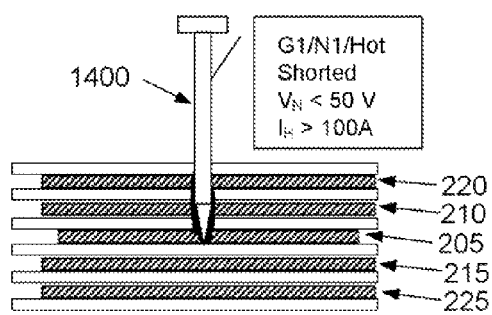
Figure 14D:
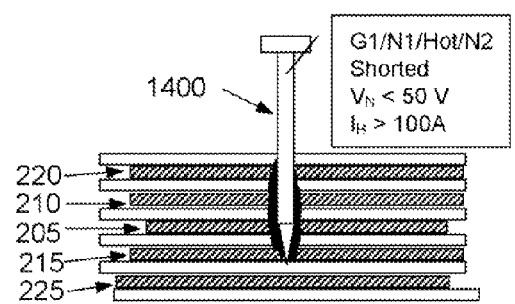
Figure 14E:
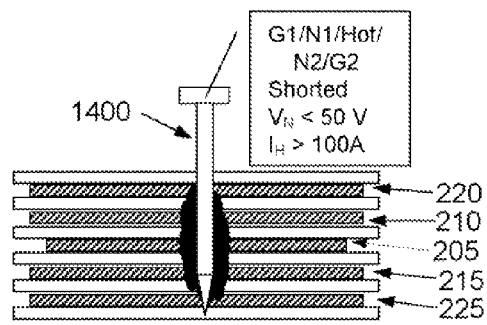

FIG. 14C depicts a situation in which the penetrating object 1400 has shorted the electrifiable conductor 205, one of the return conductors 210 and one of the grounding conductors 220. Similarly, FIG. 14D depicts a situation in which the penetrating object 1400 has shorted the electrifiable conductor 205, both of the return conductors 210, 215 and one of the grounding conductors 220. FIG. 14E depicts a situation in which the penetrating object 1400 has shorted the electrifiable conductor 205, both of the return conductors 210, 215 and both of the grounding conductors 220, 225. In each of FIGS. 14C-14E, the short circuit created in the flat wire 105 between the electrifiable conductor 205 and any of the other conductors 210, 215, 220, 225 may act as a voltage divider until a primary safety device such as a circuit breaker or a secondary safety device such as an ASD 100 trips. In each of FIGS. 14C-14E, there may be a relatively low voltage present on the penetrating object 1400. The low voltage may be less than approximately 50 VAC on a standard 120 VAC wire, and the low voltage may be less than approximately 100 VAC on a standard 240 VAC line. Additionally, in each of FIGS. 14C-14E, the current present on the electrifiable conductor 205 may exceed approximately 100 amps until the primary or secondary safety device (ASD) 100 trips. There also may be a current present on either of the grounding conductors 220, 225 and/or on either of the return conductors 210, 215 which will also facilitate the tripping of the ASD 100.

The time for penetrating from an outer grounding layer 220 to an electrifiable conductor 205 (FIGS. 14A-14C) may typically be under one millisecond, which is only a fraction of a typical trip time for a primary safety device such as a circuit breaker. Similarly, the time to continue penetration from an electrifiable conductor 205 to the backside grounding layer 225 (FIGS. 14C-14E) may also be relatively short. The short circuit created during the penetration may be of a continuous nature. The continuous nature of the short circuit may be due to two primary factors: firstly, the conductor contact at the sides of the penetrating object 1400 is maintained by the insulation displacement process during penetration and secondly, by the molten copper in the proximity of the contact area once the short begins.

Figure 14F:
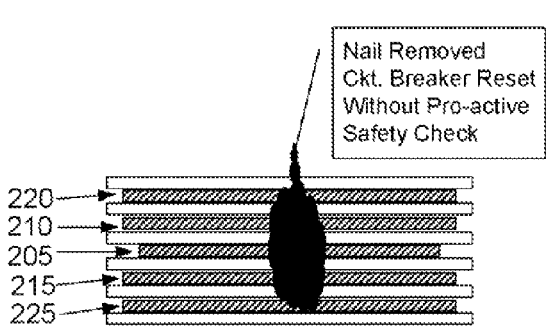

FIG. 14F depicts a penetration after a penetrating object 1400 has been removed from the flat wire 105. If the circuit breaker has been reset prior to the flat wire 105 being electrified, then some additional damage may be done to the flat wire 105 before the circuit breaker trips again; however, if an ASD 100 is connected to the flat wire 105, then any additional damage may be prevented. The proactive safety components of the ASD 100 may determine that a fault exists on the flat wire 100 prior to allowing the flat wire 100 to be fully electrified. For example, when testing the flat wire 105 prior to electrification, the DWI component 340 of the ASD 100 may determine that a short exists between the conductors or layers of the flat wire 105. The ASD 100 will then prevent the flat wire 100 from being electrified.

Figure 15:
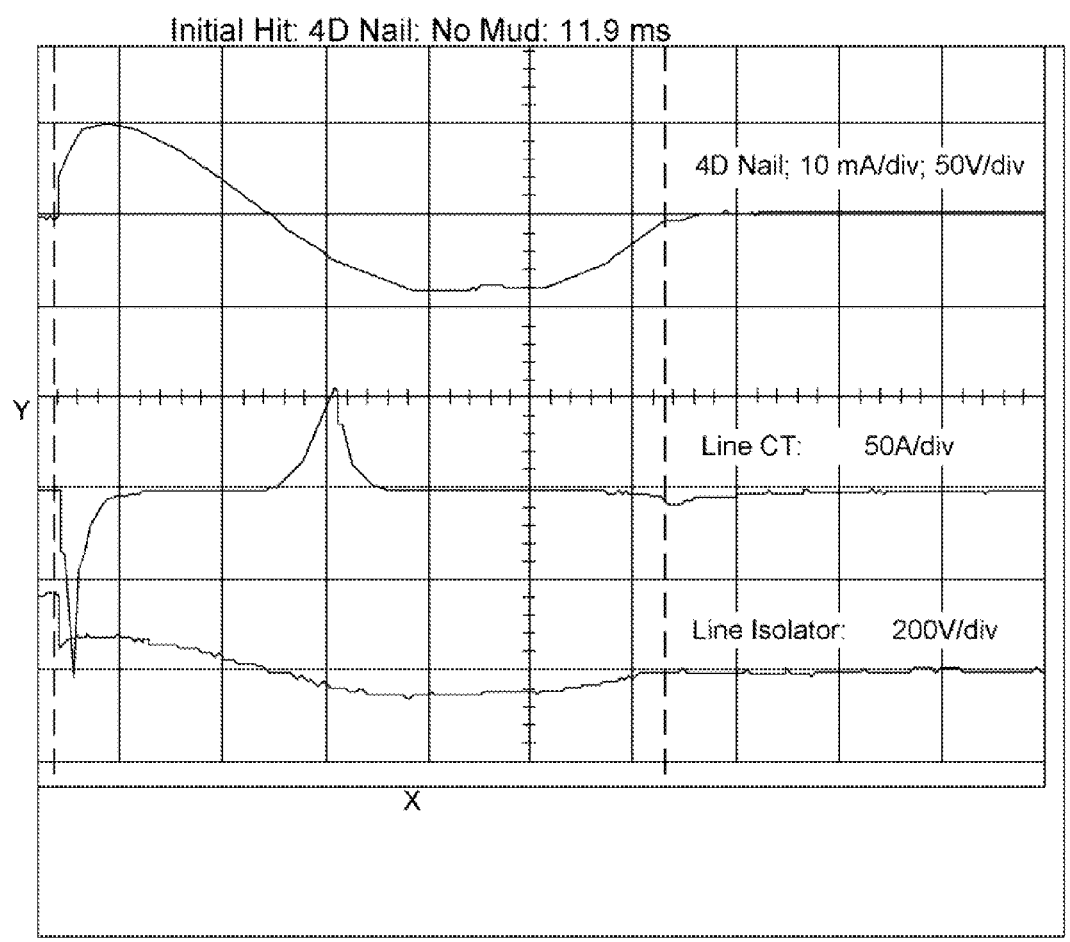
FIG. 15 is a representative graph of the voltage and current waveforms present during a penetration of a flat wire by a nail as provided for in FIGS. 13A-13F.

FIG. 15 is a representative graph of the voltage and current waveforms present during a penetration of a flat wire 105. The voltage waveform present on the penetrating object 1400 and current waveform present on the electrifiable conductor 205 may be captured by an oscilloscope such as a Gould Ultima 500 oscilloscope. For this example, the penetrating object 1400 was a nail of a 4d common size and the circuit breaker used was a common 20 amp GE circuit breaker. As shown by FIG. 14, the trip time for the circuit breaker may be approximately 12 to 25 milliseconds when the penetrating object 1400 penetrates the flat wire 105. Note that the circuit breaker trip time may be less than the period for one cycle of a standard 120 VAC, 60 Hz electrical wire. The trip time for an ASD 100 connected to the flat wire 105 may also be less than the period for one cycle of a standard 120 VAC, 60 Hz electrical wire. Additionally, the trip time of the ASD 100 may be less than the trip time of the circuit breaker. The trip time of the ASD 100 may be, for example, approximately 8 milliseconds or less, causing the ASD 100 to trip before the tripping of the circuit breaker. After the ASD 100 trips, causing the flat wire 105 to be de-energized, the circuit breaker may or may not trip.

Figures 16A, 16B:
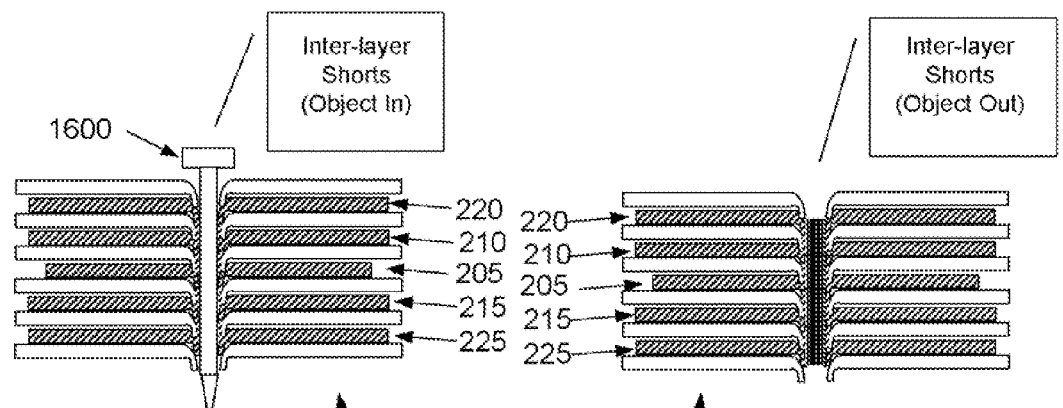
FIGS. 16A-16D are cross-sectional views depicting examples of the dynamics of a penetration of a non-live multi-planar flat wire.

FIGS. 16A-16D are a series of diagrams which depict examples of the dynamics of a penetration of a non-live multi-planar flat wire 105. FIG. 16A shows the inter-layer shorts that occur when a penetrating object 1600, such as a nail, penetrates the flat wire 105. Without electrification, the conductors of the flat wire 105 may not experience additional damage or fusion from high currents; however, multiple inter-layer shorts may be caused. FIG. 16B shows the residual inter-layer shorts after the penetrating object 1600 has been removed from the flat wire 105. The DWI component 340 of an ASD 100 connected to the flat wire 105 may be able to detect this inter-layer short prior to allowing the flat wire 105 to be fully electrified. The DWI component 340 may also be able to determine that the layer loops of the flat wire 105, such as the grounding layer loop or the return conductor layer loop, are incomplete prior to allowing the flat wire 105 to be fully electrified. The proactive safety components of the ASD 100 may prevent flashes or plumes (e.g., arc flashes) which may occur upon electrification of the flat wire 105 by recognizing defects prior to allowing the flat wire 105 to be fully electrified.

If the penetrating object 1600 penetrated the flat wire 105 after the flat wire 105 had been electrified, then the reactive safety components including the GFCI component 315 and the ground current monitoring component 330 may detect the flaw in the flat wire 105 and open the relay 310 of the ASD 100, thereby de-energizing the flat wire 105.

Figures 16C, 16D:
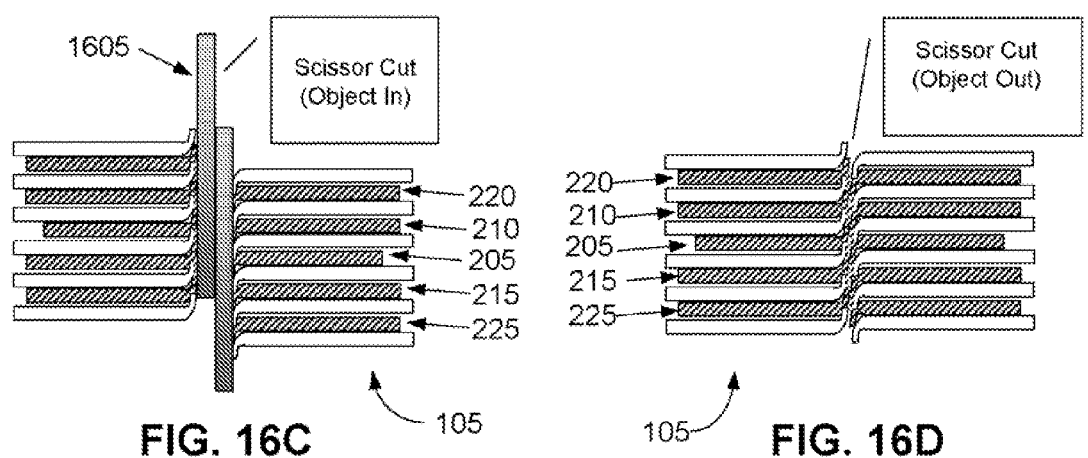

FIG. 16C depicts the transverse cut of a flat wire 105 by a cutting object 1605, such as a pair of scissors. In FIG. 16C, the cutting object 1605 is shown still in the flat wire 105 during the cut. FIG. 16D depicts how a partially cut flat wire 105 section would appear once the cutting object 1605 has been removed. The DWI component 340 of an ASD 100 connected to the flat wire 105 may be able to detect the inter-layer shorts created by the cutting object 1605 prior to allowing the flat wire to be fully electrified. Alternatively, the DWI component 340 may be able to determine that the layer loops of the flat wire 105, such as the grounding layer loop or the return conductor layer loop, are incomplete prior to allowing the flat wire 105 to be fully electrified. The proactive safety components of the ASD 100 may prevent flashes or plumes (e.g., arc flashes) which may occur on the flat wire 105 by recognizing defects prior to allowing the flat wire 105 to be fully electrified.

If the cutting object 1605 cuts the flat wire 105 after the flat wire 105 has been electrified, then the reactive safety components including the GFCI component 315 and the ground current monitoring component 330 may detect the flaw in the flat wire 105 and open the relay 310 of the ASD 100, thereby de-energizing the flat wire 105.

The various safety components of the ASD 100 may share various circuits. Although the various safety components are described herein as individual components, it will be understood that the safety components may utilize common circuits. For example, the ASD 100 may include only one excitation circuit and one sense circuit that is used as needed by each of the safety components of the ASD 100.

The sharing of circuits by the various components of the ASD 100 may facilitate the construction of a compact device. Accordingly, the ASD 100 may be placed in a compact enclosure such as in a wall box or cavity that is roughly the size of a common electrical outlet. For example, an ASD 100 may be placed in a wall cavity that is the size of the cavity used for an electrical outlet. The ASD 100 may be powered by a conventional in-wall electrical wire. Alternatively, an ASD 100 may be plugged into a conventional wall receptacle outlet and powered by that outlet. If the ASD 100 is to be plugged into an outlet, the source device 103 may include, for example, a plug, such as a traditional three-prong electrical plug, that may be inserted into the outlet. In such a situation, the plug would be the line side power source 115 for a flat wire system 101, and the line side power source 115 would be incorporated into the source device 103. A flat wire 105 may then be connected to and monitored by the ASD 100. Additionally, the ASD 100 may have auxiliary receptacles, or plugs, situated on the exterior surface of the ASD 100. These plugs may be common two-prong or three-prong plugs and may be used to power electronic devices.

Figure 17A:
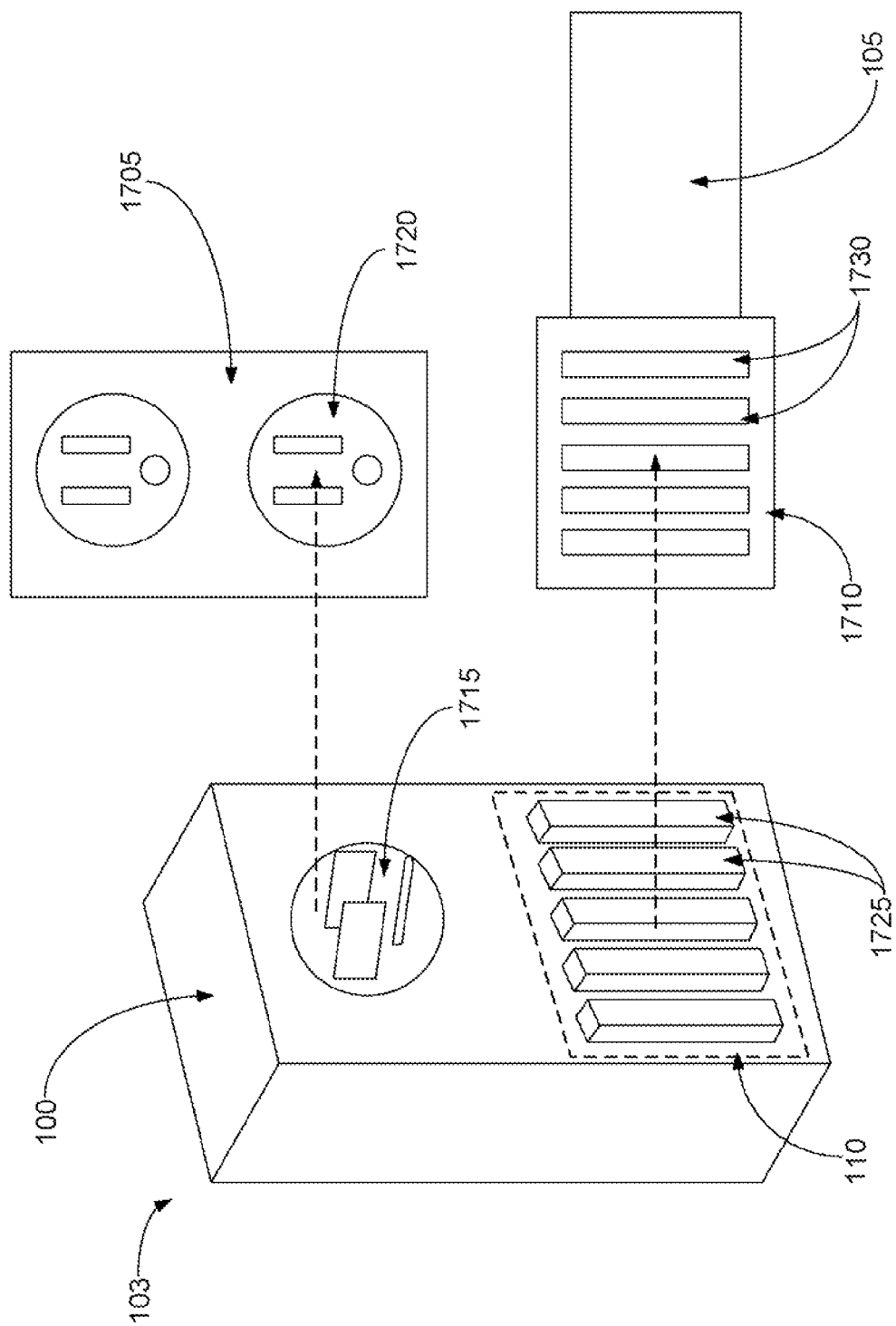
FIG. 17A is a schematic diagram of an example source device connection to an electrical outlet and a flat wire, according to an illustrative embodiment of the invention.

According to an aspect of the invention, the ASD 100 may be configured to receive power and an electrical power signal from a line side power source 115 that is a standard electrical outlet. Additionally, the ASD 100 may be configured to prevent the communication of the electrical power signal onto the flat wire 105 without the electrical power signal first being communicated through the ASD 100. Accordingly, the ASD 100 may conduct on or more tests on the flat wire 105 prior to electrification of the flat wire 105, during the electrification of the flat wire 105 and/or subsequent to the electrification of the flat wire 105. FIG. 17A is a schematic diagram of an example source device connection to an electrical outlet 1705 and a flat wire 105, according to an illustrative embodiment of the invention. The source device 103 may be connected to a termination device 1710 associated with the flat wire 105. With reference to FIG. 17A, the source device 103 of the ASD 100 may include an electrical plug 1715 that is configured to be plugged into a corresponding socket 1720 of an electrical outlet 1705. Additionally, the source module 110 of the ASD 100 may include one or more source termination points 1725 that are configured to be plugged into one or more corresponding termination plugs 1730 associated with the termination device 1710. The flat wire 105 may be connected to the termination device 1710, and each conductor of the flat wire 105 may be terminated at a respective termination plug 1730 of the termination device 1710. The conductors of the flat wire 105 may be terminated at the termination device 1710 in an appropriate order, for example, in a G-N-H-N-G configuration. As one example, a grounding conductor 220 of the flat wire 105 may be terminated first and then the other conductors of the flat wire 105 may be terminated in order until the other grounding conductor 225 is terminated. It will be appreciated that, given the symmetry of the example flat wire 105 described in this disclosure, the flat wire 105 should be terminated correctly regardless of which grounding conductor 220, 225 is terminated first provided that a G-N-H-N-G configuration is used and that the flat wire 105 conductors are terminated in order starting with a grounding conductor 220, 225.

With continued reference to FIG. 17A, when the ASD 100 is plugged into the electrical outlet 1705, the source termination 1725 points will also be connected to the corresponding termination plugs 1730 of the termination device 1710. When the ASD 100 is unplugged from the electrical outlet 1705, the connection with the termination device 1710 will also be severed. Additionally, the termination device 1710 may be situated remotely from the electrical outlet 1705, requiring the ASD 100 to complete the connection between the line side power source 115 and the flat wire 105. Accordingly, the ASD 100 may test the flat wire 105 prior to the communication of an electrical power signal from the line side power source 115 to the flat wire 105.

As shown in FIG. 17A, the source termination points 1725 are male termination points and the corresponding termination plugs 1730 of the termination device 1710 are female termination points. However, it will be understood that the source device 103 may include female termination points and the termination device 1710 may include male termination points. Additionally, it will be understood that other types of connections may be utilized between the source device 103 and the termination device 1710, as will be understood by those of skill in the art. Additionally, It will be appreciated that the connections illustrated in FIG. 17A only require the use of one socket 1720 of an electrical outlet 1705. Accordingly, any remaining sockets of the electrical outlet 1705 may be free for use with other devices.

Figure 17B:
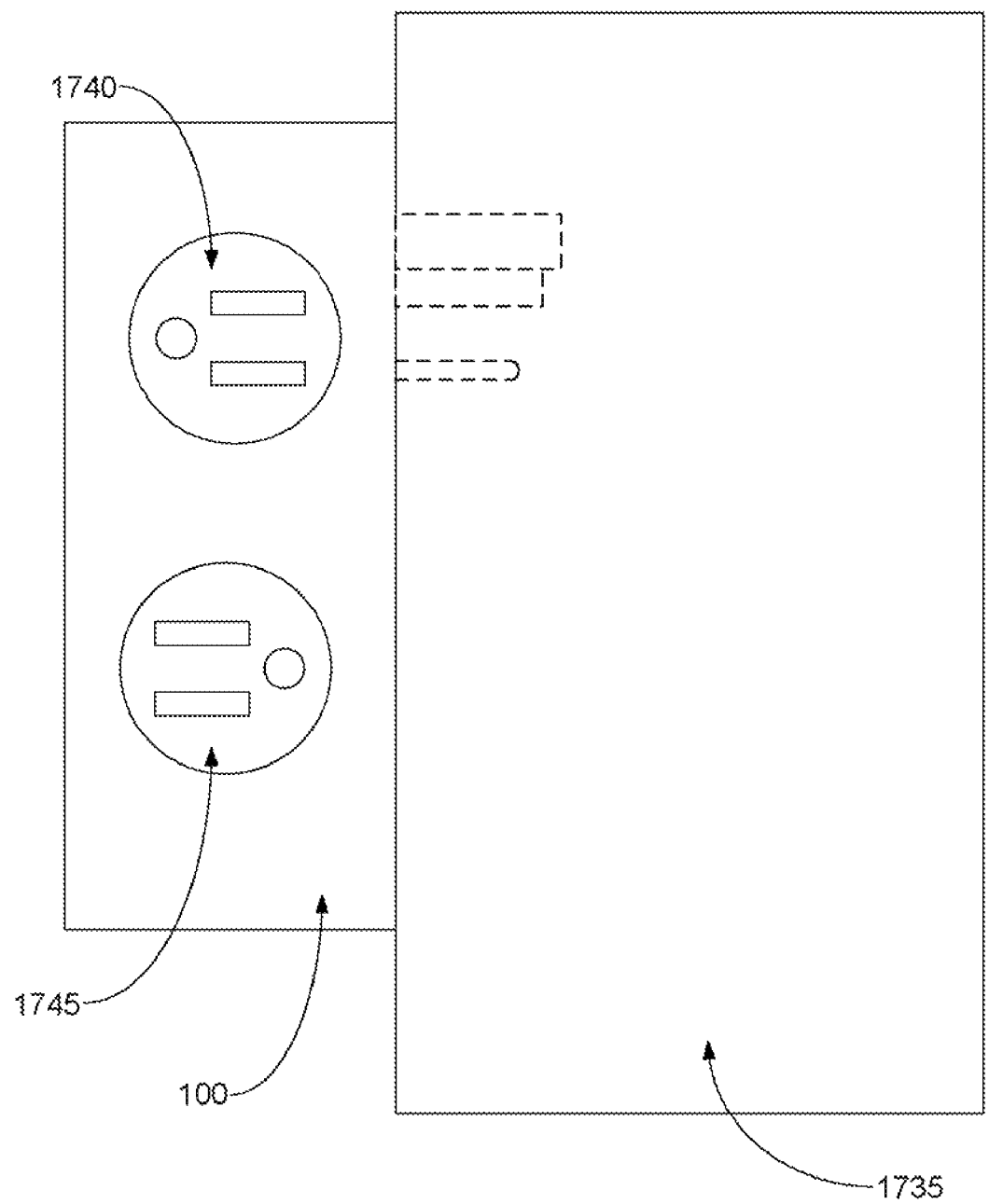
FIG. 17B is a schematic diagram of an ASD with extender outlets, according to an illustrative embodiment of the invention.

According to another aspect of the invention, the ASD 100 may include or incorporate one or more electrical sockets or extender outlets that permit standard electrical plugs to be plugged into the ASD 100. FIG. 17B is a schematic diagram of an ASD 100 that includes extender outlets, according to an illustrative embodiment of the invention. The ASD 100 of FIG. 17B is illustrated as being plugged into an electrical socket, for example the electrical socket 1705 of FIG. 17A, that is situated on a wall 1735. It will be appreciated that the ASD 100 may include any number of extender outlets and that the extender outlets may be situated on any surface of the ASD 100. As shown in FIG. 17B, the ASD 100 may include two extender outlets 1740, 1745 on a peripheral surface of the ASD 100 that extends from the front of the ASD 100 to the front surface of the wall 1735. The extender outlets 1740, 1745 may be configured in such a manner that the female connections of the extender outlets 1740, 1745 are situated in a horizontal manner relative to the floor or ceiling of a room. Accordingly, each of the extender outlets 1740, 1745 may permit an electrical plug that includes a transformer to be inserted without contacting the wall 1735. It will be appreciated that the extender outlets 1740, 1745 may be configured in such a manner that their female connections are situated in any manner, for example, that of the standard electrical outlet 1705 of FIG. 17A. It will also be appreciated that a destination device 117 may also include one or more electrical outlets.

According to another aspect of the invention, the ASD 100 may be capable of supporting and monitoring more than one flat wire 105. Multiple flat wires 105 may extend from the ASD IOU to separate destination modules 120 or separate loads 125. Alternatively or additionally, more than one flat wire 105 may be disposed between the ASD 100 and a destination device 117 or the load 125, as shown in FIG. 18. Illustrated in FIG. 18 is a schematic diagram of a flat wire system 1801 including an ASD 100 that monitors two flat wires 105, 1805 connected to the same destination device 117, according to an illustrative embodiment of the invention. For example, as shown in FIG. 18, both a primary flat wire 105 and a secondary flat wire 1805 may extend from the ASD 100 to a destination device 117. If the ASD 100 detects a wire fault in the primary flat wire 105, then the ASD 100 may maintain the relay 310 connected to the primary flat wire 105 in its open position, thereby preventing electrification of the primary flat wire 105. The ASD 100 may then close a relay connected to the secondary flat wire 1805 and allow electrification of the secondary flat wire 1805 in order to power the load 125. It will be appreciated that the secondary flat wire 1805 may be monitored by the ASD 100 in the same was as the primary flat wire 105. Additionally, the control unit 312 of the ASD 100 or, alternatively, a safety component of the ASD 100, may provide an indication of the change to the secondary flat wire 1805 to a user. This indication may be any control action such as activating an LED that indicates the change by the ASD 100 to the secondary flat wire 1805. Another control action that may be taken is the transmission of a message indicating the change by the ASD 100 to the secondary flat wire 1805. The message may be transmitted to another ASD 100, to a central hub or control panel, or to another destination, as will be explained in greater detail below.

Figure 19:
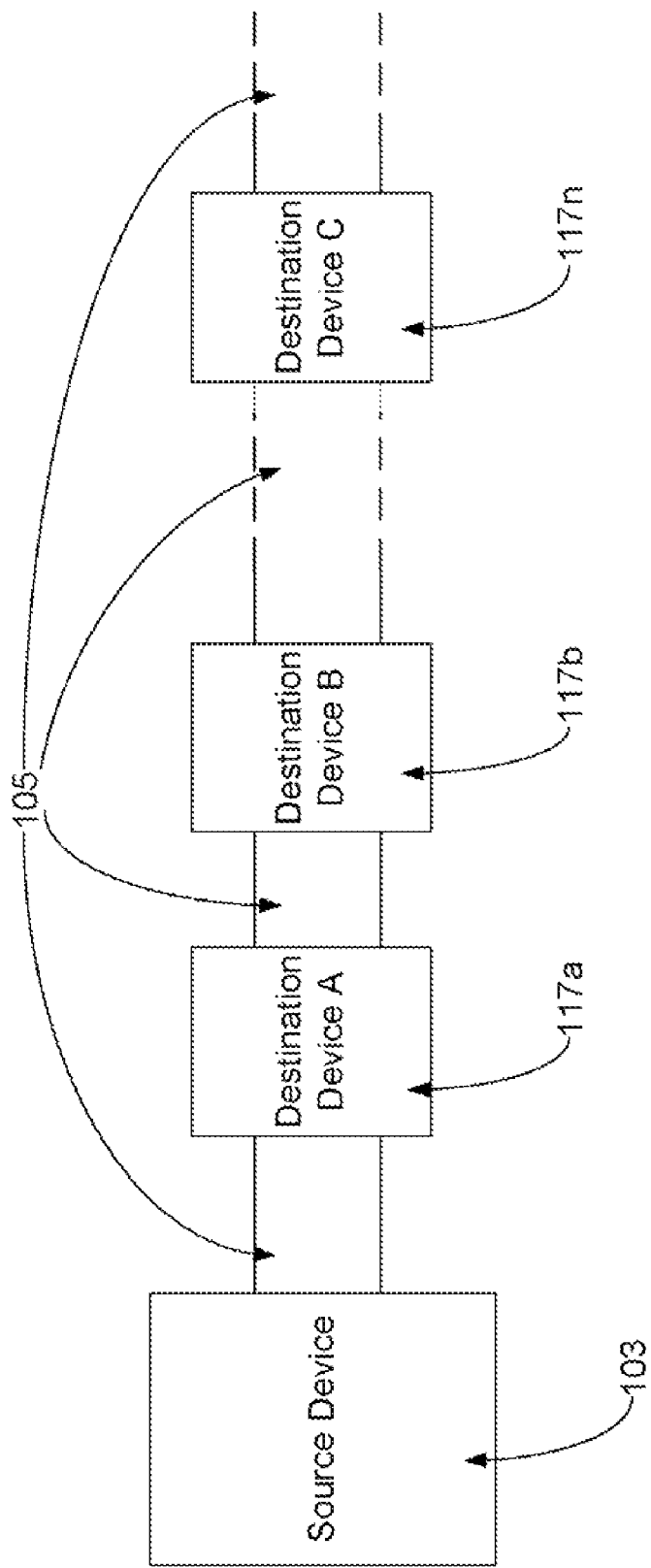
FIG. 19 is a schematic diagram of multiple destination devices in a serial configuration being supported by a single source device, according to an illustrative embodiment of an aspect of the invention.

According to another aspect of the invention, an ASD 100 or source device 103 containing an ASD 100 may be used in conjunction with more than one destination device 117 connected in series. FIG. 19 is a schematic diagram of multiple destination devices 117a-n in a serial configuration being supported by a single source device 103, according to an illustrative embodiment of the invention. As shown in FIG. 19, a single source device 103 containing an ASD 100 may monitor a flat wire 105 that runs from the source device 103 to a series of destination devices 117a-n. Each of the destination devices 117a-n may be an electrical load such as an outlet assembly or receptacle. This type of configuration may also be referred to as an add-a-receptacle configuration or as a daisy chain configuration. It will be understood that any number of ASD's and/or destination devices may be connected in series.

As shown in FIG. 19, the flat wire 105 may extend from the source device 103 through each destination device 117a-n. An input segment of the flat wire 105 may be terminated at each destination device 117a-n and then a new output segment of flat wire 105 may be used to connect the next destination device 117a-n. For example, a first segment of flat wire 105 may connect the source module 110 to the destination module 120 of the first destination device 117a, where the first segment of flat wire 105 is terminated. A separate segment of flat wire 105 may then connect the first destination device 117a to the second destination device 117b. This pattern may continue until the flat wire 105 reaches the last destination device 117n. Alternatively, a single segment of flat wire 105 may be used to connect all of the destination device 117a-n. Each destination device 117a-n may be connected to the flat wire 105 with a suitable terminal that connects each conductor of the flat wire 105 to the destination device 117a-n. Termination points within the destination module 120 and expansion module 122 of each destination device 117, which are used to connect the flat wire 105 to the destination device 117, may include terminal blocks, crimp-on terminals, plug and socket connectors, insulation displacement connectors (IDC), conductor penetration connectors (CPC), or any other electrical connector as will be understood by those of ordinary skill in the art.

Each destination device 117a-n may include a relay in communication with and controlled by the ASD 100 for passing the signal carried by the flat wire 105 on to the next destination device 117a-n. For example, the first destination device 117a may include a relay that passes the electrical power and/or signals carried by the flat wire 105 on to the second destination device 117b. The flat wire 105 may be relayed through each destination device 117a-n-1 until the flat wire reaches the last destination device 117n, at which point no relay is necessary. Optionally, each destination device 117 may include a DWI component 340 that is used to test the flat wire 105 extending from the destination device 117 to the next downstream destination device. The relays may be time delay relays, meaning that each of the relays may be actuated or closed after it receives power for a minimum period of time. The period of time that each relay needs to receive power before it is actuated may be a period of time that is sufficient for testing the next downstream segment of flat wire 105, such as approximately 375 milliseconds. Additionally, the period of time that each relay needs to receive power before it is actuated may be an adjustable period of time. It will be understood that, as an alternative to a relay, each destination module 117a-n may include a control unit or other control logic that is in communication with the ASD 100, and that is used to isolate a flaw in the flaw wire 105, as described in greater detail below with reference to destination device 117a-n that include relays.

Additionally, each of the destination device 117a-n may be in communication with the ASD 100, as described in greater detail below. While the ASD 100 is monitoring the flat wire 105, if a miswire or fault is detected in the flat wire 105, then the miswire or fault may be isolated by the ASD 100 by using the relays. As an example, before the relay 310 of the ASD 100 is closed, the ASD 100 may test the flat wire 105 for miswire or faults. The ASD 100 may first test the first segment of flat wire 105 that runs between the source module 110 and the destination module 120 of the first destination device 117a. If a miswire or fault is detected, then the ASD 100 may maintain the relay 310 in its open position and prevent electrification of the flat wire 105. If no miswire or fault is detected in the first segment of the flat wire 105, then the ASD 100 may test the combined first segment of the flat wire 105 and the second segment of the flat wire 105 that connects the first destination device 117a and the second destination device 117b. If a miswire or fault is detected, then the ASD 100 may prevent electrification of the flat wire 105 or it may transmit a signal to the relay of the first destination device 117a instructing the relay to remain open. The first segment of the flat wire 105 may then be electrified permitting a load connected to the first destination device 117a to receive power; however, none of the destination devices 117b-n connected down the line from the first destination device 117a will receive power. Accordingly, a miswire or fault in the flat wire 105 may be isolated by the ASD 100, and any destination devices 117a-n connected to the ASD 100 prior to the flat wire segment containing the miswire or fault are identified and may be permitted to receive power. The other flat wire segments may be prevented from receiving power. As another example, if the ASD 100 detects a miswire or fault in flat wire 105 while the flat wire 105 is electrified, the ASD 100 may open its relay 310 and de-energize the flat wire 105. Then, the ASD 100 may use the method described in the example above to isolate the segment of the flat wire 105 in which the miswire or fault occurs, and the ASD 100 may allow electrification of the flat wire 105 up until the segment of the flat wire 105 at which the miswire or fault occurs. As another example, in order to avoid timing delays associated with incremental testing, an entire length of flat wire 105 (or more than a single flat wire segment) may be tested prior to electrifying the flat wire 105. In order to accomplish this, the relays in each of the destination devices 117a-n may be closed and a test signal may be communicated through the flat wire 105 by the ASD 100. If a miswire or fault is detected in the flat wire 105, then the incremental method described above may be utilized to isolate the miswire or fault.

Alternatively, if each destination device 117a-n includes a DWI component 340, then each destination device 117a-n may test the next downstream segment of flat wire 105 before that segment of flat wire 105 is electrified. The tests performed by the DWI component 340 of each destination device 117a-n may also be used to isolate a miswire or fault in the flat wire 105 and prevent the miswired or faulty segment of flat wire 105 and any downstream flat wire segments from receiving electrical power. As an example, the ASD 100 may first test the first segment of flat wire 105 that runs between the source module 110 and the destination module 120 of the first destination device 117*a*. If a miswire or fault is detected, then the ASD 100 may maintain the relay 310 in its open position and prevent electrification of the flat wire 105. If no miswire or fault is detected in the first segment of the flat wire 105, then the ASD 100 may allow the first segment of the flat wire 105 to be electrified. Then, the DWI component 340 of the first destination device 117*a* may test the second segment of the flat wire 105 that connects the first destination device 117*a* and the second destination device 117*b*. If a miswire or fault is detected, then the first destination device 117*a* may prevent electrification of the second segment of the flat wire 105 by opening the relay of the first destination device 117*a*. If, however, no miswire or fault is detected in the second segment of the flat wire 105, then the first destination device 117*a* may allow the second segment of the flat wire 105 to be electrified. The destination devices 117*b-n* downstream from the first destination device 117*a* may contain the same functionality as the first destination device 117*a*. Accordingly, a miswire or fault in the flat wire 105 may be isolated by the ASD 100 and any destination devices 117*a-n* connected to the ASD 100 prior to the miswired or faulty segment of flat wire 105 are identified and may be permitted to receive power. The other flat wire segments are prevented from receiving power. As another example, if the ASD 100 detects a miswire or fault in flat wire 105 while the flat wire 105 is electrified, the ASD 100 may open its relay 310 and de-energize the flat wire 105. Then, the ASD 100 and the destination devices 117*a-n* may use the method described in the example above to isolate the segment of the flat wire 105 in which the miswire or fault occurs, and the ASD 100 and the destination devices 117*a-n* may allow electrification of the flat wire 105 up until the segment of the flat wire 105 at which the miswire or fault occurs.

Additionally, if multiple segments of flat wire 105 are used to connect each destination device 117*a-n*, the ASD 100 may cause a switch in each destination device 117*a-n* to be toggled in order to route a signal transmitted over the flat wire 105 through a secondary flat wire segment rather than a primary flat wire segment, as described above with reference to FIG. 17. Using the previous example prior to the electrification of the flat wire 105, if a miswire or fault existed in a segment of flat wire 105 that connected the first destination device 117*a* and the second destination device 117*b*, then the ASD 100 may cause a switch in the first destination device 117*a* to be toggled in order to switch the segment of flat wire that connects the first destination device 117*a* and the second destination device 117*b* to a secondary segment of flat wire 1805 rather than a primary segment of flat wire 105. At this point, the ASD 100 and/or the destination devices 117*a-n* may resume testing of the flat wire 105 by testing the secondary segment of flat wire 105 that connects the first destination device 117*a* and the second destination device 117*b*.

Figure 20:
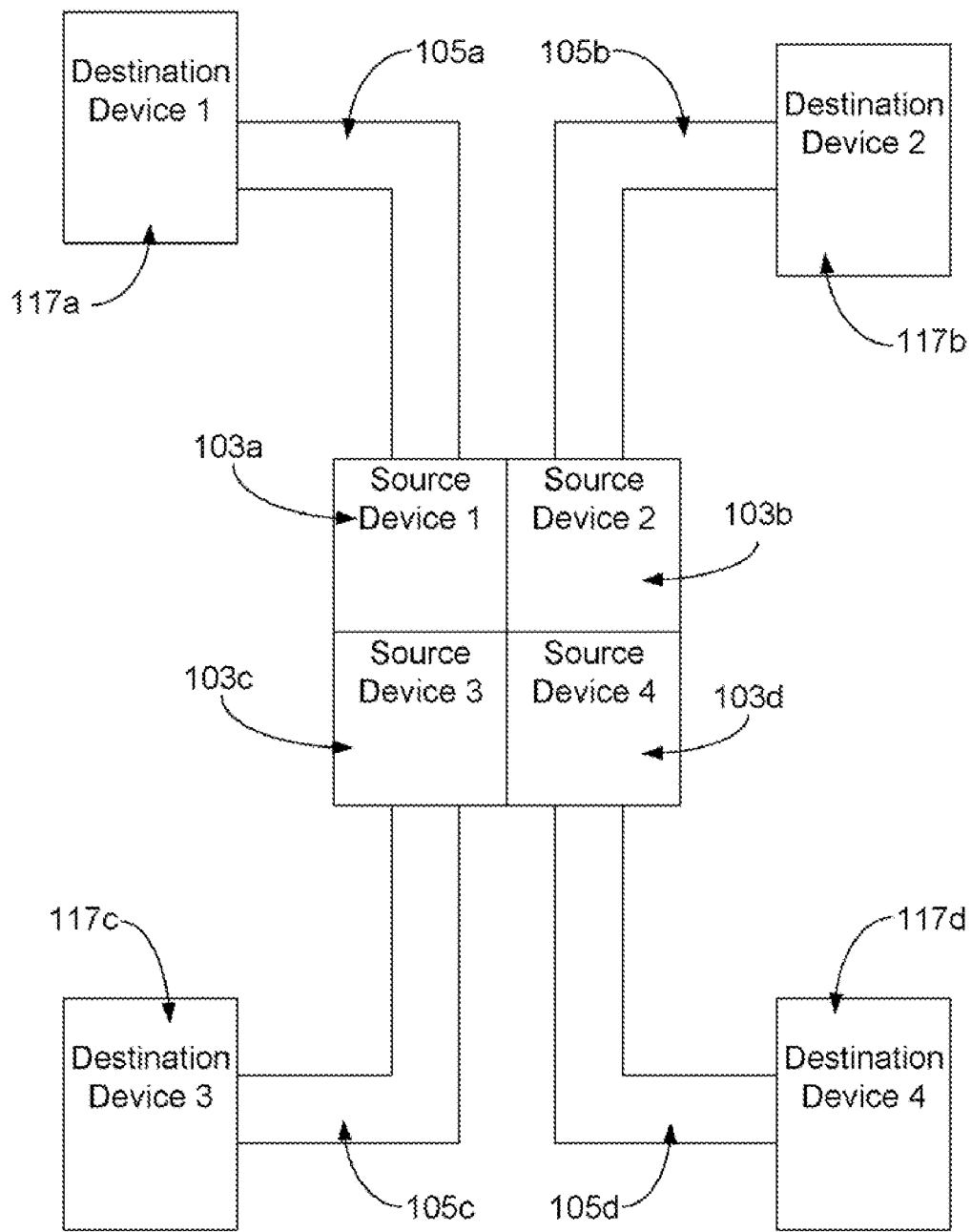
FIG. 20 is a schematic diagram of a system in which multiple source devices form a central device that monitors multiple flat wires in a room, according to an illustrative embodiment of an aspect of the invention.

FIG. 20 is a schematic diagram of a system in which multiple source devices 103*a-d* form a central device that monitors multiple flat wires 105*a-d* in a room, according to an illustrative embodiment of the invention. Each source device 103 may contain an ASD 100. As shown in FIG. 19, more than one source device 103*a-d* may be assembled into a single device that is capable of monitoring multiple branches of flat wire 105*a-d* extending from the combined device. Accordingly, the combined device may form a central device that is capable of controlling multiple flat wire branches 105*a-d*. Each of the flat wire branches 105*a-d* may be terminated at a destination device 117*a-d*. For example, the combined source device 103*a-d* may be placed in, on, or near one wall of a room and separate flat wire branches 105*a-d* may extend from the combined source device to each wall of the room. The individual ASD's within the combined source device may then monitor one or more of the flat wire branches 105*a-d* extending from the combined device. Although the central device of FIG. 19 is depicted as a combination of source devices 103*a-d*, it will be appreciated that a single device may be utilized in accordance with embodiments of the invention to monitor multiple flat wire branches 105*a-d*.

Figure 21:
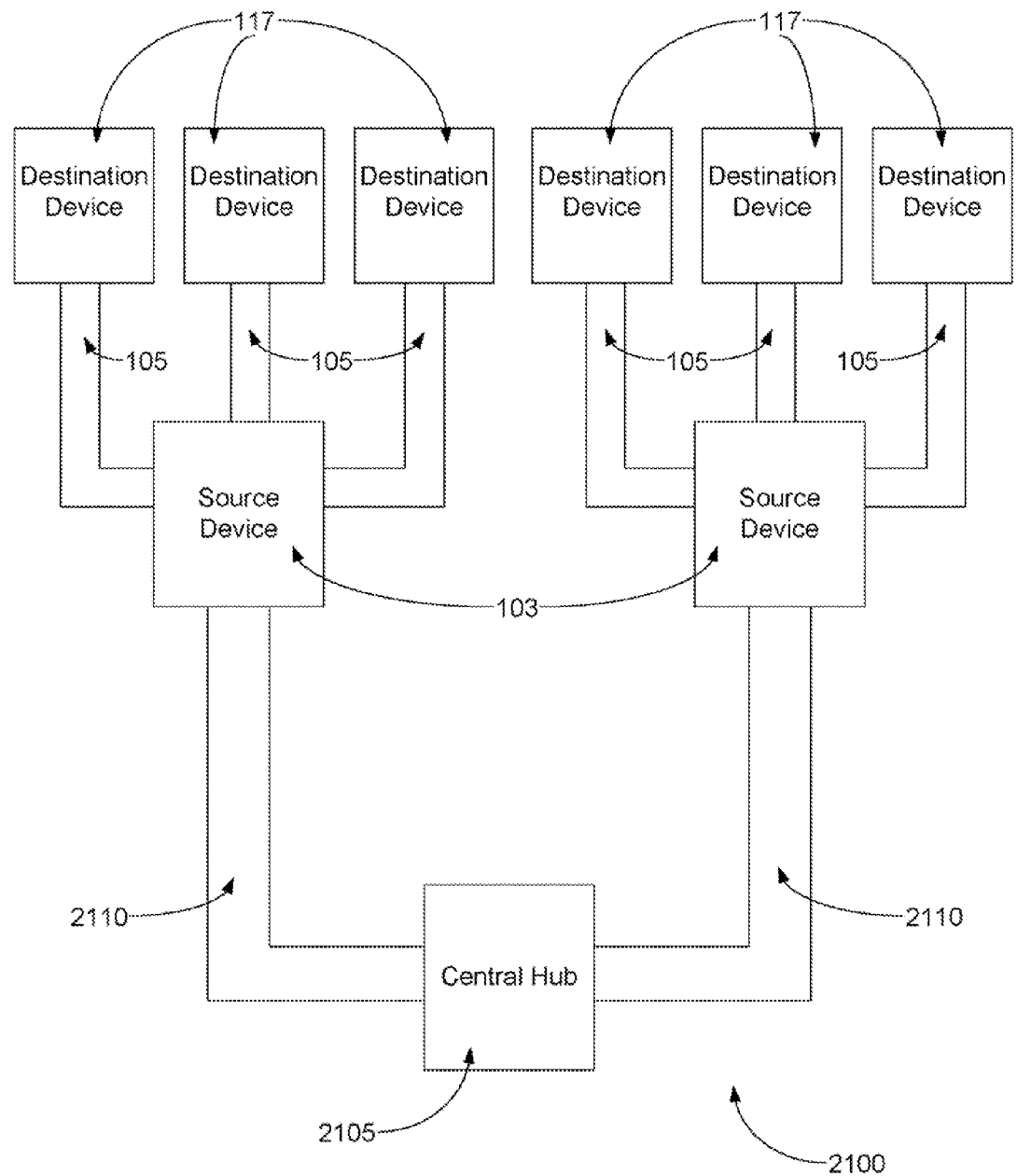
FIG. 21 is a schematic diagram of a network of source devices monitored by a central hub, according to an illustrative embodiment of one aspect of the invention.

FIG. 21 is a schematic diagram of flat wire network 2100 that includes a network of source devices 103 monitored by a central hub 2105, according to an illustrative embodiment of the invention. Each of the source devices 103 may include one or more ASD's 100 capable of monitoring flat wire branches 105 connected to the source devices 103. A network may be established in which one or more electrical wires 2110, which may be conventional wire and/or flat wires 105, are connected between the central hub 2105, which may be associated with a common circuit breaker box, to each room in a building. Each of these electrical wires 2110 may be connected to a source device 103 in a separate room. Accordingly, each source device 103 may be used as a power center that services an entire room. This method of wiring may be, for example, an inexpensive way to rewire a home where in-wall renovation is not practical, such as in some older homes. Once an electrical wire has been extended from the central hub 2105 to a room, the flat wire 105 becomes an economical and feasible way to distribute power to each of the room's walls or to the room's ceiling or floor. The source devices 103 may act as a power center that services each room by providing a gateway between the electrical wire 2110 and the flat wire 105 branch circuits within the room. Each of the flat wire 105 branch circuits may be connected to one or more destination devices 117, as previously described. It will also be understood that each of the source devices 103 shown in FIG. 21 may contain a single ASD 100 capable of monitoring one or more flat wire 105 branch circuits or, alternatively, each of the source devices 117 may contain more than one ASD 100 for monitoring flat wire 105 branch circuits, as described with reference to FIG. 20 above.

Within a room, each source device 103 may service any of the walls, ceiling, and floor with a flat wire 105 branch circuit. Each source device 103 may individually control the flat wire 105 branch circuits to which it is connected. Additionally, each source device 103 may communicate with branch circuit destination devices 117 over the flat wire 105 in order to monitor circuit safety and electrification status. As previously discussed, the destination devices 117 may include a relay, detection circuitry, and/or a control unit that is in communication with the source device 117 monitoring the flat wire branch circuit 105 to which the destination device 117 is connected. Accordingly, any segment of the flat wire network may be isolated and shut off if a flaw is detected in that segment. Additionally, each source device 117 may be surface mounted on a wall or mounted inside a wall within the room, or situated nearby.

Each source device 103 also may communicate with a central hub 2105. The central hub is preferably located near the circuit breaker box or at least in the building. It also is possible, however, for the central hub 2105 to be situated remotely to the building. The central hub 2105 may collect data from each of the source devices 103 and provide safety and electrification status for all of the branch circuits 105 in the building. The central hub 2105 may also be surface mounted or mounted inside a wall.

If a flat wire 105 miswire or fault is detected on any given branch circuit, then either the central hub 2105 or the source device 103 controlling that branch circuit, or both, may render that branch circuit unusable and isolate it from the other branches. Alternatively a downstream destination device 117 connected to a source device 103 may render the miswired or faulty branch circuit unusable and isolate it from the other branches. In other words, that branch circuit may not be permitted to be electrified. In this manner, a miswired or faulty branch circuit may be rendered unusable while at least a portion of the other branch circuits are not affected. Therefore, a penetration of a flat wire 105 or a miswire of the conductors of a flat wire 105 may only result in power loss in one branch of the flat wire network.

According to another aspect of the invention, the flat wire 105 may be used to communicate signals. These signals may be communicated between any device in a flat wire network or flat wire branch circuit over the flat wire 105. For example, with reference to FIG. 20, a signal may be communicated between the ASD 100 in the source device 103 and any of the destination devices 117a-n over the flat wire 105. Similarly, with reference to FIG. 21, a signal may be transmitted over the flat wire 105 from one source device 103 to another source device 103 or between the central hub 2105 and one of the source devices 103. It will be understood, however, that devices in a flat wire network or flat wire branch circuit may be in communication with one another through wires, conductors, or optical fiber external to the flat wire 105 or, alternatively, through wireless communication means, for example, via a wireless local area network.

A communications signal may be transmitted over any of the conductors of the flat wire 105. A separate communications signal may be transmitted over each of the individual conductors of the flat wire 105. A signal may be communicated onto one or more of the conductors of the flat wire 105 by an excitation circuit, for example, the excitation circuit described above with reference to FIG. 9B. The signal may then be identified and read from the one or more conductors of the flat wire 105 by a sense circuit, for example, the sense circuit described above with reference to FIG. 9B. As an example, the grounding conductors 220, 225 of the flat wire 105 may be used for communicating signals. The signal communicated across the grounding conductors 220, 225 may be a low voltage signal in the range of approximately 0.1 and 5.0 volts. Additionally, the frequency of a signal communicated across the grounding conductors 220, 225 may be a frequency at or above approximately 1000 Hz. There is normally no voltage or current present on the grounding conductors 220, 225; therefore, the grounding conductors 220, 225 may beneficially be used to transmit communications signals even when the flat wire 105 has been fully electrified. Similar to the grounding conductors 220, 225, a communications signal may be transmitted over the return conductors 210, 215 of a flat wire 105. The signal communicated across the return conductors 210, 215 may be a low voltage signal in a range of approximately 0.1 to 5.0 volts. Additionally, the frequency of a signal communicated across the return conductors 210, 215 may be a frequency at or above approximately 1000 Hz. A signal may be communicated across the conductors of the flat wire 105 while the flat wire 105 is electrified. It will be appreciated that a signal may include an appropriate identifier, such as a signal header that may be utilized to identify the signal and, therefore, prevent false trips by one or more of the safety components of an ASD 100.

A communications signal may also be transmitted over the electrifiable conductor 205 of the flat wire 105. The signal communicated across the electrifiable conductor 205 may be a low voltage signal at a voltage of approximately 0.1 to 5.0 volts. Additionally, the frequency of a signal communicated across the electrifiable conductor 205 may be at a frequency at or above approximately 1000 Hz. A signal may be transmitted over the electrifiable conductor 205 both when the flat wire 105 is electrified and when the flat wire 105 is not electrified. In accordance with the flat wire 105 used in conjunction with the present disclosure, an electrified flat wire 105 may carry a voltage signal of approximately 110-130 volts (for North America applications) or approximately 230-250 volts (for European applications) at a frequency of approximately 50-60 Hertz. A communications signal, however, may still be transmitted over the electrifiable conductor 205 using power line carrier (PLC) or broadband over power line (BPL) technology, as will be understood by those of ordinary skill in the art. A PLC or BPL signal transmitted over the electrifiable conductor 205 may be at a voltage of approximately 0.1 to 20 volts. In an example embodiment, the voltage of the signal transmitted over the electrifiable conductor 205 may be at a voltage of approximately 0.1 to 5 volts. Additionally, a PLC or BPL signal transmitted over the electrifiable conductor 205 may be at a frequency that is greater than approximately one megahertz (MHz). For example, the frequency may be in a range of approximately 2 to 20 MHz, although it will be understood that frequencies up to and greater than approximately 40 MHz may be used in conjunction with various embodiments of the invention. Additionally, as discussed above, a signal may include an appropriate identifier.

According to another aspect of the invention, communications signals transmitted over one or more of the conductors of a flat wire 105 may be used to establish communication between devices that are connected by a flat wire 105. For example, the communications signals may be used to establish communication between two ASD's 100, between an ASD 100 and a destination device 117, or between an ASD 100 and a central hub 2105. Additionally, communication signals may be transmitted over the flat wire 105 by devices that are connected by the flat wire 105 according to a communications protocol. For example, the communications signals may be transmitted via a user datagram protocol (UDP), via a transmission control protocol (TCP), or via another protocol as will be understood by those of ordinary skill in the art. Additionally, a communications signal may be used to establish a connection between two devices connected by flat wire 105. The connection established may be point-to-point connection or it may be some other type of connection, such as a peer-to-peer or local area network connection.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A source device for use with electrical wire, the source device comprising:
   a line side input configured to connect to a line side power source and receive an electrical power signal from the line side power source;
   a flat wire connection configured to connect to an electrical flat wire, the electrical flat wire comprising a plurality of conductors arranged in a stacked configuration;

at least one relay configured to control the communication of the electrical power signal onto the electrical flat wire; and a control unit configured to (i) direct the communication of at least one test signal onto at least one conductor of the electrical flat wire, (ii) monitor one or more of the other conductors of the electrical flat wire for one or more return signals, (iii) determine, based at least in part on the monitoring, whether a short exists between adjacent conductors of the electrical flat wire, and (iv) control, based at least in part on the determination, the actuation of the at least one relay.

2. The source device of claim 1, wherein the electrical flat wire comprises at least one electrifiable conductor, at least one return conductor, and at least one grounding conductor.

3. The source device of claim 1, wherein the electrical flat wire comprises an electrifiable conductor and two return conductors formed on opposite sides of the electrifiable conductor, and further comprising:
  at least one excitation component configured to communicate the at least one test signal; and
  at least one sensing component configured to receive the one or more return signals.

4. The source device of claim 3, wherein the at least one excitation component and the at least one sensing component comprise a single component.

5. The source device of claim 3, wherein the at least one excitation component comprises at least one relay that controls the provision of a current limited signal as the at least one test signal.

6. The source device of claim 3, wherein:
  a destination device is situated at a distal end of the electrical flat wire, the destination device configured to form an electrical connection between the two return conductors for purposes of testing the electrical flat wire;
  the at least one excitation component is configured to communicate the at least one test signal onto a first return conductor;
  the at least one sensing component is configured to monitor the electrifiable conductor for a return signal; and
  the control unit is configured to identify a short based at least in part upon the detection of a return signal on the electrifiable conductor.

7. The source device of claim 1, wherein a destination device is situated at a distal end of the electrical flat wire, the destination device configured to form an electrical connection between two of the plurality of conductors, and
  wherein the destination device comprises a time delay relay that isolates an electrical load from the electrical flat wire for a period of time suitable for testing the electrical flat wire.

8. The source device of claim 1, wherein the at least one test signal is communicated onto the at least one conductor prior to an electrification of the electrical flat wire.

9. The source device of claim 1, wherein the control unit is further configured to (i) actuate the at least one relay to facilitate the communication of the electrical power signal onto the electrical flat wire, (ii) monitor, subsequent to the actuation of the at least one relay, one or more conductors of the electrified electrical flat wire, (iii) identify, based at least in part on the monitoring of the electrified electrical flat wire, a wire fault or abnormal condition, and (iv) open the at least one relay based at least in part upon the identification.

10. The source device of claim 9, wherein the identified wire fault or abnormal condition comprises at least one of (i) an identified current signal on at least one grounding conductor of the electrical flat wire, (ii) an identified current signal on an electrifiable conductor of the electrical flat wire that exceeds a predetermined threshold value, (iii) an identified current differential between an electrifiable conductor of the electrical flat wire and at least one return conductor of the electrical flat wire that exceed a predetermined threshold value, or (iv) an identified arcing event.

11. An electrical flat wire system comprising:
  a source device configured to be coupled to a line side power source, the source device comprising an active safety device and a first flat wire termination;
  a destination device comprising a second flat wire termination; and
  an electrical flat wire having a first end coupled to the first flat wire termination and a second end coupled to the second flat wire termination, the electrical flat wire comprising a plurality of conductors arranged in a stacked configuration,
  wherein the active safety device is configured to (i) communicate at least one test signal onto at least one conductor of the electrical flat wire, (ii) monitor one or more of the other conductors of the electrical flat wire for one or more return signals, (iii) determine, based at least in part on the monitoring, whether a short exists between adjacent conductors of the electrical flat wire, and (iv) control, based at least in part on the determination, the communication of an electrical power signal from the line side power source to the electrical flat wire.

12. The electrical flat wire system of claim 11, wherein the electrical flat wire comprises at least one electrifiable conductor, at least one return conductor, and at least one grounding conductor.

13. The electrical flat wire system of claim 11, wherein:
  the electrical flat wire comprises an electrifiable conductor and two return conductors formed on opposite sides of the electrifiable conductor, and
  the active safety device comprises (i) at least one excitation component configured to communicate the at least one test signal and (ii) at least one sensing component configured to receive the one or more return signals.

14. The electrical flat wire system of claim 13, wherein:
  the destination device is configured to form an electrical connection between the two return conductors for purposes of testing the electrical flat wire,
  the at least one excitation component is configured to communicate the at least one test signal onto a first return conductor,
  the at least one sensing component is configured to monitor the electrifiable conductor for a return signal, and
  the active safety is configured to identify a short based at least in part upon the detection of a return signal on the electrifiable conductor.

15. The electrical flat wire system of claim 11, wherein the at least one test signal is communicated onto the at least one conductor prior to the communication of the electrical power signal from the line side power source to the electrical flat wire.

16. The electrical flat wire system of claim 11, wherein the active safety device is further configured to (i) direct the communication of the electrical power signal onto the electrical flat wire, (ii) monitor, subsequent to the communication of the electrical power signal, one or more conductors of the electrical flat wire, (iii) identify, based at least in part on the monitoring, a wire fault or abnormal condition, and (iv) de-energize, based at least in part upon the identification, the electrical flat wire by ceasing the communication of the electrical power signal onto the electrical flat wire.

17. The electrical flat wire system of claim 16, wherein the identified wire fault or abnormal condition comprises at least one of (i) an identified current signal on at least one grounding conductor of the electrical flat wire, (ii) an identified current signal on an electrifiable conductor of the electrical flat wire that exceeds a predetermined threshold value, (iii) an identified current differential between an electrifiable conductor of the electrical flat wire and at least one return conductor of the electrical flat wire that exceed a predetermined threshold value, or (iv) an identified arcing event.

18. A method for monitoring an electrical flat wire, the method comprising:
connecting, to a source device, an electrical flat wire comprising a plurality of conductors arranged in a stacked configuration, wherein the source device is configured to control the provision of an electrical power signal onto the electrical flat wire;
communicating, by the source device, a test signal onto a first conductor of the electrical flat wire;
monitoring, by the source device, one or more other conductors of the electrical flat wire for at least one return signal;
determining, by the source device based at least in part on the monitoring, whether a short exists between adjacent conductors of the electrical flat wire; and
controlling, by the source device based at least in part on the determination, the provision of the electrical power signal onto the electrical flat wire.

19. The method of claim 18, wherein connecting an electrical flat wire comprises connecting an electrical flat wire comprising at least one electrifiable conductor, at least one return conductor, and at least one grounding conductor.

20. The method of claim 18, wherein:
connecting an electrical flat wire comprises connecting an electrical flat wire comprising an electrifiable conductor and two return conductors formed on opposite sides of the electrifiable conductor,
communicating a test signal comprises communicating a test signal utilizing at least one excitation component, and
monitoring one or more other conductors comprises monitoring utilizing at least one sensing component.

21. The method of claim 20, further comprising:
providing a destination device configured to form an electrical connection between the two return conductors for purposes of testing the electrical flat wire,
wherein communicating a test signal onto a first conductor comprises communicating a test signal onto a first return conductor,
wherein monitoring one or more other conductors for at least one return signal comprises monitoring the electrifiable conductor for a return signal, and
wherein determining whether a short is associated with the electrical flat wire comprises identifying a short based at least in part upon the detection of a return signal on the electrifiable conductor.

22. The method of claim 18, wherein communicating a test signal comprises communicating a test signal prior to the provision of the electrical power signal onto the electrical flat wire.

23. The method of claim 18, further comprising:
directing, by the source device, communication of the electrical power signal onto the electrical flat wire;
monitor, by the source device subsequent to the communication of the electrical power signal onto the electrical flat wire, one or more conductors of the electrical flat wire;
identifying, by the source device based at least in part on the monitoring, a wire fault or abnormal condition associated with the electrical flat wire; and
de-energizing, by the source device based at least in part upon the identification, the electrical flat wire by ceasing the communication of the electrical power signal onto the electrical flat wire.

24. The method of claim 18, wherein identifying a wire fault or abnormal condition comprises identifying at least one of (i) an identified current signal on at least one grounding conductor of the electrical flat wire, (ii) an identified current signal on an electrifiable conductor of the electrical flat wire that exceeds a predetermined threshold value, (iii) an identified current differential between an electrifiable conductor of the electrical flat wire and at least one return conductor of the electrical flat wire that exceed a predetermined threshold value, or (iv) an identified arcing event.

* * * * *